United States Patent
Zhao et al.

(10) Patent No.: US 12,254,559 B2
(45) Date of Patent: Mar. 18, 2025

(54) VOXEL-BASED APPROACH FOR DESIGN MODELS

(71) Applicant: AUTODESK, INC., San Francisco, CA (US)

(72) Inventors: Dale Zhao, New York City, NY (US); David Benjamin, Brooklyn, NY (US); Rui Wang, New York City, NY (US)

(73) Assignee: AUTODESK, INC., San Francisco, CA (US)

( * ) Notice: Subject to any disclaimer, the term of this patent is extended or adjusted under 35 U.S.C. 154(b) by 0 days.

(21) Appl. No.: 17/832,127

(22) Filed: Jun. 3, 2022

(65) Prior Publication Data
US 2023/0298259 A1    Sep. 21, 2023

Related U.S. Application Data

(63) Continuation-in-part of application No. 17/696,340, filed on Mar. 16, 2022.

(51) Int. Cl.
| | |
|---|---|
| *G06F 30/10* | (2020.01) |
| *G06T 15/08* | (2011.01) |
| *G06T 19/20* | (2011.01) |

(52) U.S. Cl.
CPC .............. *G06T 15/08* (2013.01); *G06F 30/10* (2020.01); *G06T 19/20* (2013.01);
(Continued)

(58) Field of Classification Search
CPC .. G06T 15/08; G06T 19/20; G06T 2219/2012
See application file for complete search history.

(56) References Cited

U.S. PATENT DOCUMENTS

| | | | |
|---|---|---|---|
| 7,958,466 B1 * | 6/2011 | Fung | G06F 30/30 |
| | | | 716/108 |
| 9,454,623 B1 | 9/2016 | Kaptsan | |
| | | (Continued) | |

OTHER PUBLICATIONS

Non Final Office Action received for U.S. Appl. No. 17/696,340 dated Dec. 20, 2024, 52 pages.
(Continued)

*Primary Examiner* — Samantha (Yuehan) Wang
(74) *Attorney, Agent, or Firm* — Artegis Law Group, LLP

(57) ABSTRACT

A voxel-based design approach enables the creating and modifying of a design model comprising a 3D grid of discrete voxels that is represented by a voxel data structure. The voxel data structure comprises voxel-level entries, each entry corresponding to a voxel based on the 3D location within the 3D grid. The voxel data structure includes a design-level entry for storing design-level performance metrics. The system updates the voxel data structure to reflect user modifications to the design model and renders a visualization of the updated design model. The system displays a per-voxel heat map for the design model for a selected performance metric based on the voxel data structure. The design system displays multiple optimized design solutions based on corresponding optimized voxel data structures. The system generates the multiple optimized design solutions based on a voxel-based optimization technique. The system also performs a voxel-based recommendation visualization technique.

20 Claims, 40 Drawing Sheets

(52) U.S. Cl.
CPC .................. *G06T 2219/024* (2013.01); *G06T 2219/2012* (2013.01); *G06T 2219/2021* (2013.01)

(56) References Cited

U.S. PATENT DOCUMENTS

| | | |
|---|---|---|
| 2006/0265496 A1 | 11/2006 | Freitag |
| 2012/0233555 A1 | 9/2012 | Psistakis et al. |
| 2013/0144566 A1 | 6/2013 | De Biswas |
| 2014/0229865 A1 | 8/2014 | Da Costa et al. |
| 2015/0032504 A1 | 1/2015 | Elango et al. |
| 2015/0120252 A1 | 4/2015 | Hepworth et al. |
| 2017/0102833 A1 | 4/2017 | Kodali et al. |
| 2019/0258225 A1* | 8/2019 | Link .................. G05B 19/4097 |
| 2019/0347382 A1 | 11/2019 | Stoddart et al. |
| 2020/0364310 A1 | 11/2020 | Reddy et al. |
| 2021/0004748 A1 | 1/2021 | Ravi et al. |
| 2021/0056752 A1* | 2/2021 | Kim .................. G06T 17/005 |
| 2021/0185276 A1 | 6/2021 | Peters et al. |
| 2021/0225000 A1* | 7/2021 | Guo .................. G06T 7/11 |
| 2021/0327138 A1* | 10/2021 | Perry .................. G06T 17/20 |
| 2021/0343089 A1* | 11/2021 | Halén .................. G06T 17/10 |
| 2021/0383261 A1 | 12/2021 | Hanna et al. |

OTHER PUBLICATIONS

Non Final Office Action received for U.S. Appl. No. 17/718,181 dated Jan. 30, 2025, 54 pages.

* cited by examiner

| 3D Coordinates | Performance Properties | Performance Metrics | Visual Properties | Size | Voxel Type |
|---|---|---|---|---|---|
| (x1, y1, z1) | PP1_a, PP2_b PP3_c... | PM1_a, PM2_b, PM3_c... | VP1_a, VP2_b, VP3_c... | Sz | T1 |
| (x2, y1, z1) | PP1_d, PP2_e PP3_f... | PM1_d, PM2_e, PM3_f... | VP1_d, VP2_e, VP3_f... | Sz | T2 |
| (x3, y1, z1) | PP1_g, PP2_h PP3_i... | PM1_g, PM2_h, PM3_i... | VP1_g, VP2_h, VP3_i... | Sz | T3 |
| (x1, y2, z1) | PP1_j, PP2_k PP3_l... | PM1_j, PM2_k, PM3_l... | VP1_j, VP2_k, VP3_l... | Sz | T1 |
| ... | | | | | |
| DPM1_x, DPM2_y, DPM3_z... | | | | | |

Figure 15

| | |
|---|---|
| Persona | 2620 |
| Max Number of Commands | 2630 |
| Max Number of Solutions | 2640 |
| Crossover Probability | 2650 |
| Mutation Probability | 2660 |
| Performance Metrics | 2670 |
| Start | 2690 |
| 407 | |

Figure 26

VOXEL-BASED APPROACH FOR DESIGN MODELS

CROSS-REFERENCE TO RELATED APPLICATIONS

This application is a continuation-in-part of the co-pending U.S. patent application titled, "MULTI-USER COLLABORATION SYSTEM FOR GENERATIVE DESIGNS," filed on Mar. 16, 2022 and having Ser. No. 17/696,340. The subject matter of this related application is hereby incorporated herein by reference.

BACKGROUND

Field of the Various Embodiments

The various embodiments relate generally to computer science and computer-aided design software and, more specifically, to a voxel-based approach for design models.

Description of the Related Art

When creating design models for regional planning, such as an urban block or university campus, a designer uses specialized design software for architecture, engineering, and construction (AEC) to design structures that meet the goals and constraints of the given project. The specialized design software typically generates and operates on geometry-based design models that include complex continuous geometries for defining the various structures of the design models. The geometries typically are specified via parameters that are increased or decreased in a continuous space. Accordingly, significant amounts of data usually are required for specifying each of the different structures included in a geometry-based design model.

The specialized design software also can compute and illustrate various performance metrics associated with a given geometry-based design model using heat maps to simulate and show changes in the performance metrics in different areas of the design model. A designer can then use the heat maps to evaluate the performance metrics of the given design model. The specialized design software can further generate optimized design solutions that improve the performance metrics of the given design model. Because current design models constitute continuous geometry-based design models, as noted above, conventional optimization techniques typically constitute continuous geometry-based optimization techniques that generate continuous geometry-based optimized design solutions.

One drawback of conventional specialized design software is that expertise is required to modify the continuous geometries of the various structures within a given design model. Accordingly, novice users either cannot modify a geometry-based design models or can have substantial difficulty when trying to modify geometry-based design models. Another drawback of conventional specialized design software is that rendering a design model after each modification of the design model is typically a slow process and requires significant processing time and computational resources due to the continuous geometries included in current design models. Consequently, conventional specialized design software is not capable of rendering modifications of a design model in real-time. An additional drawback of current design software is that the processor-intensive simulation techniques required for geometry-based design models normally cause significant latencies when computing and rendering heat maps illustrating the performance metrics of a given design model. Consequently, conventional specialized design software is not capable of computing and rendering heat maps in real-time either.

Another drawback of current design software is that conventional optimization techniques operate on a continuous geometry-based design model. As such, conventional optimization techniques are based on continuous geometry-based parametric models comprising a large number of different input parameters that require highly complex computations for generating optimized design solutions. Therefore, conventional optimization techniques require significant processing time and resources and are not capable of generating optimized design solutions in real-time. In addition, rendering multiple optimized design solutions is typically slow and requires significant processing time and resources due to the continuous geometries contained in the optimized design solutions. Consequently, current design software is not capable of generating and rendering multiple optimized design solutions in real-time.

An additional drawback of current design software is that conventional optimization techniques generate optimized design solutions that represent only completed design solutions for current design models. For example, a conventional optimized design solution could represent a completed design solution that is achieved by executing twenty-thirty steps/commands on a current design model. Notably, though, conventional optimization techniques are incapable of generating optimized design solutions that represent only partially-completed design solutions. In particular, conventional optimization techniques are incapable of generating optimized design solutions that are incremental optimizations of a current design model, such as an incremental optimized design solution achieved by executing only three-four steps/commands on a current design model. Thus, conventional optimization techniques implement "all or nothing" optimizations of design models, which significantly limits user control and user involvement in the overall design optimization process.

As the foregoing illustrates, what is needed in the art are more effective techniques for generating design models.

SUMMARY

One embodiment of the present disclosure sets forth a computer-implemented method comprising storing a voxel data structure representing a design model, wherein the design model comprises a three-dimensional (3D) grid of voxels, and the voxel data structure stores a location within the 3D grid and a set of visual properties for one or more of the voxels included in the 3D grid, and generating a visualization of the design model based on the voxel data structure.

At least one technical advantage of the disclosed techniques relative to the prior art is that, with the disclosed techniques, a design model can be generated and modified using a three-dimensional (3D) grid of discrete voxels. With the grid of discrete voxels, modifications to the design model can be made by simply adding, removing, and enhancing discrete voxels that are included in the design model. Further, these operations do not require any specific expertise, unlike what is required to modify continuous geometries using conventional specialized design systems. Another advantage of the disclosed techniques relative to the prior art is that, with the disclosed techniques, a design model and/or an optimized design solution can be rendered in real-time based on mappings between visual properties and corresponding graphic elements for each voxel included in the design model and/or voxel-based optimized design solution. Further, rendering design models and optimized design solutions generated using the disclosed techniques does not involve the processor-intensive rendering operations associated with the continuous geometries in conventional design approaches. Accordingly, rendering operations using the disclosed techniques do not experience the high latencies typically seen with prior art techniques. An additional advantage of the disclosed techniques relative to the prior art is that, with the disclosed techniques, heat maps illustrating performance metrics for design models can be easily computed and rendered in real-time based on mappings between the performance metrics and corresponding visual appearances of each voxel in the design models. In this regard, computing and rendering heat maps using the disclosed techniques does not involve then processor-intensive computing and rendering operations associated with prior art simulation techniques and, therefore, do not experience the high latencies typically encountered with prior art techniques. These technical advantages provide one or more technological advancements over prior art approaches.

One embodiment of the present disclosure sets forth a computer-implemented method comprising computing a set of design-level metrics for a design model that comprises a first three-dimensional (3D) grid of voxels, generating a first recommendation that specifies a first set of commands (first sequence of commands), wherein each command included in the first set of commands specifies a type of action to be performed at a location within the first 3D grid of voxels, and executing the first recommendation on the design model to generate a first optimized design solution that increases performance of at least one design-level metric included in the set of design-level metrics.

At least one technical advantage of the disclosed techniques relative to the prior art is that, with the disclosed techniques, optimization operations are performed on a voxel-based design model, instead of more complex geometry-based parametric model, which reduces the number and complexity of input parameters processed relative to conventional optimization techniques. For example, the input parameters used for the disclosed optimization techniques can include, without limitation, an action type, voxel location, or a voxel type. Consequently, the processing time and resources required to generate a set of optimized design solutions for a given design model using the disclosed techniques can be substantially reduced relative to conventional approaches, which enables the disclosed optimization techniques to be performed in real-time. These technical advantages provide one or more technological advancements over prior art approaches.

One embodiment of the present disclosure sets forth a computer-implemented method comprising rendering a design model for display; generating a first recommendation for optimizing the design model, wherein the first recommendation specifies a sequence of commands to be executed on the design model; and rendering a first visualization for the first recommendation, wherein the first visualization includes a set of markers that are integrated within the design model and visually illustrate the sequence of commands specified in the first recommendation.

At least one technical advantage of the disclosed techniques relative to the prior art is that, with the disclosed techniques, an optimized design solution for a current design model can be an incremental optimization of the current design model that represents a partially-completed design solution, as opposed to a completed optimization of the current design model that represents a completed design solution. With the disclosed techniques, an incremental optimized design solution is generated by applying a recommendation that specifies a sequence of steps/commands for modifying a current design model. The user is able to specify the maximum number of steps/commands in each recommendation, which controls the level of incremental optimization applied to the current design model. In addition, with the disclosed techniques, a recommendation visualization is generated for each recommendation that graphically illustrates each command in the recommendation and also provides detailed information about each such command. The recommendation visualization also can be configured to be user-interactive, which allows a user to either execute or ignore each command in the recommendation. With these features, the disclosed techniques provide greater user control and user involvement in the overall optimization process relative to conventional optimization techniques that implement an "all or nothing" approach to optimizing design models. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

FIG. 15 is a conceptual illustration of a voxel data structure included in the distributed computing system of FIG. 1, according to various embodiments.

FIG. 26 illustrates an exemplar user screen of the optimizer UI of FIG. 25, according to various embodiments.

DETAILED DESCRIPTION

Figure 1:
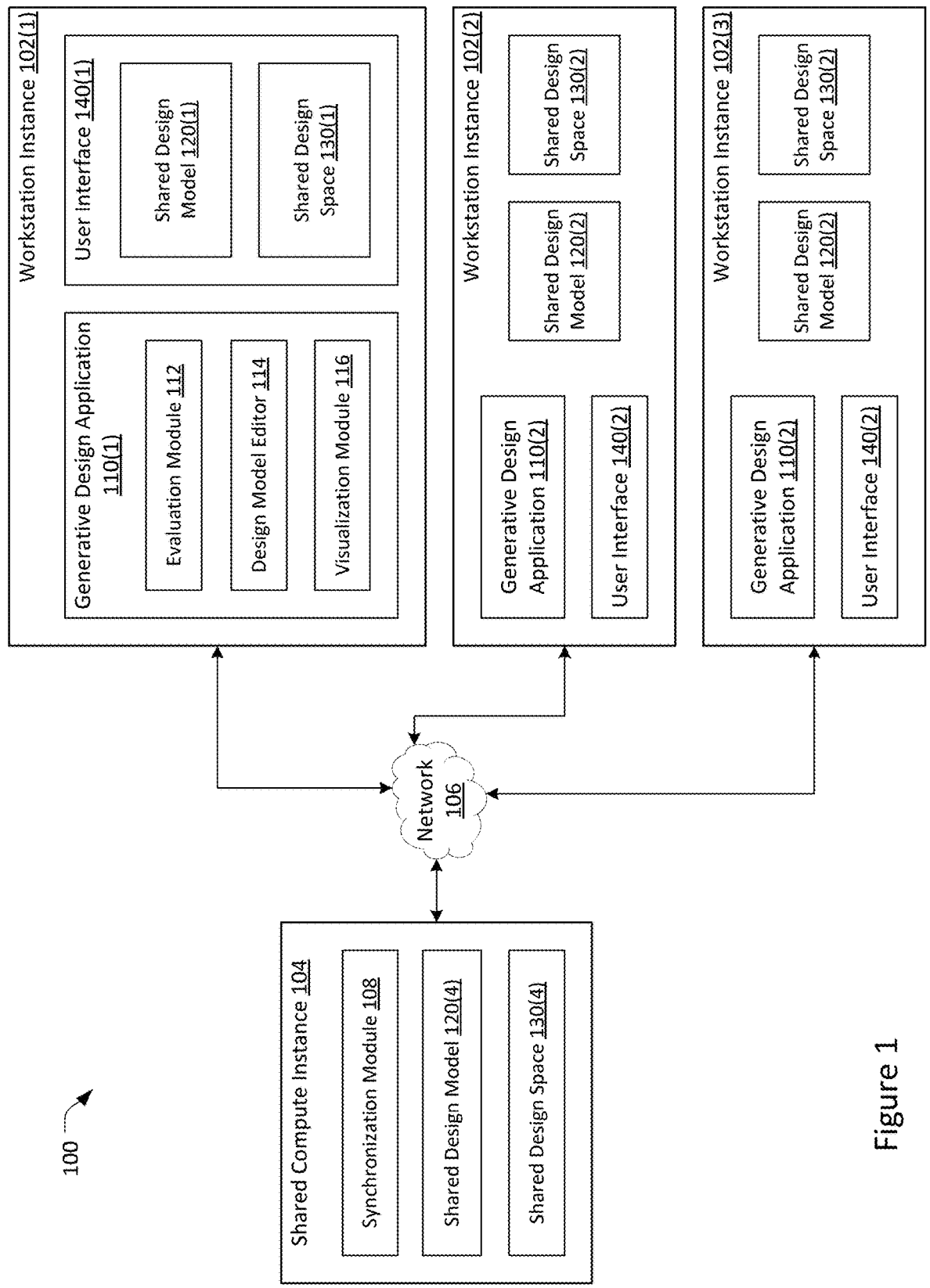
FIG. 1 is a conceptual illustration of a distributed computing system configured to implement one or more aspects of the various embodiments.

In the following description, numerous specific details are set forth to provide a more thorough understanding of the various embodiments. However, it will be apparent to one skilled in the art that the inventive concepts may be practiced without one or more of these specific details. For explanatory purposes, multiple instances of like objects are denoted with reference numbers identifying the object and parenthetical alphanumeric character(s) identifying the instance where needed.

Overview

Generative design systems include hardware and software components that operate to generate two-dimensional and three-dimensional designs as solutions to a design problem provided by a user. In such systems, the user provides the design problem by generating a problem specification, where the problem specification includes a set of parameters that any given design solution is to meet. The generative design system processes the problem specification and creates a set of design solutions. Each design solution that the generative design system generates meets the parameters of the problem specification, while having different characteristics in the specified parameters and/or other parameters (e.g., different specific values within a range, different values when the design problem does not specify any requirements, etc.). Such generative design systems provide a user with a great degree of control when generating the underlying design problem based on which the set of design solutions is generated. However, such controls to generate the design problem are often overly complex and require that a user have thorough knowledge of the interface and the operation of the system in order to craft problem specifications that reflect the goals, priorities, and constraints of the user. Consequently, only a small subset of highly-skilled designers that are stakeholders for a given project can successfully interact with the generative design system to create the set of design solutions. This causes the skilled designer to be the only user to interact with the generative design system, discouraging collaboration between stakeholders and causing the skilled designer to become a gatekeeper that filters the generated design solutions based on the priorities and goals of the skilled designer above other stakeholders in a project.

Further, such generative design systems are often single-user systems. In practice, a user performs various iterations of crafting the problem specification to define the design problem and triggering the generative design system to optimize the design solutions based on the parameters included in the problem specification. The generative design system may use optimization techniques that automatically filter the set of candidate design solutions to only those candidate solutions that minimize or maximize specific parameters (e.g., Pareto maximum or minimum), further limiting the set of candidate design solutions presented to a user. Such filtering techniques shrink the exploration space that the user may navigate when evaluating candidate designs. Consequently, subsequent users that refine the design problem may only be able to view the subset of design solutions.

To address the above problems, in some embodiments, a distributed computing system includes a plurality of workstations that operate instances of a generative design application. A given generative design application includes a design model editor that modifies a shared design model. The shared design model includes distinct predefined, selectable block items made from a set of voxels. A procedural content generation (PCG) engine within the generative design application generates a set of design solutions based on the arrangement of the block items that are included in the shared design model. An evaluation module computes a set of metrics based on the each of the set of generated design solutions and adds each of the generated design solutions to a shared design space. The user explores the set of design solutions in the shared design space via a visualization module and confirms the modifications to the shared design model to generate an updated shared design model. Upon generating the updated shared design model, the generative design application transmits the updated shared design model to a shared compute instance that uses a synchronization module to synchronize the shared design model between workstations. Upon confirming the shared design model the generative design application can render one or more design solution visualizations based on the confirmed shared design model.

Real-Time Collaborative Generative Design System

FIG. 1 is a conceptual illustration of a distributed computing system 100 configured to implement one or more aspects of the various embodiments. As shown, in some embodiments, the distributed computing system 100 includes, without limitation, a set of workstation instances 102, a shared compute instance 104, and a network 106. The workstation instances 102 include a generative design application 110 and a user interface 140. The generative design application 110 includes an evaluation module 112, a design model editor 114, and a visualization module 116. The user interface 140 includes a shared design model 120 and a shared design space 130. The shared compute instance 104 includes a synchronization module 108, the shared design model 120, and the shared design space 130.

Any number of the components of the distributed computing system 100 can be distributed across multiple geographic locations or implemented in one or more cloud computing environments (e.g., encapsulated shared resources, software, and data) in any combination. Alternatively, the distributed computing system 100 can be co-located in a shared area and connected via a network switch. In some embodiments, the shared compute instance 104 and/or zero or more other compute instances can be implemented in a cloud computing environment, implemented as part of any other distributed computing environment, or implemented in a stand-alone fashion. For explanatory purposes, multiple instances of like objects are denoted with reference numbers identifying the object and additional numbers identifying the instance where needed (e.g., the workstation instance 102(1)). Further, the distributed computing system 100 includes multiple instances of devices, even when not shown. For example, the distributed computing system 100 could include multiple instances of the generative design applications 110 (e.g., 110(1), 110(2), 110(3) etc.), that each include respective instances of the evaluation module (e.g., 112(1), 112(2), 112(3) etc.), the design model editor 114 (e.g., 114(1), 114(2), 114(3), etc.), and/or the visualization module 116 (e.g., 116(1), 116(2), 116(3), etc.) and still be within the scope of the disclosed embodiments.

In operation, the generative design application 110 executing in the workstation instance 102 receives the shared design model 120 from the shared compute instance 104 as part of a synchronization operation and includes the shared design model 120 in the shared design space 130. The visualization module 116 displays the shared design space 130 including the shared design model 120 via the user interface 140. The user makes one or more inputs to the shared design model 120, where the design model editor 114 receives the set of user inputs and updates the shared design model 120. The generative design application 110 uses the modified shared design model 120 as a design problem for the generative design application 110. The generative design application 110 processes the modified shared design model 120 and generates a set of candidate design solutions. The evaluation module 112 computes a set of metrics associated with a given candidate design solution. Based on the modified shared design model 120 created by the user, the generative design application 110 optimizes the candidate design solutions and adds the optimized candidate design solutions to the shared design space 130. Once the generative design application 110 adds the candidate design solutions to the shared design space 130, the user explores the set of design solutions in the shared design space 130 via the user interface 140 and the visualization module 116 and confirms the changes to the modified shared design model 120. In various embodiments, the generative design application 110 may further render a more detailed visualization of the modified shared design model 120 once the user confirms the changes.

The workstation instance 102 and the shared compute instance 104 includes one or more processors and memory subsystems. The processors may run various user processes (e.g., the generative design application 110, the user interface 140, etc.) that enable the user to complete various tasks, such as viewing and modifying the shared design model 120 and/or viewing various candidate design solutions in the shared design space 130. The workstation instance 102 is connected to the network 106 via one or more communications channels that transport files, objects, and/or other messages between components. For example, the generative design application 110 could communicate with the synchronization module 108 in the shared compute instance 104 in order to receive updates to the shared design model 120 and/or transmit local changes made by a given user to generate the modified shared design model 120.

The generative design application 110 processes the shared design model 120 as a design problem and generates a set of candidate design solutions. In various embodiments, one or more users of the workstation instances 102(1)-102(3) can use respective local instances of the design model editor 114 to generate local instances of the shared design model 120. In such instances, the generative design application 110 can generate a design problem based on the shared design model 120. In various embodiments, the local instances of the generative design application 110 (e.g., 110(1), 110(2), 110(3), etc.) and/or the synchronization module 108 can interoperate with one another to implement and all of the functionalities of the embodiments described herein.

The design model editor 114 receives inputs from a user and modifies the shared design model 120 by adding, modifying, and/or removing portions of the shared design model 120. In various embodiments, the design model editor 114 generates design model data as an interoperable data set for other modules to interpret without conversion. For example, when the shared design model 120 comprises an arrangement of predefined, selectable block items of different types (e.g., three types of ecologist block items, six types of developer block items, etc.) within a three-dimensional grid, the design model editor 114 can convert each selectable block item into a discrete set of coordinates. In such instances, the design model editor 114 generates design model data that includes (i) a list of coordinates and (ii) an identifier for each block item type. For example, when designing an urban block, the design model editor 114 can enable a user to select and place a predefined block item representing a park. When the user places a park block item within the shared design model 120, the design model editor 114 stores the design model data for the park block item as an identifier and a set of eight coordinates representing each edge of the park block item.

The shared design model 120 includes a set of predefined, selectable block items representing inputs provided by one or more users and edited via the respective design model editors 114. In various embodiments, the shared design model 120 can include an arrangement of a set of predefined, selectable block items of different types, where each selectable block item is defined as a voxel. For example, a first user can select a block item of a first type that is represented by a cube defined by a first voxel. The user can add the selected block item to the shared design model 120. In such instances, the shared design model 120 can represent the block item that was added to the shared design model 120 as a set of coordinates representing the edges of the voxel at a specific position within the shared design model 120. In various embodiments, a given block item can be a container of a set of block item programs (BIPs) that include sets of tunable properties and/or actions performed on other block items. For example, block item of the first type can be a residential building block item that includes a block item program that represents a set of floors capable of containing a tunable number of residents (e.g., apartments of different sizes) within a residential building. A given block item can include a set of parameters that affect certain metrics used to compute the performance of the overall design (e.g., capacity, demand for transportation, carbon footprint, etc.) and/or other block items proximate to the given block item (e.g., provides structural support for other block items, blocks access to sunlight of adjacent block items, etc.). In various embodiments, a user can add, move, modify (e.g., enhance an existing block item of a different type) and/or delete specific block items that are included in the shared design model 120.

The shared design space 130 includes a set of candidate design solutions that the generative design application 110 generated based on the shared design model 120. In various embodiments, the generative design application 110 can receive the shared design model 120 as a design problem, where the generative design application 110 processes the shared design model 120 as an initial state to generate a large set of candidate design solutions. In various embodiments, the generative design application 110 can iteratively design a large set of candidate design solutions from the same shared design model 120. In some embodiments, the generative design application 110 executes various optimization techniques to add, modify, and/or delete of specific block items in the shared design model 120 in order to enhance the overall performance of a given design solution. For example, the generative design application 110 could generate a first candidate design solution that that optimizes the performance of the shared design model 120 by adding multiple park block items adjacent to an existing residential block item within the shared design model 120 in order to reduce the average carbon footprint over all block items included in the shared design model 120 if it were modified to match the first candidate design solution. The generative design application 110 could then generate a second candidate solution that optimizes the performance of the shared design model 120 by enhancing the existing residential building block item such that the residential building block item also includes a retail hub (e.g., replacing the default residential building block item with an enhanced residential building block item), increasing access to services and increasing profitability of the shared design model 120 if it were modified to match the second candidate design solution. In various embodiments, the generative design application 110 provides the shared design space 130 to the visualization module 116 that displays one or more of the candidate design solutions. In such instances, the user can navigate through the set of candidate design solutions within the shared design space 130 in order to confirm any existing modifications made to the shared design model 120, as well as making one or more additional modifications in order for the shared design model 120 to include portions and/or match a specific design solution.

The evaluation module 112 computes a set of metrics associated with the design model data associated with the shared design model 120. For example, the evaluation module 112 can compute specific metrics for a given shared design model 120 based on the arrangement of the block items within the shared design model 120 and generate one or more metrics (e.g., one or more performance scores and/or one or more collaboration scores) that reflect the effectiveness of the shared design model 120 to meet the goals and constraints of the project. In various embodiments, the evaluation module 112 can also compute one or more behavioral metrics that measure how multiple users effectively collaborated during the real-time collaboration session to generate the shared design model 120. In such instances, the collaboration score that the evaluation module 112 computes can indicate how well different stakeholders worked collaboratively to optimize the shared design model 120 to enhance the collective goals for the project.

Additionally or alternatively, the evaluation module 112 can further include a recommender that suggests specific modifications to make to the shared design model 120 in order to improve one or more metrics (e.g., portions of the performance score and/or the collaboration score). In some embodiments, the generative design application 110 can include a neural network that maps a specific shared design model 120 to one or more optimized design solutions. In such instances, the recommender can select one of the optimized design solutions and display a comparison of the respective scores generated by the specific shared design model 120 with the corresponding optimized design solution. Additionally or alternatively, the evaluation module 112 can suggest a specific selectable block item to add, modify, or delete, as well as a specific location to place an additional selectable block item in order to optimize the shared design model 120.

The visualization module 116 displays, via the user interface 140, the shared design space 130. In various embodiments, the visualization module 116 displays the shared design model 120 within the shared design space 130. Additionally or alternatively, the visualization module 116 can maintain a design history that is locally stored in a database at the given device (not shown). In some embodiments, the visualization module 116 can maintain one or more self-organized maps (SOMs) that visually represent the set of the candidate design solutions within the shared design space 130. In such instances, the user can explore the set of candidate design solutions within the shared design space 130 by navigating the one or more self-organized maps. In various embodiments, the generative design application 110 adds candidate design solutions to the shared design space 130 via the self-organized map. In various embodiments, the visualization module 116 provides controls to the user interface 140 that enable the user to navigate between individual candidate design models within the self-organized map.

The user interface 140 enables the user to interact with the generative design application 110, the shared design model 120, and/or the shared design space 130. In various embodiments, the user interface 140 uses various techniques to represent the design model data, such as a window-and-object metaphor, a 3D rendering of plain block items, and/or a complex rendering of a 3D landscape corresponding to the arrangement of the block items (e.g., a rendering of a high-rise building to represent a stack of developer block items). Additionally or alternatively, the user interface 140 provides various mechanisms for user interaction with the workstation instance 102. Persons skilled in the art will recognize the various operating systems and user interfaces that are well-known in the art and suitable for incorporation into the workstation instance 102.

The synchronization module 108 processes data associated with the one or more generative design applications 110 and broadcasts changes to one or more devices operating the one or more generative design applications 110. For example, two or more users may be participants in a real-time collaboration session that are operating two or more local instances of the generative design application 110 to modify a shared design model 120. Each of the local instances of the generative design applications 110 generate one or more candidate design solutions for the shared design space 130. In such instances, the synchronization module 108 can receive data associated with actions performed by each user and synchronize the shared design model 120 and/or the shared design space 130 to reflect the changes made by each respective participant. In some embodiments, the synchronization module 108 can maintain a local instance of the shared design model 120 and/or a local instance of the shared design space 130 in the shared compute instance 104. In such instances, the synchronization module 108 can synchronize the shared design model 120 and/or the shared design space 130 by updating the local instance with data received from a given workstation instance 102 (e.g., data received from the workstation instance 102(1)) and can broadcast the updated local instance to the other workstation instances (e.g., 102(2), 102(3)) in order to have the other workstation instances update the local versions of the shared design model 120 and/or the shared design space 130 to match and reflect the updates.

The network 106 can enable communications between the workstation instances 102, the shared compute instance 104, and/or other devices in the network 106 via wired and/or wireless communications protocols, satellite networks, V2X networks, including Bluetooth, Bluetooth low energy (BLE), wireless local area network (WiFi), cellular protocols, and/or near-field communications (NFC).

Figure 2:
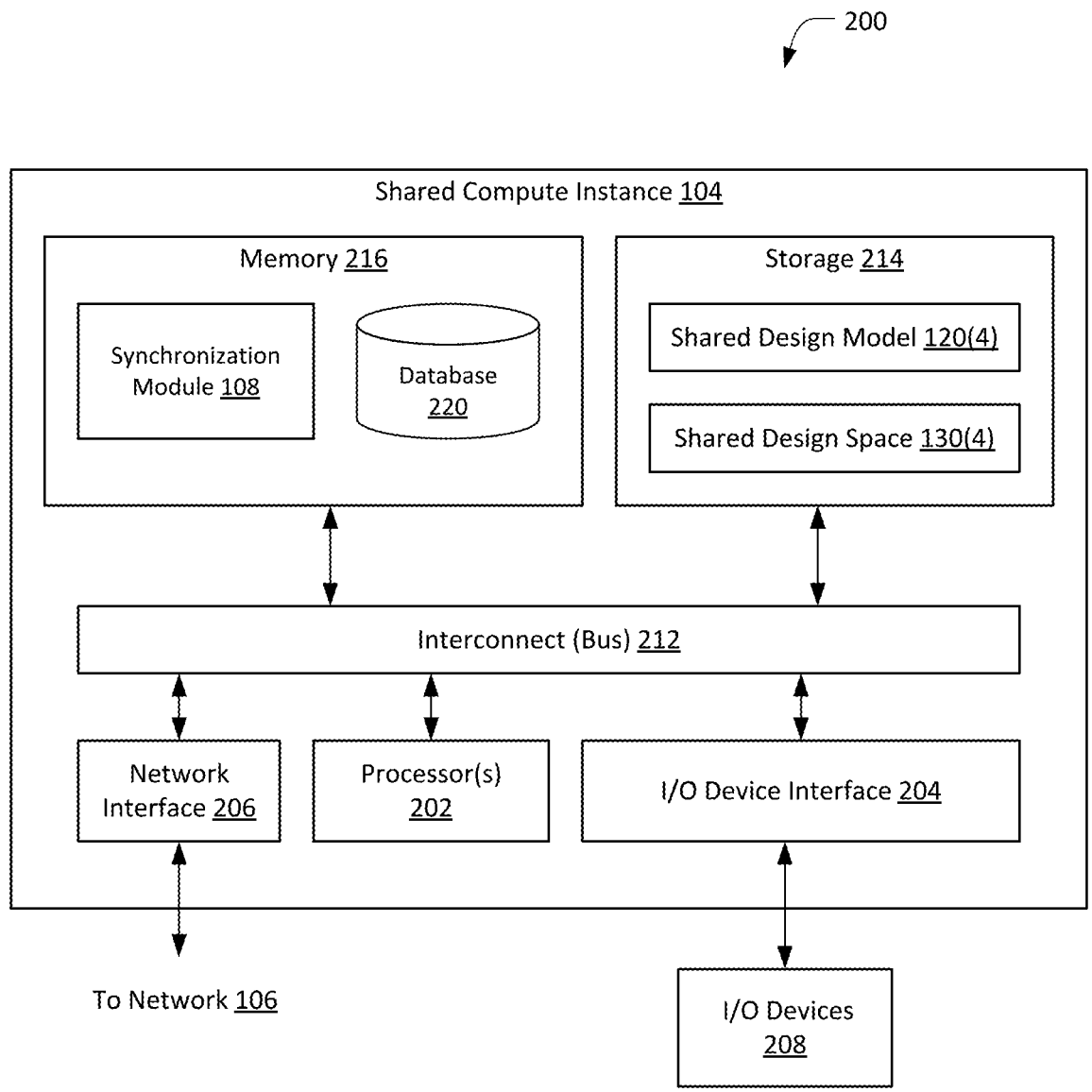
FIG. 2 is a more detailed illustration of a device including a shared compute instance included in the distributed computing system of FIG. 1, according to various embodiments.

FIG. 2 is a more detailed illustration of a device 200 including the shared compute instance 104 included in the distributed computing system 100 of FIG. 1, according to various embodiments. As shown, and without limitation, the device 200 includes the shared compute instance 104 and a set of input/output devices 208. The shared compute instance 104 includes one or more processors 202, an input/output interface 204, a network interface 206, an interconnect 212 storage 214, and memory 216. The storage 214 includes the shared design model 120(4) and the shared design space 130(4). The memory 216 includes the synchronization module 108 and a database 220.

Shared compute instance 104 includes a desktop computer, a laptop computer, a smart phone, a personal digital assistant (PDA), tablet computer, or any other type of computing device configured to receive input, process data, and optionally display images, and is suitable for practicing one or more embodiments. The shared compute instance 104 described herein is illustrative and that any other technically-feasible configurations fall within the scope of the present disclosure.

The processor(s) 202 includes any suitable processor implemented as a central processing unit (CPU), a graphics processing unit (GPU), an application-specific integrated circuit (ASIC), a field programmable gate array (FPGA), an artificial intelligence (AI) accelerator, any other type of processing unit, or a combination of different processing units, such as a CPU configured to operate in conjunction with a GPU. In general, the processor(s) 202 may be any technically-feasible hardware unit capable of processing data and/or executing software applications. Further, in the context of this disclosure, the computing elements shown in the shared compute instance 104 may correspond to a physical computing system (e.g., a system in a data center) or may be a virtual computing instance executing within a computing cloud.

In one embodiment, the I/O devices 208 include devices capable of providing input, such as a keyboard, a mouse, a touch-sensitive screen, and so forth, as well as devices capable of providing output, such as a display device. Additionally, the I/O devices 208 may include devices capable of both receiving input and providing output, such as a touchscreen, a universal serial bus (USB) port, and so forth. The I/O devices 208 may be configured to receive distinct types of input from a user of the shared compute instance 104, and to also provide distinct types of output to the user of the shared compute instance 104, such as displayed digital images or digital videos or text. In some embodiments, one or more of the I/O devices 208 are configured to couple the shared compute instance to the network 106.

The storage 214 includes non-volatile storage for applications and data, and may include fixed or removable disk drives, flash memory devices, and CD-ROM, DVD-ROM, Blu-Ray, HD-DVD, or other magnetic, optical, or solid-state storage devices. In various embodiments, the synchronization module 108 can be stored in the storage 214 and loaded into the memory 216 when executed. Additionally or alternatively, the storage 214 can store the local instance 120(4) of the shared design model 120 and/or the local instance 130(4) of the shared design space 130.

The memory 216 includes a random-access memory (RAM) module, a flash memory unit, or any other type of memory unit or combination thereof. The processor(s) 202, the I/O device interface 204, and/or the network interface 206 are configured to read data from and write data to the memory 216. The memory 216 includes various software programs that can be executed by the processor(s) 202 and application data associated with said software programs.

Figure 3:
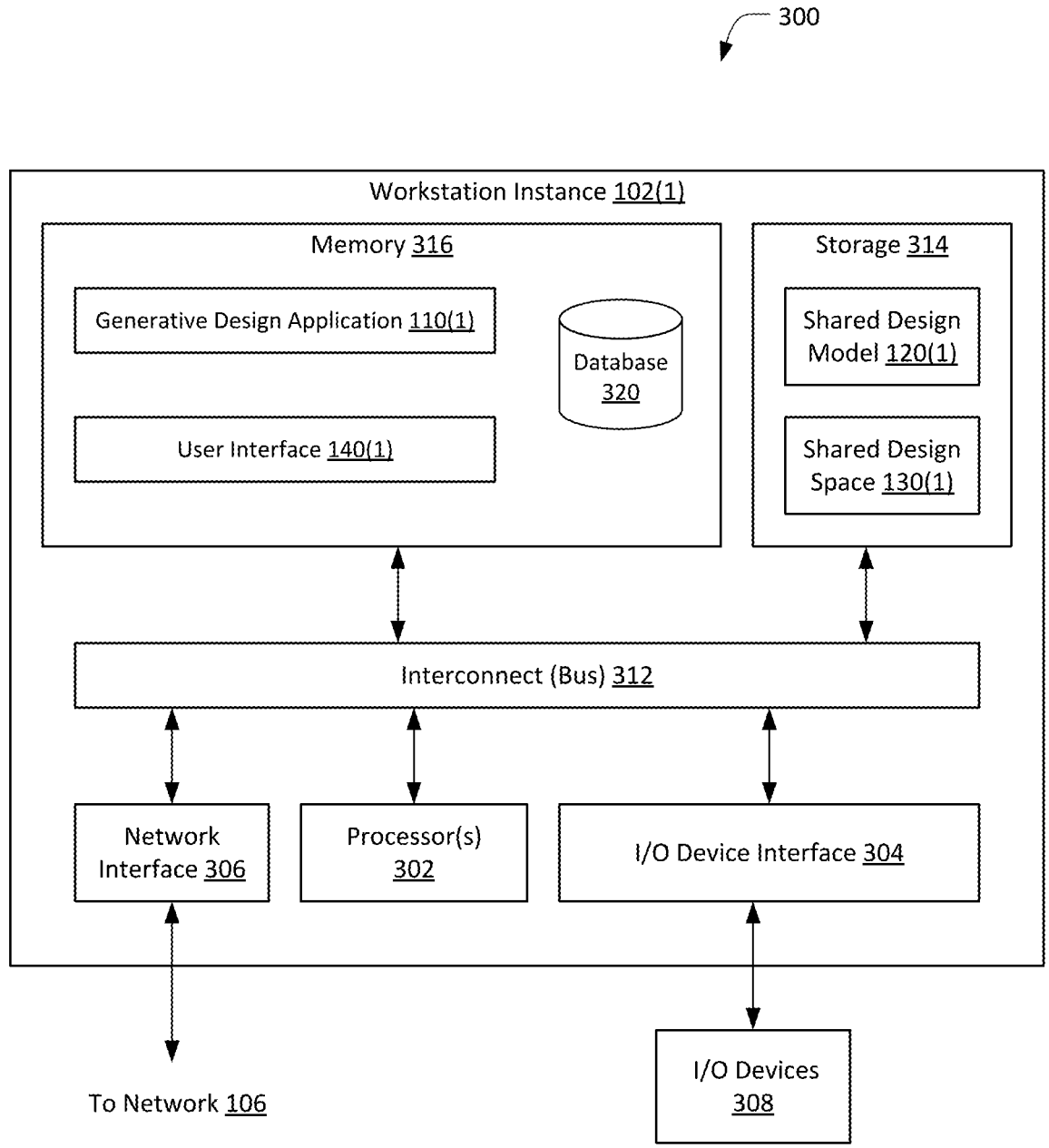
FIG. 3 is a more detailed illustration of a device including a workstation instance included in the distributed computing system of FIG. 1, according to various embodiments.

FIG. 3 is a more detailed illustration of a device 300 a workstation instance 102(1) included in the distributed computing system 100 of FIG. 1, according to various embodiments. As shown, and without limitation, the device 300 includes the workstation instance 102(1) and a set of input/output devices 308. The workstation instance 102(1) includes one or more processors 302, an input/output interface 304, a network interface 306, and interconnect 312, storage 314, and memory 316. The storage 314 includes the shared design model 120(1) and the shared design space 130(1). The memory 316 includes the generative design application 110(1), the user interface 140(1), and a database 320.

The workstation instance 102 includes a desktop computer, a laptop computer, a smart phone, a personal digital assistant (PDA), tablet computer, or any other type of computing device configured to receive input, process data, and optionally display images, and is suitable for practicing one or more embodiments. The workstation instances 102 described herein are illustrative and that any other technically-feasible configurations fall within the scope of the present disclosure.

The processor(s) 302 includes any suitable processor implemented as a CPU, a GPU, an ASIC, a FPGA, an AI accelerator, any other type of processing unit, or a combination of different processing units, such as a CPU configured to operate in conjunction with a GPU. In general, the processor(s) 302 may be any technically-feasible hardware unit capable of processing data and/or executing software applications. Further, in the context of this disclosure, the computing elements shown in the workstation instance 102 may correspond to a physical computing system (e.g., a system in a data center) or may be a virtual computing instance executing within a computing cloud.

In one embodiment, the I/O devices 308 include devices capable of providing input, such as a keyboard, a mouse, a touch-sensitive screen, and so forth, as well as devices capable of providing output, such as a display device. Additionally, the I/O devices 308 may include devices capable of both receiving input and providing output, such as a touchscreen, a USB port, and so forth. The I/O devices 308 may be configured to receive distinct types of input from a user of the workstation instance 102, and to also provide distinct types of output to the user of the workstation instance 102, such as displayed digital images or digital videos or text. In some embodiments, one or more of the I/O devices 308 are configured to couple the shared compute instance to the network 106.

The storage 314 includes non-volatile storage for applications and data, and may include fixed or removable disk drives, flash memory devices, and CD-ROM, DVD-ROM, Blu-Ray, HD-DVD, or other magnetic, optical, or solid-state storage devices. In various embodiments, one or more programs, including the generative design application 110 and/or the user interface 140, can be stored in the storage 314 and loaded into the memory 316 when executed. Additionally or alternatively, the storage 314 can store the local instance 120(1) of the shared design model 120 and/or the local instance 130(1) of the shared design space 130.

The memory 316 includes a random-access memory (RAM) module, a flash memory unit, or any other type of memory unit or combination thereof. The processor(s) 302, the I/O device interface 304, and/or the network interface 306 are configured to read data from and write data to the memory 316. The memory 316 includes various software programs that can be executed by the processor(s) 302 and application data associated with said software programs.

Techniques for Editing a Shared Design Model

Figure 4:
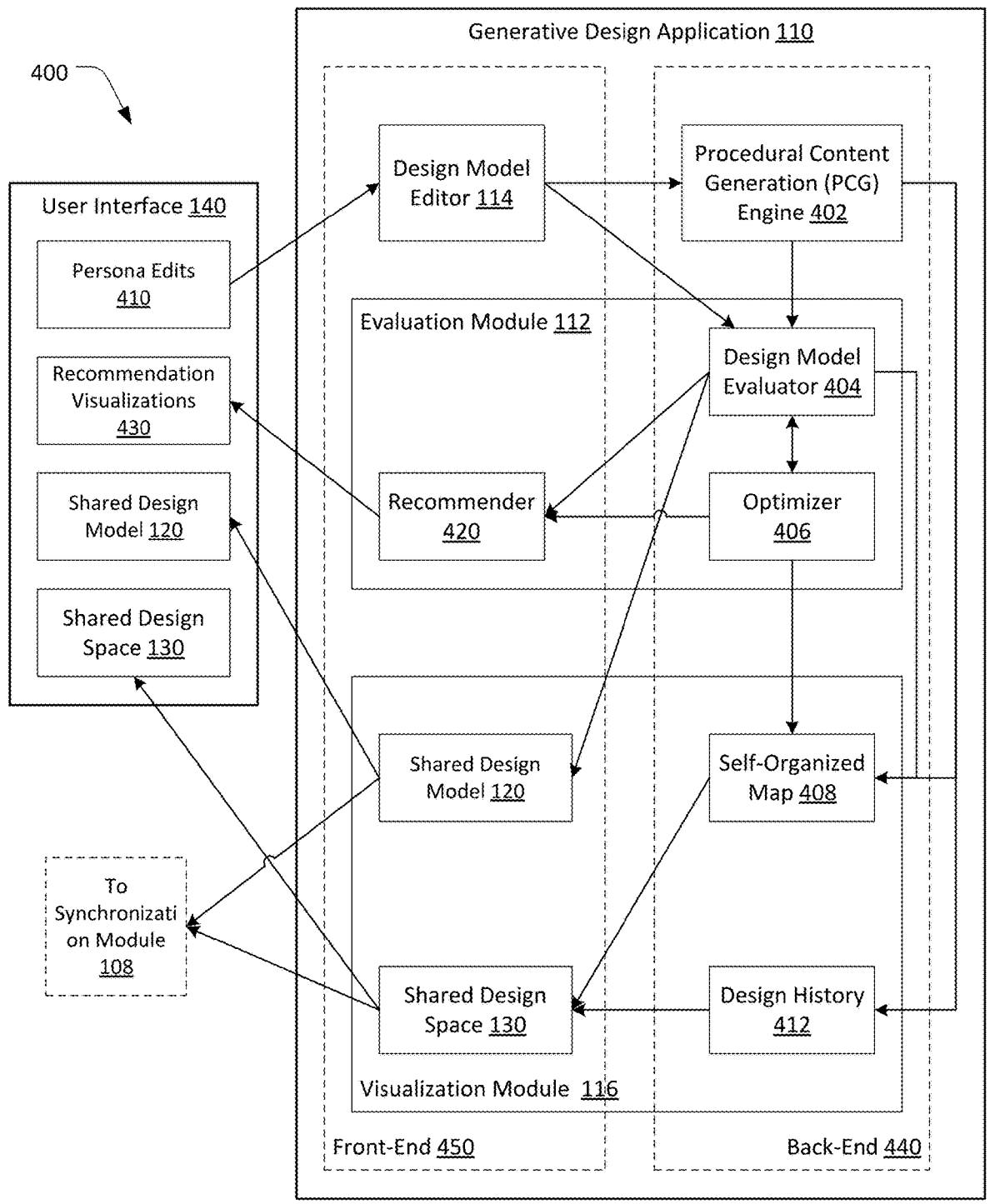
FIG. 4 is a diagram illustrating interactions between components of a workstation instance included in the distributed computing system of FIG. 1, according to various embodiments.

FIG. 4 is a diagram 400 illustrating interactions between components of a workstation instance 102 included in the distributed computing system 100 of FIG. 1, according to various embodiments. As shown, and without limitation, the diagram 400 includes the generative design application 110 and the user interface 140. The generative design application 110 includes the design model editor 114, a procedural content generation (PCG) engine 402, the evaluation module 112, and the visualization module 116. The evaluation module 112 includes a design model evaluator 404, an optimizer 406, and a recommender 420. The visualization module 116 includes a self-organized map 408, a design history module 412, the shared design model 120 and the shared design space 130. The user interface 140 includes a set of persona edits 410, recommendation visualizations 430, the shared design model 120, and the shared design space 130.

In operation, the user interface 140 and the generative design application 110 execute various interaction loops to enable a user to edit the shared design model 120 and explore the shared design space 130 that includes a set of candidate design solutions that the generative design application 110 generates in response to processing the shared design model 120 as a design problem. The generative design application 110 includes a back-end 440 that performs various techniques to generate, modify, and/or store various data structures (e.g., the shared data model 120 and/or the shared design space 130). The components in the back-end 440 the data structures to components in the front-end 450 (e.g., provide optimized candidate design solutions to the recommender 420), where the front-end components provide the information to the user via the user interface 140.

In various embodiments, the generative design application 110 can enable the user to perform a specific subset of inputs (e.g., edits to the shared design model 120) based on a specific persona associated with the project. For example, a project to design an urban space can include at least three separate personas (e.g., city planner, commercial developer, community ecologist, etc.) that have different goals, priorities, and capabilities. A user acting under a given persona has a specific set of capabilities, such as the ability to make a subset of inputs, like selecting, placing, and/or removing one or more predefined persona-specific block items. For example, in various embodiments, only a user operating the ecologist persona can select and place an urban park block item within the shared design model 120. In such instances, only the user operating the ecologist persona can remove the urban block item from the shared design model 120. Further, only a specific persona can make persona-specific enhancements to existing blocks. For example, only a user operating under the city planner persona can enhance an existing ecologist-type block item by enhancing the existing block item to include an algae production area. Similarly, only a user operating under the city planner persona can enhance an existing developer block by causing the existing developer block to further include solar roofs.

Based on the persona the user is employing, the user generates a set of persona edits 410 in order to modify the shared design model 120. For example, the user generates a set of persona edits 410 by adding a selectable block item to a specific position within the grid of the shared design model 120. The user interface 140 transmits the persona edits 410 to the design model editor 114. The design model editor 114 modifies the shared design model 120 with the persona edits 410, generating a modified shared design model 120 represented by a set of design model data that the design model editor 114 transmits to the PCG engine 402.

The procedural content generation (PCG) engine 402 is a geometry generation engine that uses the set of design model data corresponding to a given shared design model 120 as a design problem to generate a set of candidate design solutions. In such instances, the PCG engine 402 treats the set of design model data as an initial state, where the PCG engine 402 performs various operations to produce a series of generative designs in real-time in response to the set of design model data. For example, the PCG engine 402 can generate thousands of different candidate design solutions by starting each candidate design solution from the same set of design model data received from the design model editor 114.

The design model evaluator 404 computes metrics for each candidate design solution that the PCG engine 402 generates. For example, when the PCG engine 402 performs thousands of iterations to generate a large set of candidate design solutions, the design model evaluator 404 computes metrics for each of the candidate design solutions. The design model evaluator 404 transmits the candidate design solution and the set of computed metrics to other modules in the generative design application 110.

For example, the design model evaluator 404 can compute a set of performance metrics (e.g., one or more characteristics based on the arrangement of the block items) in order to compute an overall performance score for a given candidate design solution. For example, in some embodiments, the performance metrics for an urban design can include a set of social metrics (e.g., public spaces & amenities, views & visibility, noise exposure, etc.), a set of ecological metrics (e.g., amount of green space, amount of daylight, energy & food, etc.) and/or a set of economic metrics (e.g., number of jobs, number of residents, access to amenities, etc.).

Additionally or alternatively, the design model evaluator 404 can compute one or more behavior metrics in order to compute collaboration scores for participants in the real-time collaboration session. In such instances, design model evaluator 404 can compute behavior metrics that measure how well different pairs of participants provided separate persona edits 410 to the shared design model 120 in order to enhance the collective goals of the group. In such instances, the design model evaluator 404 can combine separate collaboration scores (e.g., separate collaboration scores between the city planner & ecologist, ecologist & developer, and developer & city planner, respectively) to compute an overall collaboration score for the group of participants.

The optimizer 406 performs various optimization techniques to modify the shared design model 120 and/or one or more candidate design solutions generated by the PCG engine 402 in order to optimize the performance metrics of the shared design model 120 and/or a given candidate design solution. In various embodiments, the group of participants collaborate to prioritize specific performance metrics for the shared design model 120. In such instances, the optimizer 406 can generate recommendations that modify one or more aspects of the shared design model 120 and/or candidate design solution to maximize or minimize one or more performance metrics. For example, the optimizer 406 can generate a recommendation that moves a residential block item included in a given candidate design solution to a different position in the candidate design solution in order to maximize the amount of light received by the shared design model 120 as a whole. Additionally or alternatively, the optimizer 406 can perform the optimization techniques in real time as the PCG engine 402 generates candidate design solutions in real time.

The recommender 420 receives the set of design model data via the design model evaluator 404, as well as one or more optimized design solutions from the optimizer 406. In various embodiments, the recommender 420 suggests specific modifications to make to the shared design model 120 in order for the user to make a modified shared design model 120 that matches one of the optimized design solutions. In some embodiments, the evaluation module 112 can include a neural network (not shown) that maps the set of design model data for a given shared design model 120 made by the group of participants to one or more optimized design solutions. In such instances, the recommender 420 can select one of the optimized design solutions and cause the user interface 140 to display a comparison of performance scores of the designs. For example, the recommender 420 can cause the user interface 140 to display the current performance metrics associated with the set of design model data for a current shared design model 120 with a set of performance metrics computed for a specific optimized candidate design solution.

In some embodiments, the recommender 420 can generate recommendation visualizations 430 that graphically illustrate recommendations generated by the optimizer 406 for modifying the shared design model 120. In these embodiments, for each recommendation, the recommender 420 can cause the user interface 140 to display a set of recommendation markers that visually illustrates the recommendation on the shared design model 120. For example, the set of recommendation markers can be used to highlight a position at which to add a predefined electable block item (e.g., adding a residential building block item over a commercial building block item), and/or highlight an existing block item within the shared design model 120 to enhance in order to modify the current shared design model 120 to match the optimized candidate design solution. The recommender 420 and recommendation visualizations 430 is discussed in detail below in relation to FIGS. 28-40.

The visualization module 116 displays the shared design space 130 that includes the shared design model 120. In various embodiments, the PCG engine 402 and/or the evaluation module 112 add candidate design solutions and/or optimized candidate design solutions to the self-organized map (SOM) 408 and/or the design history module 412 for the visualization module 116 to display a set of candidate design solutions within the shared design space 130. In such instances, the visualization module 116 can use the design history module 412 to maintain a design history that is locally stored in the database 320. Additionally or alternatively, the visualization module 116 provides controls to the user interface 140 that enable the user to navigate between individual candidate design models and/or previous candidate design models from the design history within the shared design space 130. In such instances, the user can navigate the shared design space 130 in order to see how changes to the shared design model 120 over time by the respective personas has modified the performance metrics of the candidate design solutions.

The visualization module 116 maintains one or more self-organized maps 408 that visually represent the candidate design solutions generated by the PCG engine 402 and/or the optimizer 406. In such instances, the user can use the user interface 140 to navigate within one or more of the self-organized maps 408, where a given self-organized map 408 visually represents the shared design space 130. In some embodiments, the PCG engine 402 and/or the optimizer 406 adds the candidate design solutions to the shared design space 130 via the self-organized map 408. Alternatively, in other embodiments, the PCG engine 402 and/or the optimizer 406 add candidate solutions directly to the shared design space 130 and the visualization module 116 generates one or more self-organized maps 408 from the shared design space 130.

The user interface 140 enables the user to interact with components of the generative design application 110, the shared design model 120, and/or the shared design space 130. In various embodiments, the user interface 140 uses various techniques to represent the design model data, such as a window-and-object metaphor, a 3D rendering of plain block items, and/or a complex rendering of a 3D landscape corresponding to the arrangement of the block items. Additionally or alternatively, the user interface 140 provides various mechanisms for user interaction with the workstation instance 102. For example, upon receiving a shared design model 120 as part of a synchronization technique performed by the synchronization module 108, the user interface 140 provides a shared design space 130 that includes the shared design model 120. The user interface 140 provides navigation tools to explore portions of the shared design model 120, as well as navigation tools to explore other candidate design solutions that are within the shared design space 130. The user interface 140 further provides editing tools that enable the user to provide the persona edits 410 to the design model editor 114 in order to generate a modified shared design model 120 to initiate the PCG engine 402 to generate new candidate design solutions based on a set of design model data representing the modified shared design model 120.

In some embodiments, the user interface 140 displays a visualization of the PCG engine 402 and/or the optimizer 406 performing techniques to generate new candidate design models and/or optimized candidate design models in real time within the shared design space 130. Upon viewing the updated shared design space 130, the user can confirm the persona edits 410 and cause the shared design model 120 to be updated to reflect the persona edits 410. Upon updating the shared design model 120 and/or the shared design space 130, the generative design application 110 can transmit the updated shared design model 120 and/or the shared design space 130 to the synchronization module 108.

Figure 5:
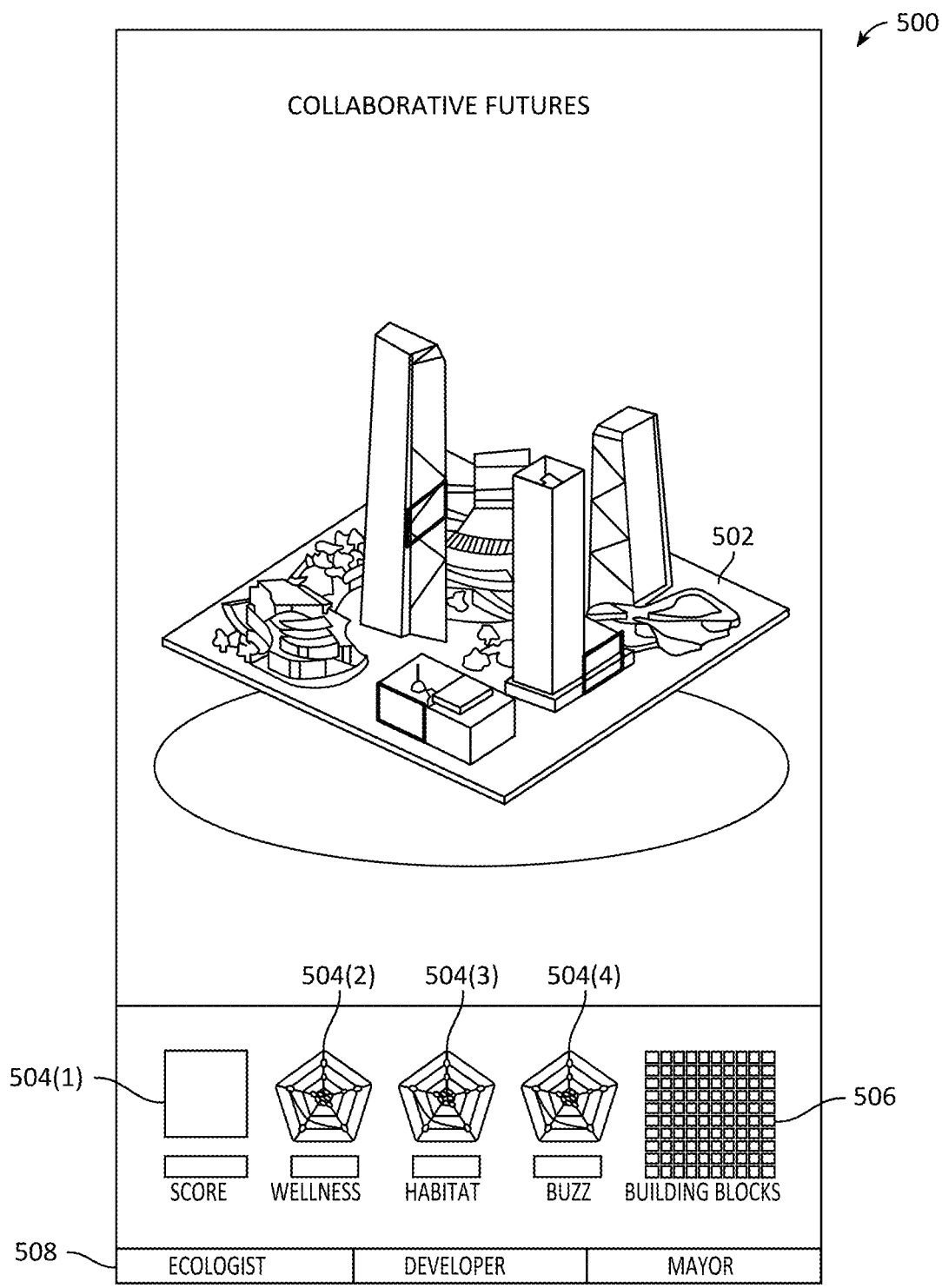
FIG. 5 illustrates an example user screen provided by a workstation instance of FIG. 1, according to various embodiments.

FIG. 5 illustrates an example user screen 500 provided by a workstation instance 102 of FIG. 1, according to various embodiments. As shown, and without limitation, the user screen 500 includes a city block visualization 502 based on the shared design model 120, a set of scores 504 (e.g., 504(1), 504(2), etc.) based on the shared design model 120, a remaining blocks indicator 506 and persona indicators 508.

In operation, the generative design application 110 causes the user interface 140 to present the user screen 500 that reflects the shared design model 120. In some embodiments, at least one of the generative design applications 110 causes the shared compute instance 104 to display the user screen 500 while the workstation instances 102 display different user screens.

The city block visualization 502 is a visual rendering of a city space based on the arrangement of the predefined selectable block items of different types that are included in the shared design model 120. In various embodiments, the generative design application 110 can cause the PCG engine 402 to generate a candidate design solution as a city block rendering in lieu of a visualization of the arrangement of block items. In such instances, the city block visualization 502 replaces each block item with a corresponding high-resolution rendering that is associated with the block item type. For example, the PCG engine 402 may render a stack of four commercial building blocks as a skyscraper commercial building. In another example, the PCG engine 402 may render a park above a commercial building as an urban park installed on a roof of a commercial building.

The scores 504 indicate the real-time scores that the design model evaluator 404 computed for the shared design model 120. In various embodiments, the design model evaluator 404 can compute separate subsets of metrics, as well as one or more comprehensive metrics. For example, the score 504(1) indicates an overall performance score associated with the current city block visualization 502. The wellness scores 504(2) indicates the relative set of social metrics associated with the city planner personas. The habitat scores 504(3) indicates the relative set of ecological metrics associated with the ecologist persona. The buzz scores 504(4) indicates the relative set of economic metrics associated with the developer persona. Various embodiments can include other sets of metrics and other personas (e.g., safety metrics associated with a police or hazard management person).

In various embodiments, each persona may add predefined, selectable block items of specific types. Such predefined, selectable block items may include characteristics that affect the scores of other block items and/or the overall score. For example, a waste management block item (associated with the city planner persona) may include characteristics that either positively or negatively affect other subsets of characteristics, such as negatively affecting economic metrics and/or positively affecting ecological metrics. In some embodiments, the evaluation module 112 may also provide a collaboration score that encourages collaborative behavior between individual personas in order to have multiple participants balance the sets of metrics and increase the overall performance score.

The remaining blocks indicator 506 indicates the overall number of block items available for all of the participants in the real-time collaboration session to place. In some embodiments, each persona may have an equal number of block items to place in the shared design model 120. Alternatively, the generative design application 110 may have a general pool of block items from which the respective participants draw from when modifying the shared design model 120. In such instances, a given persona may place more blocks based on the overall priorities of all the stakeholders. For example, if the primary goal of the project includes quantity of residents and amount of retail space, the developer persona may draw from the remaining blocks more often in order for the group to reach the high-priority goal.

The persona indicators 508 highlight the distinctive types of predefined, selectable block items within the city block visualization 502 that correspond to the respective personas. For example, the types of selectable block items in the city block visualization 502 that correspond to the ecologist persona may have an overlay that matches the pattern of the ecologist persona indicator 508. In some embodiments, the city block visualization 502 may show overlay over the most-recently placed block item corresponding to each of the respective personas.

Figure 6:
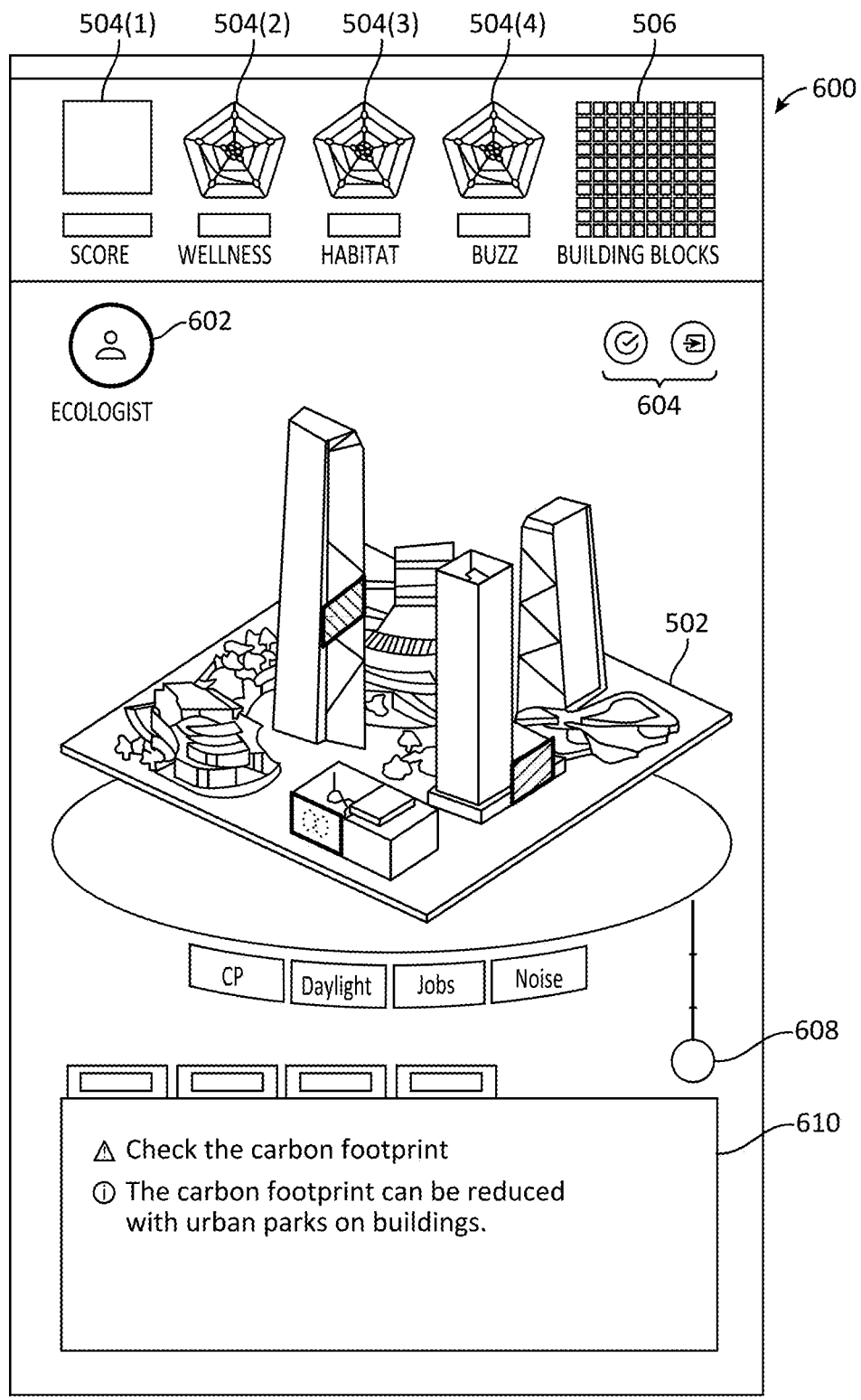
FIG. 6 illustrates another example user screen provided by a workstation instance of FIG. 1, according to various embodiments.

FIG. 6 illustrates another example user screen 600 provided by a workstation instance of FIG. 1, according to various embodiments. As shown, and without limitation, the user screen 600 includes the city block visualization 502, the set of scores 504, the remaining blocks indicator 506, a persona indicator 602, a set of group actions 604, a set of overlays 606, a design space slider 608, and an information panel 610.

In operation the generative design application 110 causes the user interface 140 to present the user screen 600 that reflects the shared design model 120. In some embodiments, at least one of the generative design applications 110 causes the shared compute instance 104 to display the user screen 500 for the collective group while a given workstation instances 102 (e.g., 102(2)) displays the user screen to a single participant acting under a single persona.

The persona indicator 602 displays, to the participant, the current persona that the participant is employing for the real-time collaboration session. In some embodiments, a single participant can switch between two or more personas during the real-time collaboration session. For example, a representative for the city can switch between the city planner persona in order to place civic-type block items and the ecologist persona in order to place ecological-type block items. In such instances, a user can select an icon to switch between the personas.

The group actions 604 enable a user to perform an action associated with the group. In various embodiments, the generative design application 110 can wait to confirm group consensus before rendering a final design solution based on the shared design model 120. In such instances, each participant can confirm or deny consensus using one of the buttons corresponding to a group action 604. Once all participants confirm consensus, the generative design application 110 can provide final scores based on the shared design model 120 that was confirmed by all the participants.

The overlays 606 indicate distinct types of overlays to place over the city block visualization 502. In some embodiments, the overlays 606 can represent a specific metric (e.g., carbon footprint), or a specific set of metrics (e.g., set of ecological scores). In such instances, a participant can switch between overlays by selecting a specific overlay 606.

The design space slider 608 indicates the current zoom level of that city block visualization 502 relative to the design space. In various embodiments, the user can slide the slider to zoom in and out and view distinct types of self-organized maps that display portions of the shared design space 130.

The information panel 610 displays additional information associated with the shared design model 120 and/or the shared design space 130. In various embodiments, the information panel can 610 indicate the goals, capabilities, priorities, and constraints of a given persona. The information panel 610 may also provide additional information on the types of selectable block items that are available for a given persona to select and place in the shared design model 120. For example, a developer persona can view information on a set of predefined block items, such as high-density commercial, low-density commercial, high-density residential, low-density residential block items. The information displayed within the information panel 610 can include the characteristics of a given type of predefined, selectable block item, as well as recommendations for where to place a given block item type based on the current state of the shared design model 120.

Figure 7:
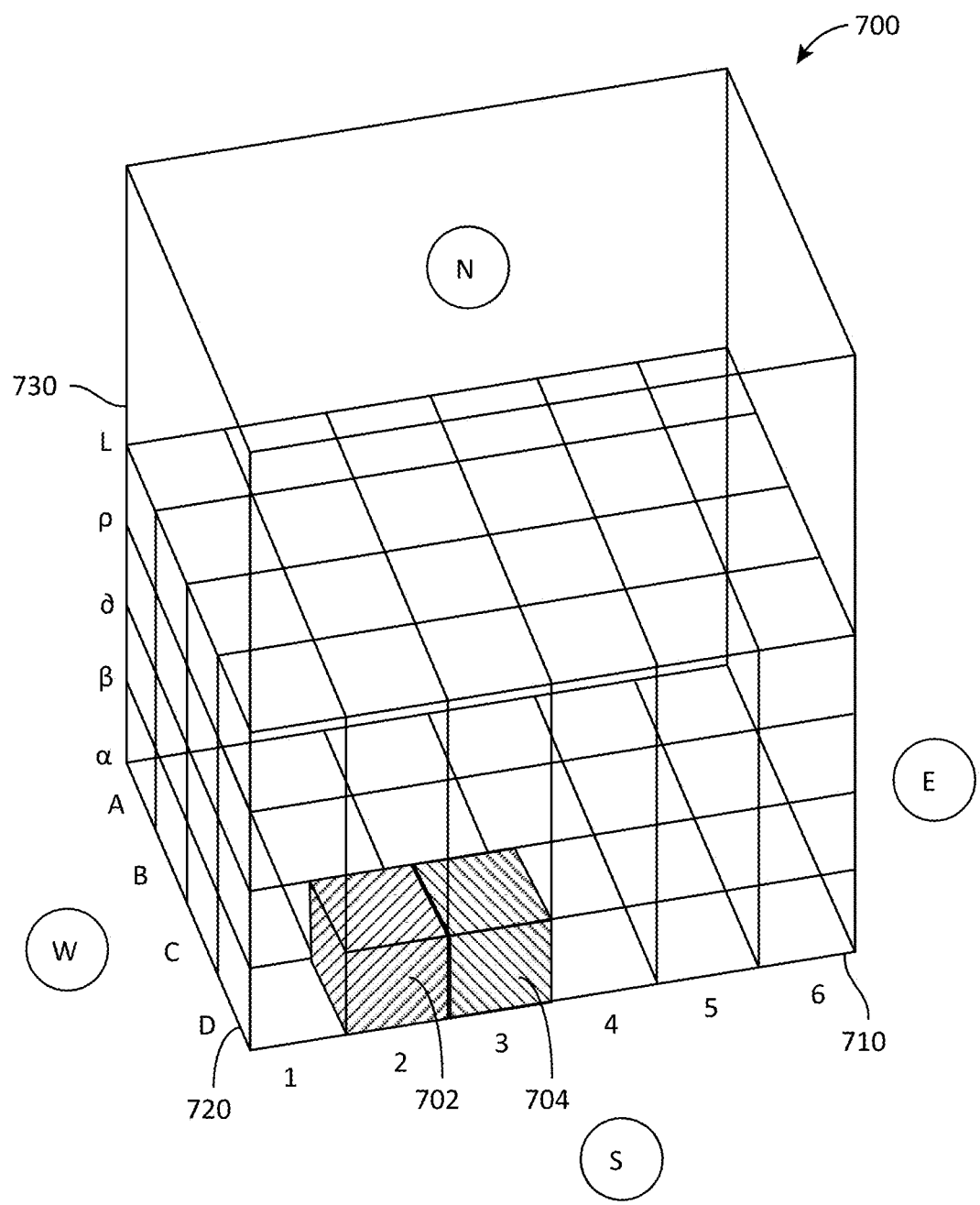
FIG. 7 illustrates an example visualization of a shared design model included in the distributed computing system of FIG. 1, according to various embodiments.

FIG. 7 illustrates an example visualization 700 of a shared design model 120 included in the distributed computing system of FIG. 1, according to various embodiments. As shown and without limitation, the visualization 700 includes a first axis 710, a second axis 720, and a third axis 730. The grid includes a first block item 702 and a second block item 704.

In operation, each persona can add and/or delete one or more block items within the grid representing the shared design model 120. For example, a first persona can place the first block item 702 corresponding to a predefined, selectable block item of a first type. The second persona can add the second block item 704 corresponding to a predefined, selectable block item of a second type. The design model editor 114 receives one or more persona edits 410 that are associated with placing, modifying (e.g., enhancing), and/or removing block items 702, 704 from the grid.

In various embodiments, the design model editor 114 generates a set of design model data based on coordinate data for each block item included in the grid. For example, the design model editor 114 can identify the location of the first block item 702 based on the faces of the block item (e.g., D, α, 2). Alternatively, the design model editors 114 can identify the location of the first block item 702 based on the sets of coordinates corresponding to each edge. When the design model editor 114 generates the set of design model data, the design model data includes the coordinates for each of the respective block items.

Figure 8:
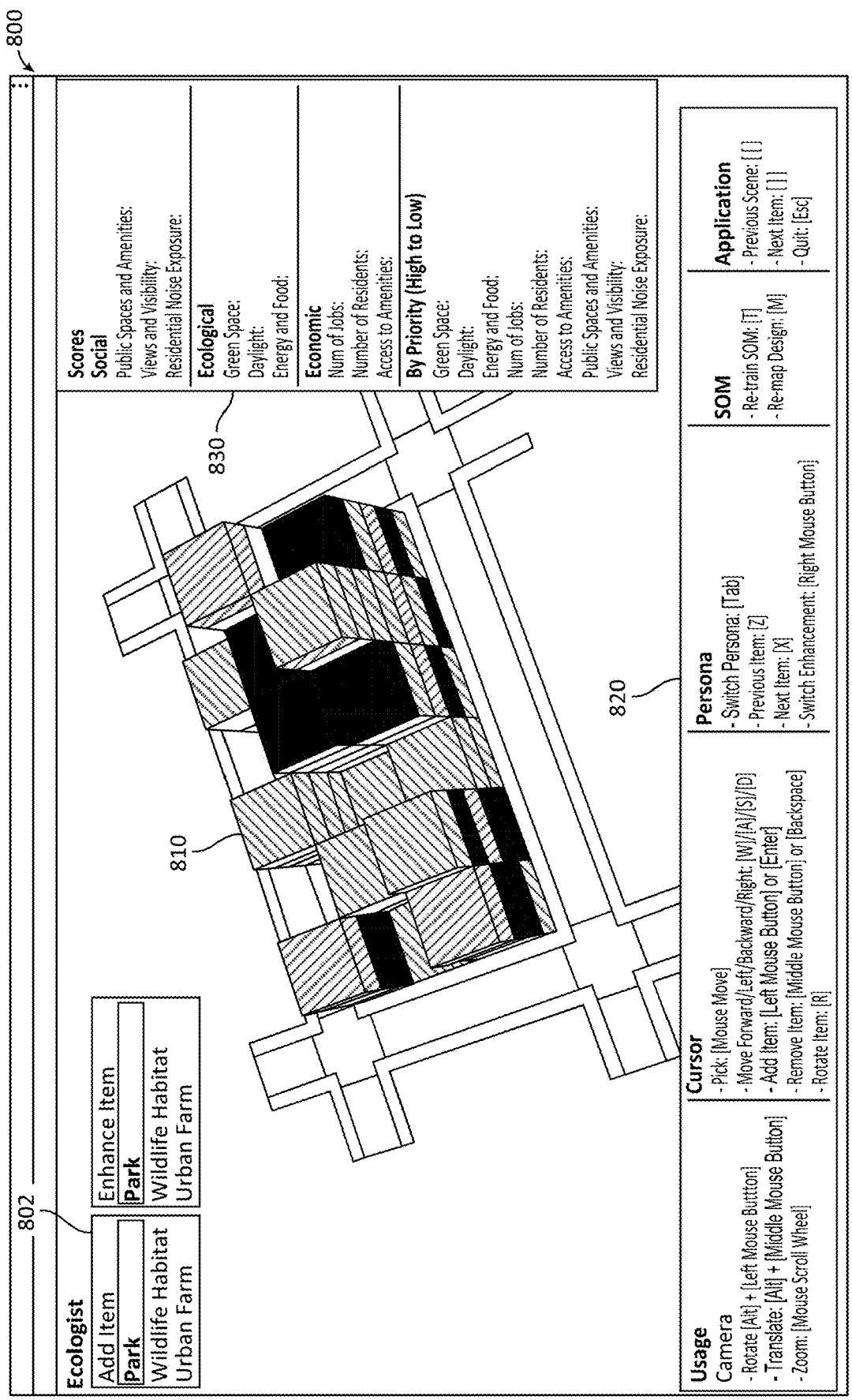
FIG. 8 illustrates an example user screen for a block item editor included in the workstation of FIG. 1, according to various embodiments.

FIG. 8 illustrates an example user screen 800 for a design model editor 114 included in the workstation instance 102 of FIG. 1, according to various embodiments. As shown, the user screen 800 includes a block item menu 802, a city grid 810, a participant action panel 820 and a scoring panel 830.

In operation, the generative design application 110 causes the user interface 140 to present the user screen 800 in order to enable a participant to modify the shared design model 120. For example, a participant employing the ecologist persona can use the block item menu 802 to select a specific block item type (e.g., park, habitat, or urban farm), to add to a level of the city grid 810.

In various embodiments, the generative design application 110 can cause the user screen 800 to display a participant action panel 820 that includes controls to perform actions associated with the shared design model 120 and/or the shared design space 130. For example, the participant action panel 820 include actions to add, move, and/or remove block items, move the camera, change the candidate design solutions in the shared design space 130, and exit the generative design application 110.

In some embodiments, the generative design application 110 can also include a score panel 830 that identifies the specific metrics computed for the shared design model 120. In some embodiments, the design model evaluator 404 can update the scores in real time as a participant modifies the city grid 810. In some embodiments, the score panel 830 lists the priority order of the metrics that the design model evaluator 404 uses when computing the overall performance score for the shared design model 120. For example, the score panel 830 can list specific priority values (e.g., P=0.400) that are respectively assigned to each metric. In such instances, the design model evaluator 404 can weigh higher-priority metrics more than lower-priority metrics. Additionally or alternatively, the design model evaluator 404 can dynamically evaluate the priorities based on the performance of the shared design model 120. For example, when the shared design model 120 consumes a larger quantity of energy, the design model evaluator 404 may cause the carbon footprint score to be a higher priority than for shared design models 120 that consume less energy.

Figure 9:
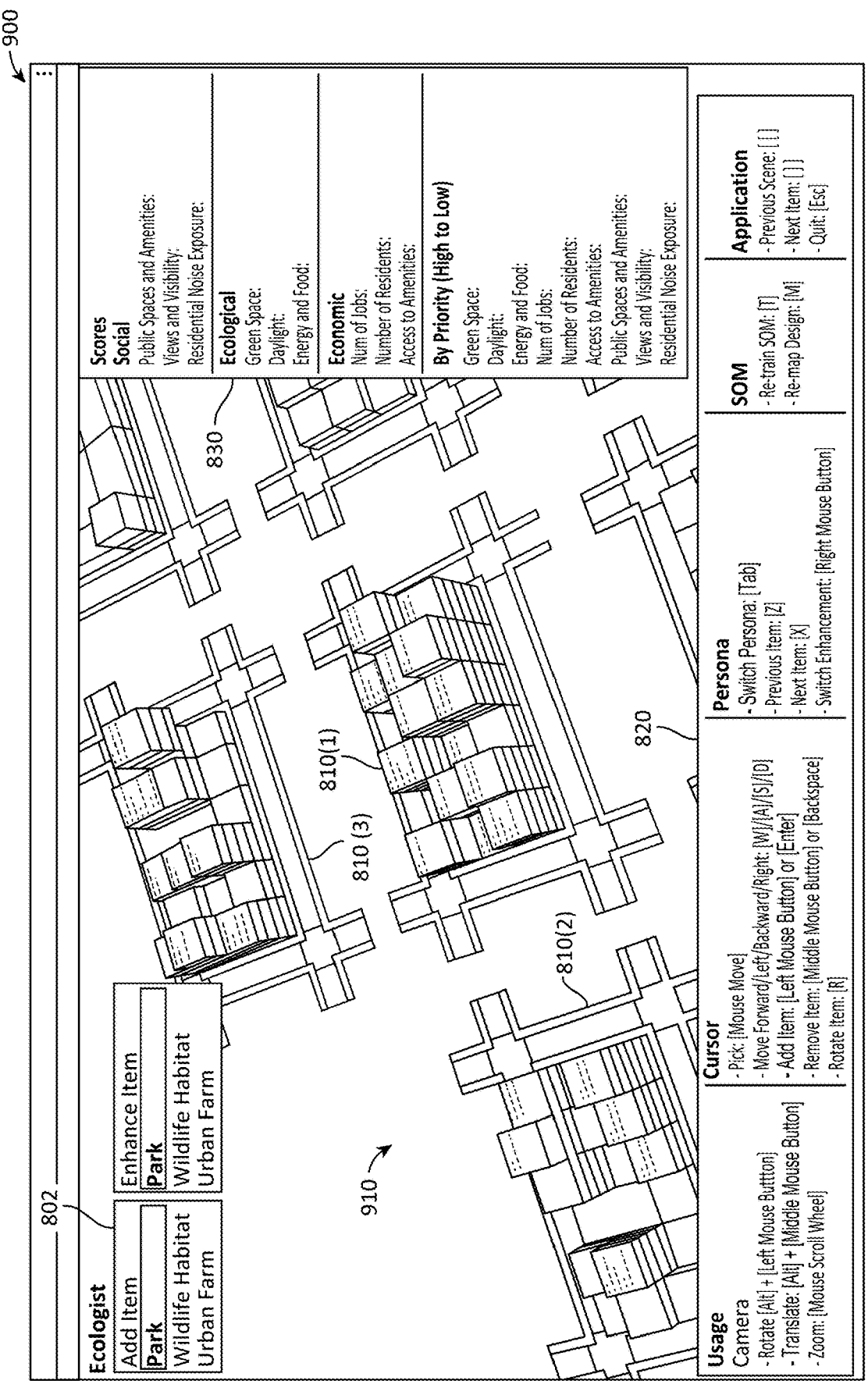
FIG. 9 illustrates an example user screen of a matrix of candidate design solutions generated by the workstation of FIG. 1, according to various embodiments.

FIG. 9 illustrates an example user screen 900 of a matrix of candidate design solutions generated by the workstation of FIG. 1, according to various embodiments. As shown, the user screen 900 includes the block item menu 802, a matrix 910 of the city grids 810, the participant action panel 820, and the scoring panel 830.

In operation, a participant can zoom out of the user screen 800 to see a portion of a matrix 910 that includes a subset of the candidate design solutions (represented by separate city grids 810(1), 810(2), 810(3), etc.) generated by the PCG engine 402. In various embodiments, the participant can use various navigation controls to navigate between individual city grids 810. In such instances, the generative design application 110 can cause the scoring panel 830 to update the metric values to reflect the computed metrics for the particular city grid that is the main focus of the matrix 910.

Figure 10:
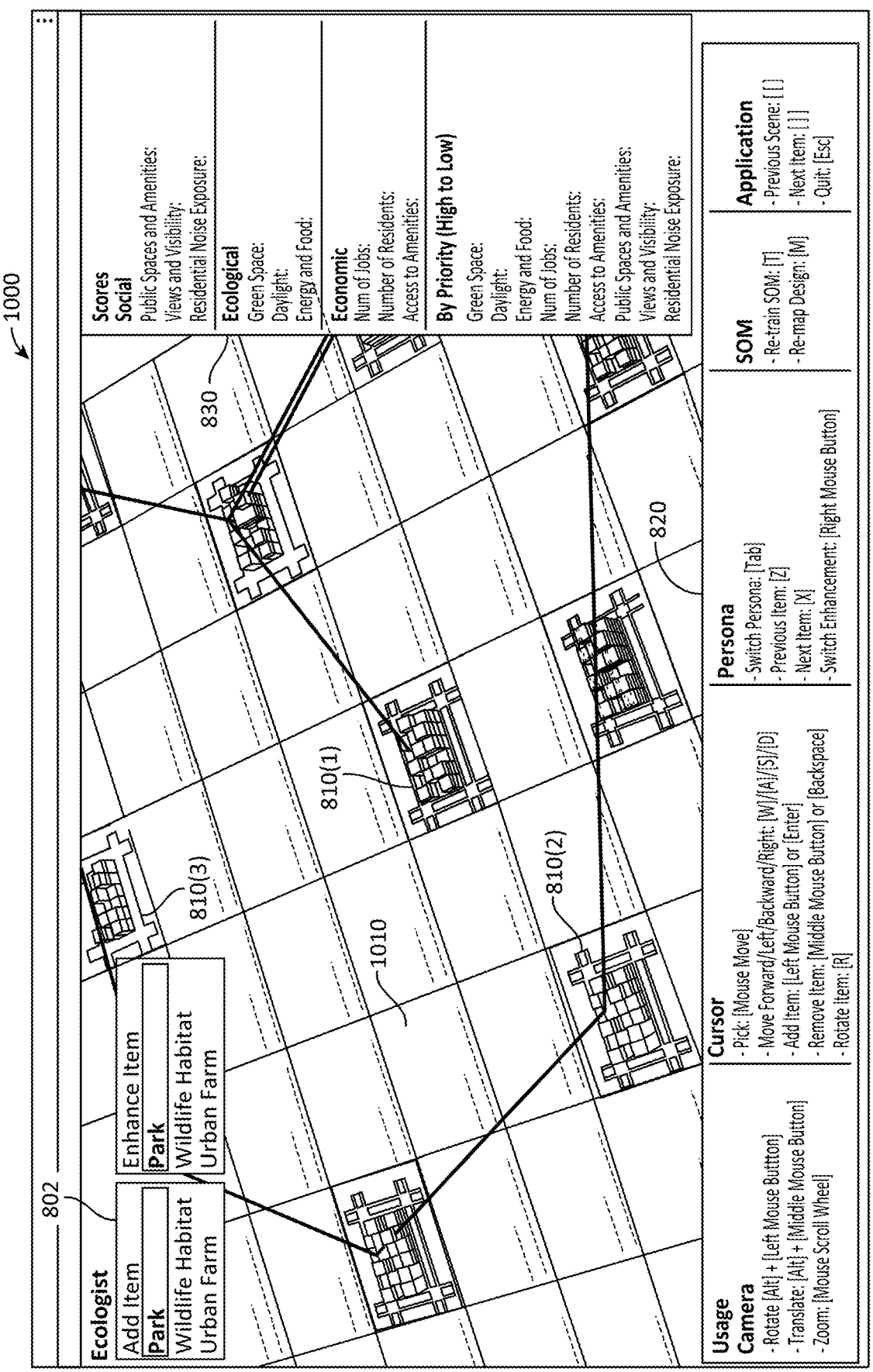
FIG. 10 illustrates an example user screen of a self-organized map of candidate design solutions generated by the workstation of FIG. 1, according to various embodiments.

FIG. 10 illustrates an example user screen of a self-organized map of candidate design solutions generated by the workstation of FIG. 1, according to various embodiments. As shown, the user screen 1000 includes the block item menu 802, a self-organized map 1010 of city grids 810, the participant action panel 820, and the scoring panel 830.

In operation, the participant can zoom out from the matrix 910 to view a self-organized map 1010. In some embodiments, the self-organized map 1010 can organize the respective city grids 810 along one or more axes based on characteristics associated with each of the respective city grids 810. For example, the city grids 810 can be organized along a first axis based on an amount of green space. In some embodiments, the self-organized map 1010 can assign city grids 810 to adjacent positions based on each of a set of characteristics.

In some embodiments, each position may be colored based on an aggregation of the features of the shared design models 120 located at the position within the self-organized map 1010. For example, each city grid 810 located within one quadrant may be colored similarly based on similar performance scores based on one or more characteristics. Alternatively, some embodiments, each square may be colored based on a third characteristic (e.g., number of residents). A participant can navigate within the self-organized map 1010 in order to view the relative characteristics of the candidate design solutions that the PCG engine 402 and/or the optimizer 406 created.

Figure 11:
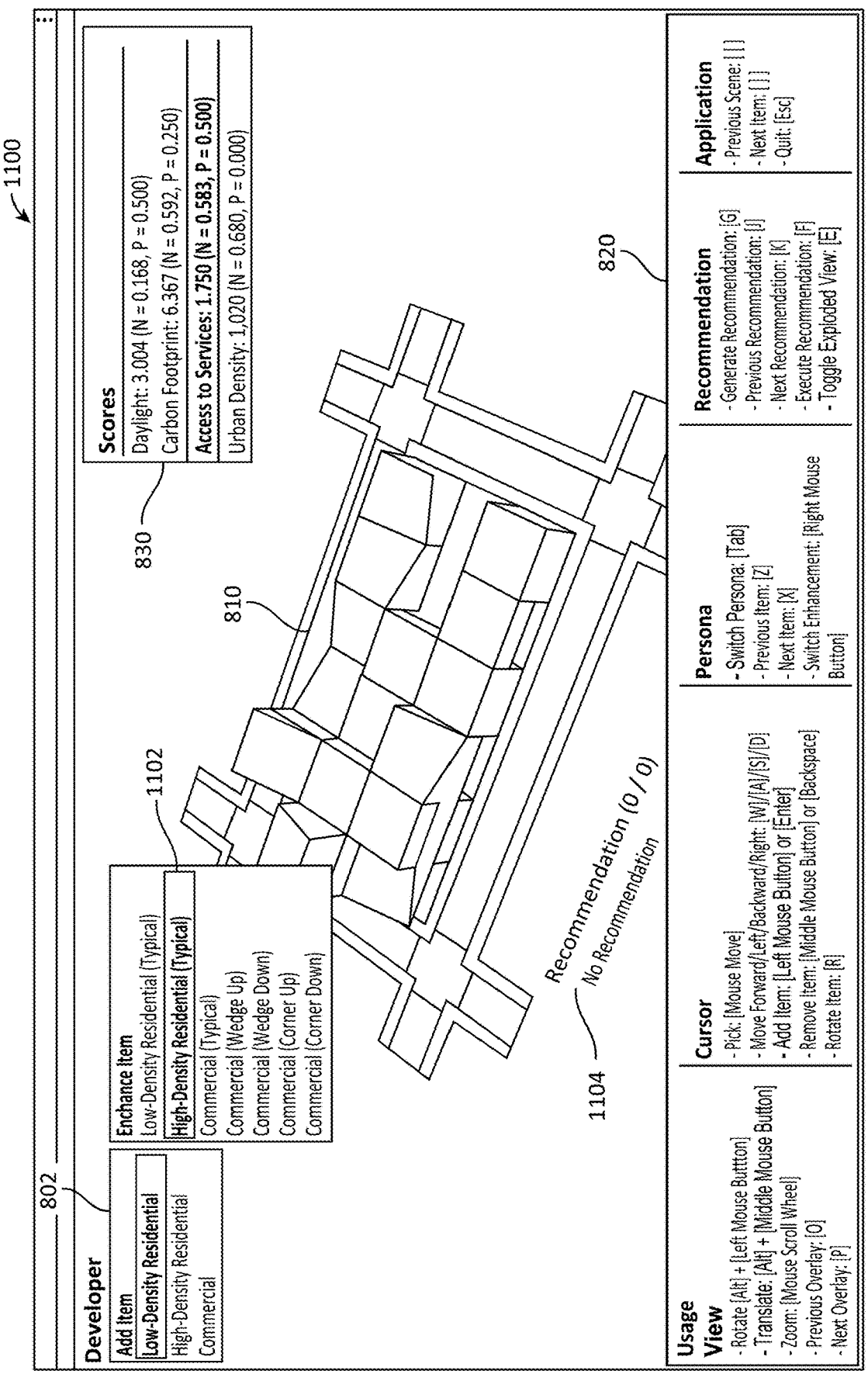
FIG. 11 illustrates an example user screen for a visualization of the block item editor enhancing a block within the shared design space generated by the workstation of FIG. 1, according to various embodiments.

FIG. 11 illustrates an example user screen 1100 for a visualization of the design model editor 114 enhancing a shared design model 120 within the shared design space 130 generated by the workstation instance 102 of FIG. 1, according to various embodiments. As shown, and without limitation, the example user screen 1100 includes block item menu 802, the city grid 810, the participant action panel 820, the scoring panel 830, an enhance block item menu 1102, and a recommendation 1104.

In operation, the recommender 420 included in the generative design application 110 can compare the shared design model 120 to one or more candidate design solutions, such as an optimized candidate design solution that the optimizer 406 generated. In some embodiments, the recommender 420 can employ a neural network that maps the shared design model 120 to the optimized design solution solutions and selects a specific optimized design solution based on the mappings. In such instances, the recommender 420 can provide a recommendation 1104 in order to increase the performance score associated with the shared design model 120.

Additionally or alternatively, the participant can select a specific enhancement block item from the enhance block item menu 1102. The enhancement block item enhances an existing block of a different type on the shared design model 120 in order to increase the performance of the existing block. For example, a developer persona can select an urban farm block item by enhancing the urban farm block item to further include a research center. In some embodiments, use of an enhancement block item decreases the number of available blocks. Alternatively, use of enhancement block items does not decrease the number of available blocks. Participants can use the enhancement block items to increase the overall performance score of the shared block item 120 as well as increasing the collaboration score with respect to another persona (e.g., the developer enhancing an education campus block item to increase the city planner-developer collaboration score).

Techniques for Generating a Shared Design Model

Figure 12:
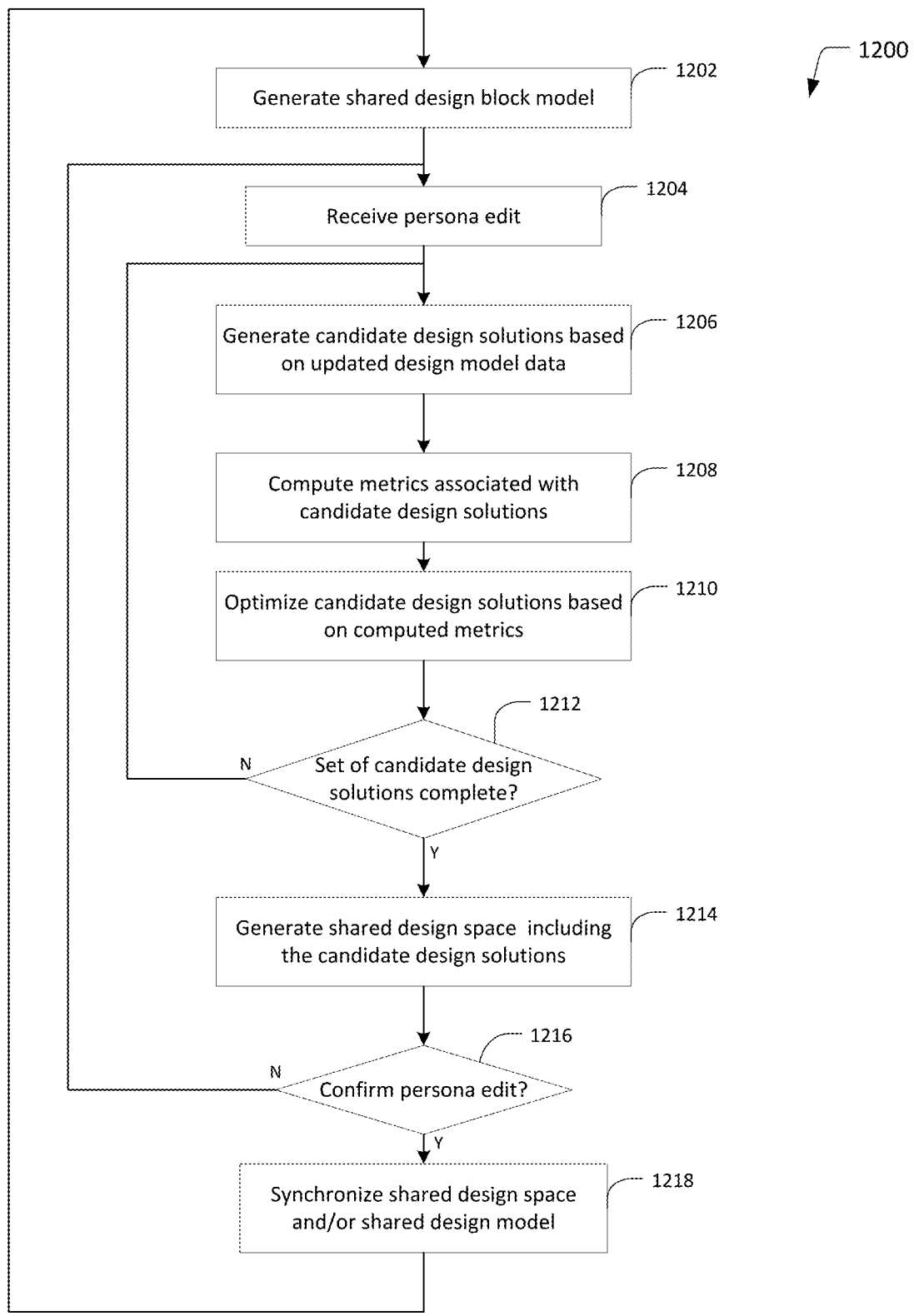
FIG. 12 sets forth a flow diagram of method steps for modifying a shared design model, according to various embodiments.

FIG. 12 sets forth a flow diagram of method steps for modifying a shared design model, according to various embodiments. Although the method steps are described with reference to the systems of FIGS. 1-11, persons skilled in the art will understand that any system configured to implement the method steps, in any order, falls within the scope of the disclosed embodiments.

As shown, a method 1200 begins at step 1202, where the generative design application 110 generates a shared design model 120. In various embodiments, the generative design application 110 within a given workstation instance 102 (e.g., the generative design application 110(2) included in the workstation instance 102(2)) can receive a shared design model 120 as part of a synchronization technique performed by the synchronization module 108. In such instances, the generative design application 110 can generate the shared design model 120 by updating a local instance of the shared design model 120 (e.g., the shared design model 120(2)) to reflect the shared design model 120(4) received from the synchronization module 108. Additionally or alternatively, the generative design application 110 can generate a new instance of the shared design model 120 at the initiation of a real-time collaboration session between two or more participants.

At step 1204, the generative design application 110 receives one or more persona edits 410 to the shared design model 120. In various embodiments, the user interface 140 included in the workstation instance 102 can provide a shared design space 130 that includes the shared design model 120. The generative design application 110 includes a design model editor 114 that receives one or more inputs representing edits made by a user. In various embodiments, the design model editor 114 can enable the user to perform a subset of inputs based on a persona associated with the project, where a user acting under a given persona has a specific set of capabilities, such as the ability to add, modify, enhance, and/or remove persona-specific block items. Based on the persona the user is employing, the user generates a set of persona edits 410 to modify the shared design model 120.

At step 1206, the generative design application 110 generates one or more candidate design solutions based on updated design model data. In various embodiments, upon receiving the persona edits 410, the user interface 140 transmits the persona edits 410 to the design model editor 114 to modify the shared design model 120 with the persona edits 410, generating a modified shared design model 120 that is represented by a set of design model data that the design model editor 114 transmits to the PCG engine 402. The PCG engine 402 uses the set of design model data corresponding to the modified shared design model 120 as a seed to generate a set of candidate design solutions. In such instances, the PCG engine 402 treats the set of design model data as a design problem and the PCG engine 402 performs a series of generative designs in real-time in response to the set of design model data. For example, the PCG engine 402 can generate thousands of different candidate design solutions from the same set of design model data received from the design model editor 114.

At step 1208, the generative design application 110 computes, for each candidate design solution, a set of metrics. In various embodiments, for each candidate design solution that the PCG engine 402 generates, the design model evaluator 404 included in the generative design application 110 computes a set of metrics in order to compute an overall performance score for a given candidate design solution. For example, when generating designs for an urban development project, the design model evaluator 404 can compute a set of social metrics, a set of ecological metrics, and/or a set of economic metrics associated with a candidate design solution that the PCG engine 402 generates. In some embodiments, the design model evaluator 404 can compute one or more collaboration scores that measure how well different pairs of participants have optimized the shared design model 120 in collaboration in order to enhance the collective goals of the group. In such instances, the design model evaluator 404 can combine separate collaboration scores (e.g., separate collaboration scores between the persona 1 & persona 2, persona 2 & persona 3, and persona 3 & persona 1, respectively) to compute an overall collaboration score.

At step 1210, the generative design application 110 optimizes one or more candidate design solutions based on the set of metrics. In various embodiments, an optimizer 406 included in the generative design application 110 can perform various optimization techniques to modify one or more candidate design solutions generated by the PCG engine 402 in order to optimize the performance metrics of a given candidate design solution. In various embodiments, the optimizer 406 can modify one or more aspects of a candidate design solution generated by the PCG engine 402 and evaluated by the design model evaluator 404 in order to maximize or minimize specific metrics associated with the shared design model 120. For example, the optimizer 406 can move a residential block item to a different position in a given candidate design solution in order to maximize the amount of light received by the shared design model 120 as a whole. Additionally or alternatively, the optimizer 406 can perform the optimization techniques in real time as the PCG engine 402 generates candidate design solutions in real time.

At step 1212, the generative design application 110 determines whether the set of candidate design solutions is complete. In various embodiments, the PCG engine 402 can iteratively generate a large set of candidate design solutions based on the set of design model data provided by the design model editor 114. In such instances, the generative design application 110 can determine whether the PCG engine 402 has completed its generation of all the candidate design solutions. When the generative design application 110 determines that the set of candidate design solutions is complete, the generative design application 110 proceeds to step 1214. Otherwise, the generative design application 110 determines that the set of candidate design solutions is not complete and returns to step 1206 to perform another iteration.

At step 1214, the generative design application 110 generates an updated shared design space 130 that includes the set of candidate design solutions. In various embodiments, a visualization module 116 included in the generative design application 110 displays the shared design space 130 that includes the shared design model 120. In various embodiments, the PCG engine 402 and/or the evaluation module 112 add candidate design solutions and/or optimized candidate design solutions to the self-organized map (SOM) 408 and/or the design history module 412. In such instances, the visualization module 116 can use the design history module 412 to maintain a design history that is locally stored in the database 320. Additionally or alternatively, the visualization module 116 provides controls to the user interface 140 that enable the user to navigate between individual candidate design models and/or previous candidate design models from the design history within the shared design space 130. In such instances, the user can navigate the shared design space 130 in order to see how changes to the shared design model 120 over time by the respective personas has modified the performance of the shared design model 120.

The visualization module 116 maintains one or more self-organized maps 408 that visually represent the candidate design solutions generated by the PCG engine 402 and/or the optimizer 406. In such instances, the user can use the user interface 140 to navigate within one or more of the self-organized maps 408, where a given self-organized map 408 visually represents the shared design space 130. In some embodiments, the PCG engine 402 and/or the optimizer 406 adds the candidate design solutions to the shared design space 130 via the self-organized map 408. Alternatively, in other embodiments, the PCG engine 402 and/or the optimizer 406 add candidate design solutions directly to the shared design space 130 and the visualization module 116 generates one or more self-organized maps 408 from the shared design space 130.

At step 1216, the generative design application 110 determines whether the user has confirmed the one or more persona edits 410. In various embodiments, upon viewing the updated shared design space 130, the user can confirm the persona edits 410 that the user made to the shared design model 120. When the generative design application 110 determines that the user confirmed the persona edits, the generative design application 110 proceeds to step 1218. Otherwise, the generative design application 110 determines that the user rejected the persona edits 410 and returns to step 1204 to receive additional personal edits 410.

At step 1218, the generative design application 110 synchronizes the modified shared design model 120 and/or the shared design space 130 with other participants. In various embodiments, the generative design application 110 can cause the shared design model 120 to be modified to reflect the persona edits 410. Upon updating the shared design model 120 and/or the shared design space 130, the generative design application 110 can transmit the modified shared design model 120 and/or the shared design space 130 to the synchronization module 108. In such instances, the synchronization module 108 can update the local instances of the shared design model 120 and/or the shared design space 130 and broadcast the updates to the other participants.

Figure 13:
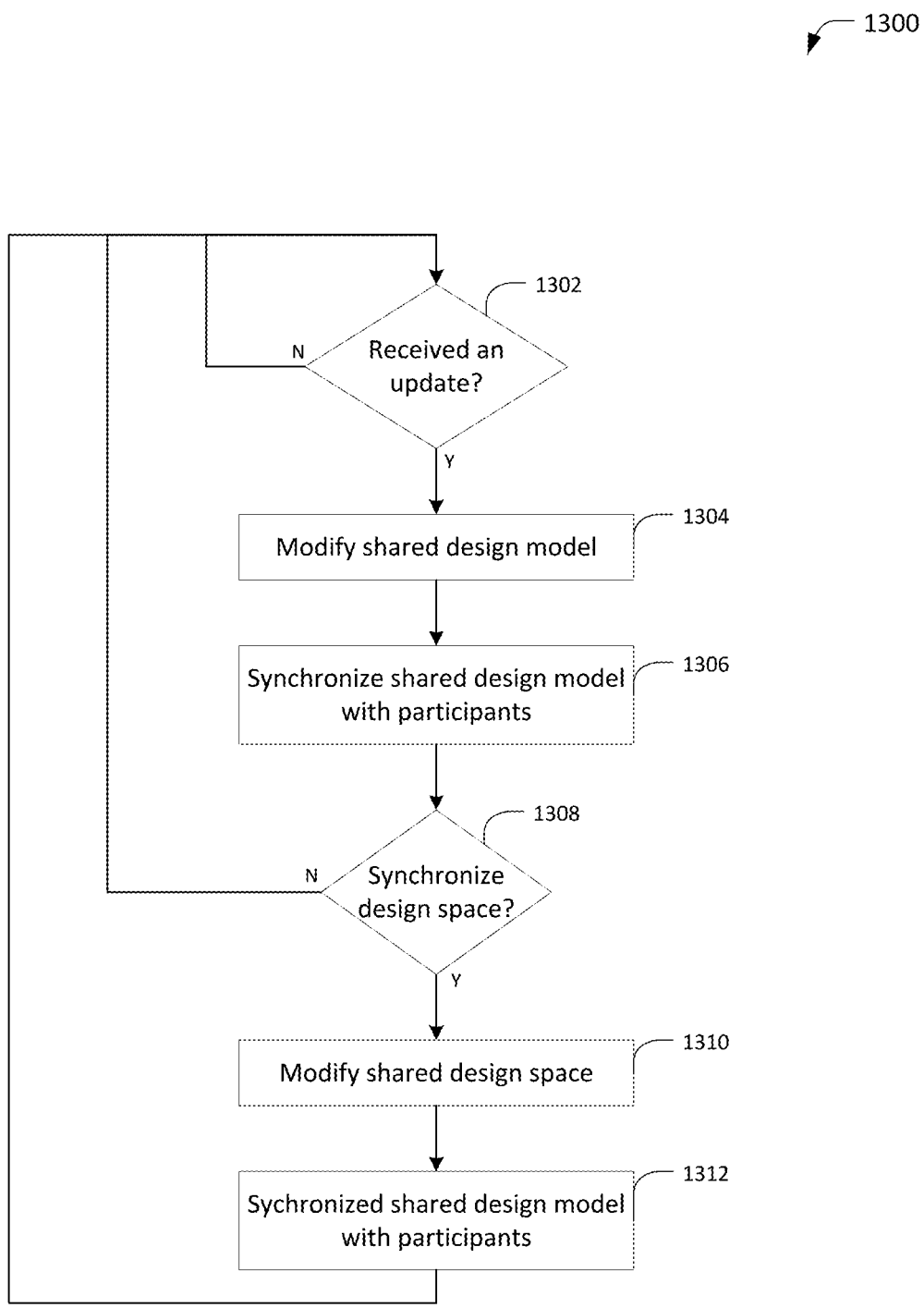
FIG. 13 sets forth a flow diagram of method steps for synchronizing a shared design model between multiple workstations, according to various embodiments.

FIG. 13 sets forth a flow diagram of method steps for synchronizing a shared design model between multiple workstations, according to various embodiments. Although the method steps are described with reference to the systems of FIGS. 1-11, persons skilled in the art will understand that any system configured to implement the method steps, in any order, falls within the scope of the disclosed embodiments.

As shown, a method 1300 begins at step 1302, where the shared compute instance 104 determines whether an update was received. In various embodiments, the synchronization module 108 determines whether one or more of the workstation instances 102 has transmitted an update to the shared design model 120 and the shared design space 130. When the synchronization module 108 that the shared compute instance 104 received an update, the synchronization module 108 proceeds to step 1304. Otherwise, the synchronization module 108 determines that the shared compute instance 104 did not receive an update to the shared design model 120 and proceeds to step 1304.

At step 1304, the shared compute instance 104 updates the shared design model 120. In various embodiments, the synchronization module 108 can cause the shared compute instance 104 to update a local instance of the shared design model 120 (e.g., the shared design model 120(4)). In such instances, the local instance 120(4) can serve as a source of truth during the real-time collaboration session. Additionally or alternatively, the synchronization module 108 can receive overlapping updates. For example, the synchronization module 108 can receive updates from the workstation instances 102(2), 102(3) before synchronizing the shared design model 120. In such instances, the synchronization module 108 can perform both updates to the shared design model 120. Alternatively, the synchronization module 108 can perform only one of the updates. For example, if two participants attempt to place a block item at the same location, the synchronization module 108 can update the shared design model 120 with the first update and refrain from placing the second block item in a different location.

At step 1306, the synchronization module 108 synchronizes the shared design model 120 with the participants in the real-time collaboration session. In various embodiments, the synchronization module 108 can synchronize the instances of the shared design model 120 for participants in the real-time collaboration session by broadcasting the update to each participant. In some embodiments, the synchronization module 108 can perform the synchronization by broadcasting the local instance 120(4) of the shared design model 120. Alternatively, in some embodiments, the synchronization module 108 may forward the update data received from one participant to the other participants. In such instances, the respective generative design applications 110 can separately update the respective instances of the shared design model 120.

At step 1308, the synchronization module 108 determines whether to optionally synchronize the shared design space 130. In various embodiments, the synchronization module 108 can cause each of the respective generative design applications 110 to maintain a shared design space 130 that includes the shared design model 120 and one or more candidate design solutions that at least one instance of the PCG engine 402 and/or at least one instance of the optimizer 406 generated. When the synchronization module 108 determines to synchronize the shared design space 130, the synchronization module 108 proceeds to step 1310. Otherwise, the synchronization module 108 determines not to synchronize the shared design space 130 and returns to step 1302 to wait for an additional update.

At step 1310, the synchronization module 108 modifies the shared design space 130. In various embodiments, the synchronization module 108 can cause the shared compute instance 104 to update a local instance of the shared design space 130 (e.g., the shared design space 130(4)). In such instances, the local instance 130(4) can serve as a source of truth for the shared design space 130 during the real-time collaboration session.

At step 1312, the synchronization module 108 synchronizes the shared design space 130 with the participants in the real-time collaboration session. In various embodiments, the synchronization module 108 can synchronize the instances of the shared design space 130 for participants in the real-time collaboration session by broadcasting the update to each participant. In some embodiments, the synchronization module 108 can perform the synchronization by broadcasting the local instance 130(4) of the shared design space 130. Alternatively, in some embodiments, the synchronization module 108 may forward, to the other participants, the update data associated with the shared design space 130 that was received from one participant. In such instances, the respective generative design applications 110 can separately update the respective instances of the shared design space 130.

Voxel-Based Design Approach

In some embodiments, a voxel-based design approach enables the creating and modifying of a design model comprising a 3D grid of discrete voxels. The design system generates and stores a voxel data structure that represents the design model. The voxel data structure comprises a plurality of voxel-level entries, each voxel-level entry corresponding to a particular voxel within the design model/voxel grid. Each voxel-level entry comprises a plurality of data fields, including a 3D coordinates field, performance properties field, performance metrics field, a visual properties field, size field, and a voxel type field. The voxel data structure further comprises a design-level entry for storing design-level performance metrics for the overall design model.

The design system receives user modifications to the design model, and in response, modifies the voxel data structure to reflect the user modifications to the design model. The design system then renders a visualization of the updated design model based on the updated voxel data structure. In particular, the design system maps visual properties to corresponding graphic elements for each voxel in the updated design model. The design system can receive a user selection of a performance metric, and in response, renders and displays a heat map for the design model for the selected performance metric. In particular, the design system maps the value for the selected performance metric to a visual appearance for each voxel in the design model. The design system can generate a plurality of optimized design solutions that each improve (increases the performance of) at least one design-level performance metric of the design model. An optimized voxel data structure is generated and stored for each optimized design solution. A visualization of each optimized design solution is rendered and displayed based on the corresponding optimized voxel data structure.

Figure 14:
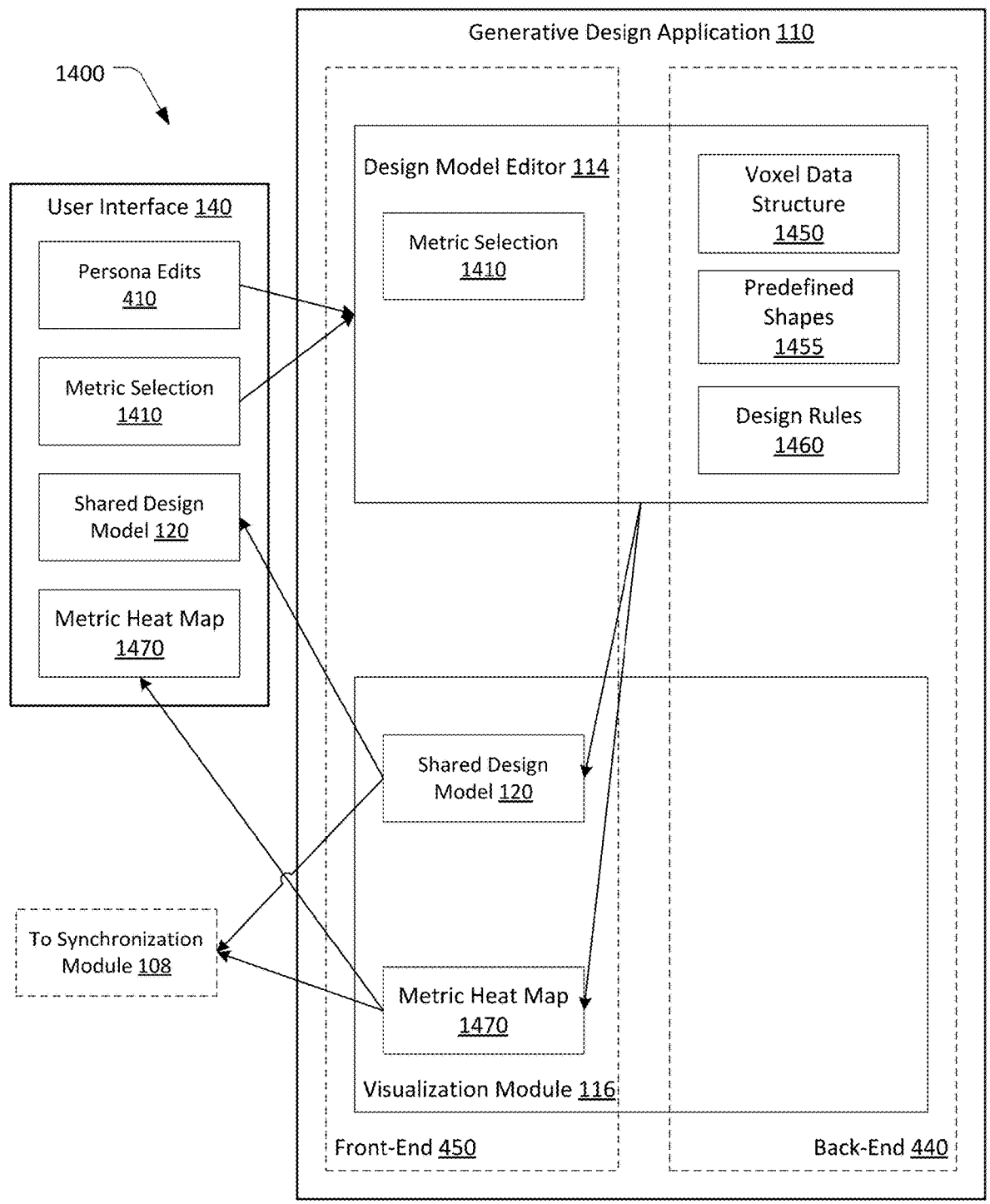
FIG. 14 is a diagram illustrating interactions between components of a workstation instance that implements a voxel-based design approach, according to various embodiments.

FIG. 14 is a diagram 1400 illustrating interactions between components of a workstation instance 102 that implements a voxel-based design approach, according to various embodiments. As shown, and without limitation, the diagram 1400 includes the generative design application 110 and the user interface 140. The generative design application 110 includes the design model editor 114 and the visualization module 116. The design model editor 114 includes a voxel data structure 1450, a set of predefined shapes 1455, and a set of design rules 1460. The visualization module 116 includes the shared design model 120 and a metric heat map 1470. The user interface 140 includes a set of persona edits 410, a metric selection 1410, the shared design model 120, and the metric heat map 1470. Various components of FIG. 14 are discussed above in relation to FIG. 4, and thus are not discussed in detail here.

In operation, the user interface 140 and the generative design application 110 execute various interaction loops to enable a user to edit the shared design model 120. The generative design application 110 includes a back-end 440 that provides a voxel data structure 1450 and a set of design rules 1460 that are implemented by the design model editor 114 to perform various functions described herein. For example, the design model editor 114 can implement the voxel data structure 1450 and the design rules 1460 to generate an updated shared design model 120 and at least one metric heat map 1470 that is provided to the user interface 140 via components in the front-end 450.

In some embodiments, the shared design model 120 includes a set of predefined, discrete, and individually selectable block items, each block item comprising a voxel. In these embodiments, the shared design model 120 comprises a plurality of voxels arranged in a voxel grid 700. In particular, the shared design model 120 comprises a voxel grid 700 comprising a discrete three-dimensional (3D) grid space of discrete voxels. FIG. 7 illustrates an example visualization 700 of a shared design model 120. In some embodiments, the visualization 700 of FIG. 7 comprises a voxel grid comprising a plurality of discrete 3D spaces (cubes) for containing a set of voxels. The voxel grid 700 includes x, y, and z axes comprising a first axis 710, a second axis 720, and a third axis 730, respectively. Each discrete cube space defined by the voxel grid 700 is uniquely identified by 3D coordinates (x, y, z coordinates) corresponding to the three axes that define the voxel grid 700. The 3D coordinates of a voxel added to the voxel grid 700 correspond to the 3D location/coordinates of the particular cube space within the voxel grid 700 that contains the added voxel. For example, the voxel grid 700 includes a first voxel 702 that is uniquely identified by a first set of 3D coordinates and a second voxel 704 that is uniquely identified by a second set of 3D coordinates. In this manner, each voxel in the voxel grid 700 can be specified by using only three discrete values (the three integer values specifying the 3D coordinates of the voxel within the voxel grid 700).

The set of voxels included in the voxel grid 700 represent inputs provided by users and edited via the respective design model editors 114. In operation, each persona can add and/or delete one or more voxels within the voxel grid 700 representing the shared design model 120. For example, a first persona can place the first voxel 702 corresponding to a predefined, selectable voxel of a first type. The second persona can add the second voxel 704 corresponding to a predefined, selectable voxel of a second type. The design model editor 114 receives one or more persona edits 410 that are associated with placing, modifying (e.g., enhancing), and/or removing block items 702, 704 from the voxel grid 700. The design model editor 114 generates and stores voxel information for each voxel included in the voxel grid 700 to the voxel data structure 1450. In some embodiments, the design model editor 114 and the visualization module 116 perform various functions associated with the shared design model 120 via the voxel data structure 1450 that represents the shared design model 120. In particular, the voxel data structure 1450 can represent a voxel grid 700 visualization of the shared design model 120.

FIG. 15 is a conceptual illustration of a voxel data structure 1450 included in the distributed computing system of FIG. 1, according to various embodiments. As shown, the voxel data structure 1450 comprises a plurality of entries 1501 (such as 1501a, 1501b, 1501c, etc.), each entry 1501 corresponding to a voxel included in the voxel grid 700. An entry 1501 for a particular voxel stores voxel-level information for the particular voxel in a plurality of data fields, including a coordinates field 1505. The coordinates field 1505 specifies a unique set of 3D coordinates associated with the 3D location of the particular voxel within the voxel grid 700.

The voxel grid 700 is defined by an overall 3D rectangular boundary (cuboid) comprising the ultimate largest size of the voxel grid 700. The overall size of the voxel grid 700 is measured as the total number of discrete 3D spaces (cubes) provided by the voxel grid 700 for containing the voxels. However, the number of voxels actually filling the 3D spaces of the voxel grid 700 will typically be much lower than the total number of 3D spaces provided by the voxel grid 700. Therefore, typically the voxel grid 700 contains is mostly empty (contains more empty 3D spaces than filled 3D spaces occupied with voxels). For example, the top boundary of the voxel grid 700 is typically far above most of the voxels in the voxel grid 700 to allow users to build tall structures in the shared design model 120, such as a high-rise building.

The voxel data structure 1450 represents the voxel grid 700. However, if the voxel data structure 1450 is implemented as a dense data structure (such as a 3D array) to represent the voxel grid 700, then most of the entries in the dense data structure would be empty, which reduces efficiency. In some embodiments, the voxel data structure 1450 comprises a sparse data structure that implements a dictionary of keys (associate array or map). In these embodiments, the voxel data structure 1450 contains/stores only entries 1501 corresponding to filled (non-empty) spaces in the voxel grid 700 that are occupied by a voxel. As such, the voxel data structure 1450 does not generate and store entries 1501 corresponding to empty spaces in the voxel grid 700 that are not occupied by a voxel. The 3D coordinates of a particular voxel in the voxel grid 700 comprises a key to locate and access the entry 1501 corresponding to the particular voxel in the voxel data structure 1450. As a result, the storage space required for the voxel data structure 1450 is made compact and efficient while also providing fast key access to individual entries 1501 for voxels via the corresponding 3D coordinates of the voxels in the voxel grid 700.

As shown, an entry 1501 for a particular voxel stores voxel-level information for the particular voxel in a plurality of data fields, including the coordinates field 1505, performance properties field 1510, a performance metrics field 1520, a visual properties field 1530, size field 1540, and a voxel type field 1550. The voxel type field 1550 specifies the type of voxel ("T1, T2, T3 . . . "), such as a road voxel (representing at least a portion of a road), a park voxel (representing at least a portion of a park), a garden voxel (representing at least a portion of a garden), a residential voxel (representing at least a portion of a residential building), a commercial voxel (representing at least a portion of a commercial building), and the like.

Each voxel type has an associated set of default performance properties that the design model editor 114 can use to automatically populate the performance properties field 1510. The performance properties field 1510 can specify values ("a, b, c . . . ") for various performance properties ("PP1, PP2, PP3 . . . "), such as values for the performance properties of carbon footprint (carbon output of the voxel), number of residents, number of jobs, service provider (being a service provider or not), blocking daylight (blocking daylight or not), and the like. For example, the park voxel can be associated with a first set of default values for the carbon footprint, number of residents, and number of jobs properties. In contrast, the residential voxel can be associated with a second set of default values for the carbon footprint, number of residents, and number of jobs properties, whereby the second set of default values is different from the first set of default values. However, the user can manually override any default values in the performance properties field 1510 that are automatically set by the design model editor 114 based on the voxel type 1550. Therefore, the corresponding performance properties specified in the performance properties field 1510 can be different for two voxels of the same voxel type.

The performance metrics field 1520 specifies values ("a, b, c . . . ") for various performance metrics ("PM1, PM2, PM3 . . . "), such as values for the performance metrics of carbon footprint, urban density, number of residents, number of jobs, service access, daylight amount, and the like. A performance metric in the performance metrics field 1520 can comprise a corresponding performance property in the performance properties field 1510 in the entry 1501 for the same voxel. For example, carbon footprint can comprise both a performance property in the performance properties field 1510 and a performance metric in the performance metrics field 1520 in the entry 1501 for the same voxel. For these types of performance metrics, the corresponding performance property in the performance properties field 1510 is copied to the performance metrics field 1520 in the entry 1501 for the voxel.

In other embodiments, a performance metric in the performance metrics field 1520 can be derived from one or more performance properties in the performance properties field 1510 in one or more entries 1501 for one or more voxels. In these embodiments, a performance property for one voxel can affect a performance metric for another voxel. A performance metric can be derived from one or more performance properties via a simulation or simpler calculation operations based on the one or more performance properties.

For example, the daylight amount metric for a voxel in the voxel grid 700 can be computed via a simulation based on a distribution of one or more neighboring or nearby daylight-blocking voxels in the voxel grid 700. The daylight amount metric for a voxel indicates the amount of daylight access at the position of the voxel based on the blocking daylight properties of nearby voxels within a threshold distance. Each voxel has an associated blocking daylight property indicating whether the voxel allows daylight to pass through the voxel in certain directions. In particular, the daylight amount metric in the performance metrics field 1520 in a first entry 1501 for a first voxel can be computed via a simulation that is based on the blocking daylight property in the performance properties field 1510 in one or more entries 1501 corresponding to one or more voxels that neighbor (are adjacent to) the first voxel or are nearby the first voxel within a threshold voxel distance in the voxel grid 700. The daylight amount metric (daylight access) for a voxel can be computed based on a spatial distribution of nearby daylight-blocking voxels using a simulation algorithm, such as raytracing in a discrete 3D grid.

As another example, the service access metric for a voxel in the voxel grid 700 can be computed as a weighted sum of the number of nearby service provider voxels in the voxel grid 700. In particular, the service access metric in the performance metrics field 1520 in a first entry 1501 for a first voxel can be computed based on the service provider property in the performance properties field 1510 in one or more entries 1501 corresponding to one or more voxels that neighbor (are adjacent to) the first voxel or are nearby the first voxel within a threshold voxel distance in the voxel grid 700. As another example, the urban density metric for a voxel in the voxel grid 700 can be computed as a sum of the number of residents property and the number of jobs property associated with the voxel.

The visual properties field 1530 in an entry 1501 for a particular voxel specifies visual properties that are used to render the particular voxel in a visualization of the shared design model 120. The visual properties field 1530 specifies values ("a, b, c . . . ") for various visual properties ("VP1, VP2, VP3 . . . "), such as values for color, shape, texture, material, surface, mesh, and the like. The color property specifies a color assigned to the particular voxel and the shape property specifies a predefined shape assigned to the particular voxel.

In some embodiments, the color property assigned to the particular voxel is automatically assigned by the design model editor 114 based on a persona of the user that added the particular voxel to the shared design model 120. For example, the color blue is assigned to voxels added by the Mayor persona, the color green is assigned to voxels added by the Ecologist persona, the color beige is assigned to voxels added by the Developer persona, and so forth. In other embodiments, the color property assigned to the particular voxel is automatically assigned by the design model editor 114 based on the voxel type of the particular voxel. For example, a first color can be assigned for a first voxel type, a second color can be assigned for a second voxel type, a third color can be assigned for a third voxel type, and so forth. In further embodiments, the color property assigned to the particular voxel is automatically assigned by the design model editor 114 based on both the persona of the user that added the particular voxel and the voxel type of the particular voxel. For example, the color hue (such as blue, green, beige) can be assigned to the particular voxel based on the persona of the user that added the particular voxel and variations in saturation and/or intensity assigned to the particular voxel is assigned based on the voxel type of the particular voxel.

The shape property specifies a predefined shape assigned to the particular voxel. In particular, the shape property can specify a shape identifier that uniquely identifies a particular predefined shape in a set of predefined shapes 1455. Each predefined shape in the set of predefined shapes 1455 comprises a 3D shape comprising continuous geometries. The predefined shape can comprise a simple/plain shape comprising simple 3D geometries, such as a box, truncated box, wedge, and the like. The predefined shape can also comprise a complex/detailed shape comprising complex 3D geometries, such as a set of columns, an office structure with windows, a support structure comprising a lattice of beams, and the like. The set of predefined shapes 1455 comprises a set of predefined selectable components and can include a plurality of plain shapes, a plurality of complex shapes, or a combination thereof.

In some embodiments, the design model editor 114 assigns a default shape to a voxel added to the shared design model 120 based on the shapes of one or more voxels surrounding/neighboring the added voxel in the shared design model 120. For example, for each possible shape that can be assigned to the added voxel, an edge compatibility between the possible shape and the one or more surrounding shapes is determined based on maximizing overall horizontal connectivity and reducing vertical shape combinations. The possible shape having the highest edge compatibility with the one or more neighboring shapes/voxels is then assigned to the added voxel. The rules/logic for selecting the default shape of a voxel can be included in the set of design rules 1460. However, the user can manually override the default shape assigned to a particular voxel. For example, the user can manually select a shape of a newly added voxel via a shape selector interface displayed in the user interface 140, whereby the corresponding shape identifier is added to the visual properties field 1530 in the entry 1501 for the voxel.

The size field 1540 specifies a real-world 3D size ("Sz") assigned to the voxel in real-world space. For example, the 3D size can be specified as (30m×30m×12m), which is used to translate a single voxel into meters in real-world space. In other embodiments, the size field 1540 specifies any 3D size in any suitable unit. In some embodiments, the size field 1540 specifies the same 3D size for every voxel in the voxel grid 700, whereby the size field 1540 in each entry 1501 of the voxel data structure 1450 is the same value.

Voxel-Based Visualizations of a Design Model

As discussed above, the shared design model 120 comprises an arrangement of predefined, individually selectable voxels of different types within a 3D voxel grid 700. During a real-time collaboration session including a plurality of users/participants, the design model editor 114 receives inputs (such as persona edits 410) from the users and modifies/updates the shared design model 120 by adding, modifying, and/or removing voxels of the shared design model 120 based on the received inputs. In addition, the design model editor 114 modifies/updates the voxel data structure 1450 that represents the shared design model 120 by adding, modifying, and/or removing entries 1501 of the voxel data structure 1450 based on the received inputs. The design model editor 114 also enforces a set of design rules 1460 during the real-time collaboration session to ensure that the shared design model 120 and the voxel data structure 1450 are updated based on only valid user inputs. Based on the updated voxel data structure 1450, the visualization module 116 can easily render a visualization of the updated shared design model 120 in real-time while requiring less processing time and resources relative to conventional rendering techniques.

For example, the design model editor 114 can receive persona edits 410 from a first user (having a first persona) for adding a first voxel of a first voxel type to the shared design model 120 at a first 3D location of the 3D voxel grid 700. In response, the design model editor 114 determines, based on the set of design rules 1460 as applied to the first persona, whether the received persona edits 410 are valid or not. If not, the design model editor 114 can discard/ignore the received persona edits 410. If the received persona edits 410 are valid, the design model editor 114 determines the 3D coordinates of the first 3D location and generates a new entry 1501 in the voxel data structure 1450.

The design model editor 114 then populates the data fields of the new entry 1501. In particular, the design model editor 114 specifies the 3D coordinates of the first 3D location in the coordinates field 1505, specifies a default set of performance properties associated with the first voxel type in the performance properties field 1510, specifies a default size in the size field 1540, and specifies the first voxel type in the voxel type field 1550. However, if the received persona edits 410 also includes one or more user-defined performance properties, the design model editor 114 specifies the one or more user-defined performance properties in the performance properties field 1510. The design model editor 114 also computes the performance metrics in the performance metrics field 1520 based on the performance properties specified in the performance properties field 1510. For the visual properties field 1530, the design model editor 114 can specify a color of the first voxel based on the first persona and/or the first voxel type. In addition, the design model editor 114 can specify a default shape (within the predefined shapes 1455) of the first voxel. However, if the received persona edits 410 also includes a user-selected shape, the design model editor 114 specifies the user-selected shape in the visual properties field 1530.

The design model editor 114 can also receive persona edits 410 from a second user (having a second persona) for modifying a second voxel of the shared design model 120 at a second 3D location of the 3D voxel grid 700. In response, the design model editor 114 determines, based on the set of design rules 1460 as applied to the second persona, whether the received persona edits 410 are valid or not. If not, the design model editor 114 can discard/ignore the received persona edits 410. If the received persona edits 410 are valid, the design model editor 114 determines the 3D coordinates of the second 3D location and uses the 3D coordinates as a key to accessing the corresponding entry 1501 in the voxel data structure 1450. In particular, the design model editor 114 retrieves the entry 1501 in the voxel data structure 1450 that specifies the 3D coordinates of the second 3D location in the coordinates field 1505.

The design model editor 114 then modifies the data fields of the retrieved entry 1501 based on the received persona edits 410. For example, the design model editor 114 can modify performance properties in the performance properties field 1510 based on one or more user-defined performance properties. If one or more performance properties in the performance properties field 1510 are modified, the design model editor 114 is also triggered to modify (re-compute) one or more performance metrics in the performance metrics field 1520 that are each affected by the modifications to the one or more performance properties. For the visual properties field 1530, the design model editor 114 can modify a color of the second voxel based on the second persona of the second user. In addition, the design model editor 114 can modify a shape assigned to the second voxel based on a user-selected shape specified in the received persona edits 410.

The design model editor 114 can also receive persona edits 410 from a third user (having a third persona) for removing a third voxel of the shared design model 120 at a third 3D location of the 3D voxel grid 700. In response, the design model editor 114 determines, based on the set of design rules 1460 as applied to the third persona, whether the received persona edits 410 are valid or not. If not, the design model editor 114 can discard/ignore the received persona edits 410. If the received persona edits 410 are valid, the design model editor 114 determines the 3D coordinates of the third 3D location and uses the 3D coordinates as a key to accessing the corresponding entry 1501 in the voxel data structure 1450. In particular, the design model editor 114 identifies the entry 1501 in the voxel data structure 1450 that specifies the 3D coordinates of the third 3D location in the coordinates field 1505. The design model editor 114 then deletes the identified entry 1501 from the voxel data structure 1450.

The design model editor 114 enforces a set of design rules 1460 during the real-time collaboration session to ensure that the shared design model 120 and the voxel data structure 1450 are updated based on only valid user inputs (valid persona edits 410). The set of design rules 1460 can be manually input by the designers of the generative design application 110 to restrict user operations and/or commands (generated by the optimizer 406) on a global level across all voxels of the shared design model 120.

In some embodiments, the set of design rules 1460 are applied based on the type of persona of the user that inputs the persona edits 410. In these embodiments, the set of design rules 1460 include different subsets of design rules for different personas. For example, a first subset of design rules apply to a first persona and a second subset of design rules apply to a second persona, the second subset of design rules being different than the first subset of design rules. In this manner, the design model editor 114 can restrict some user operations on the shared design model 120 based on the personas of the users. Each persona has a different set of capabilities in regards to operations that can be performed on the shared design model 120, such as the ability to make a subset of inputs for adding, modifying, and/or removing particular types of voxels. For each persona, the design rules 1460 can specify the type of voxels that the persona can add, modify, and/or remove.

For example, the design rules 1460 can specify that only the ecologist persona can select and place an urban park voxel within the shared design model 120. In such instances, only the user operating the ecologist persona can remove the urban park voxel from the shared design model 120. Further, the design rules 1460 can specify that only a specific persona can make specific enhancements to existing voxels. For example, only a user operating under the city planner persona can enhance an existing ecologist-type voxel by enhancing the existing voxel to include an algae production area. Similarly, only a user operating under the city planner persona can enhance an existing developer voxel by causing the existing developer voxel to further include solar roofs.

In some embodiments, the set of design rules 1460 include other design rules that are applied to all users and personas (are applied regardless of the type of persona). For example, the set of design rules 1460 can include a set of aggregation rules that specify how new voxels can be validly added to the shared design model 120 based on the locations of the new voxels in relation to the locations of the current voxels in the shared design model 120. For example, the set of aggregation rules can specify that a new voxel can be placed adjacent to a side of a current voxel only if the new voxel is the same type of voxel as the current voxel. As another example, the set of aggregation rules can specify that a new voxel can be attached diagonally to a first current voxel only if there is a second current voxel below the first current voxel.

As discussed above, as the design model editor 114 receives persona edits 410 from the users, the design model editor 114 modifies/updates the voxel data structure 1450 based on the received persona edits 410. As shown in FIG. 14, in response to updating the voxel data structure 1450, the design model editor 114 triggers the visualization module 116 to generate/render a visualization of the updated shared design model 120 based on the updated voxel data structure 1450. Advantageously, the visualization module 116 can easily render a visualization of the updated shared design model 120 in real-time based on the updated voxel data structure 1450, while requiring less processing time and resources relative to conventional rendering techniques. In particular, the visualization module 116 can render a visualization of the updated shared design model 120 via simple mapping operations applied to the visual properties of discrete voxels specified in the visual properties field 1530 of the updated voxel data structure 1450. Such mapping operations render each voxel at the corresponding location of the voxel the 3D voxel grid. Advantageously, such mapping operations for visual properties of discrete voxels requires significantly less processing time and resources relative to conventional rendering techniques that rely on continuous geometry-based rendering of design models.

When rendering the visualization of the updated shared design model 120, the visualization module 116 maps visual properties associated with voxels to corresponding graphic elements. In particular, for each entry 1501 of a voxel in the updated voxel data structure 1450, the visual properties specified in the visual properties field 1530 are mapped to corresponding graphic elements to render the voxel at the 3D location of the voxel in the voxel grid 700. To illustrate, for rendering the voxel, the color property is mapped to a specified color assigned to the voxel, the shape property (shape identifier) is mapped to a specified predefined shape assigned to the voxel, the texture property is mapped to a specified texture, the mesh property is mapped to a specified mesh, and so forth. The mapped predefined shape can comprise a simple shape or complex shape that is retrieved from the set of predefined shapes 1455.

Figure 16:
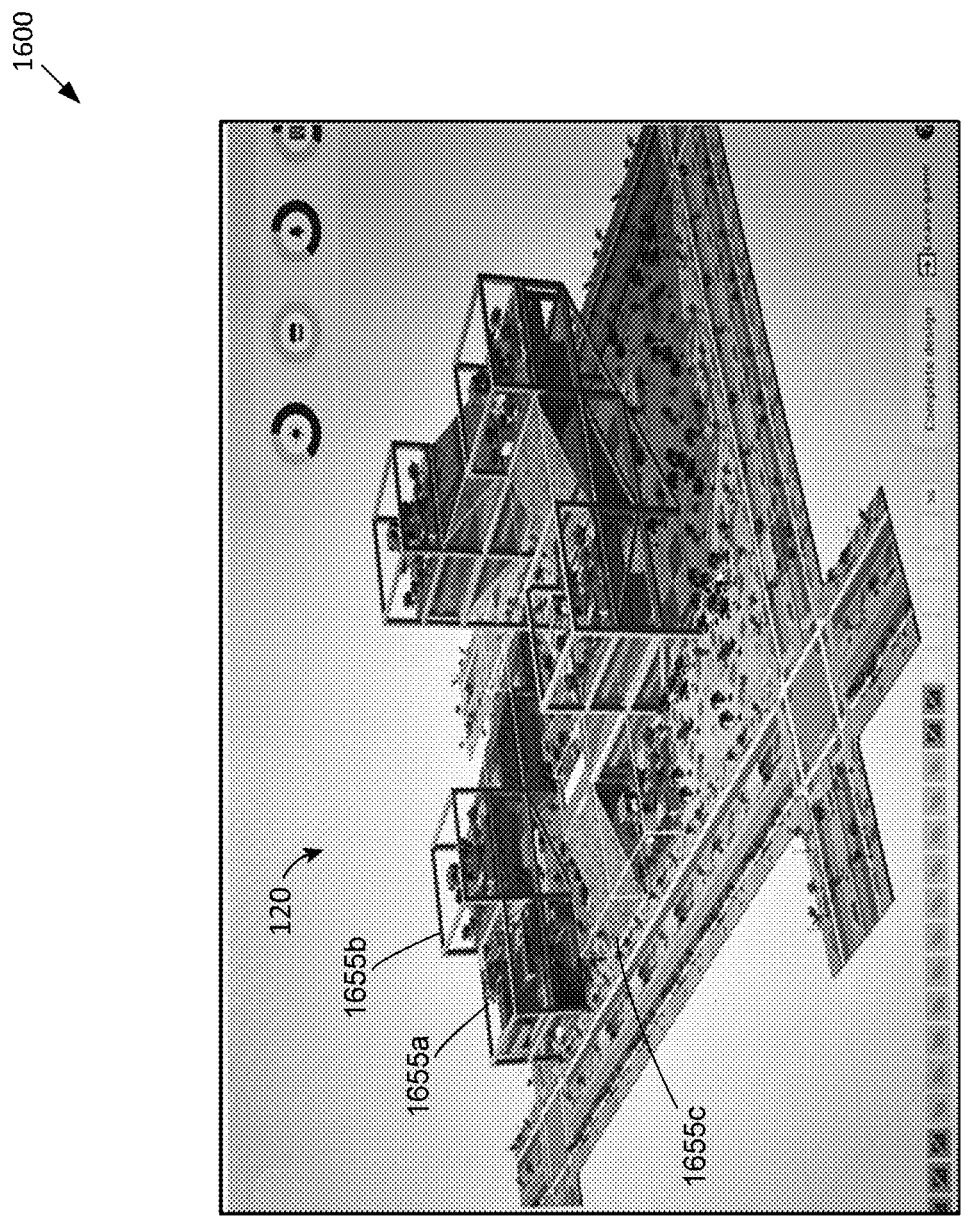
FIG. 16 illustrates a visualization of the updated shared design model of FIG. 14 using complex shapes, according to various embodiments.
Figure 17:
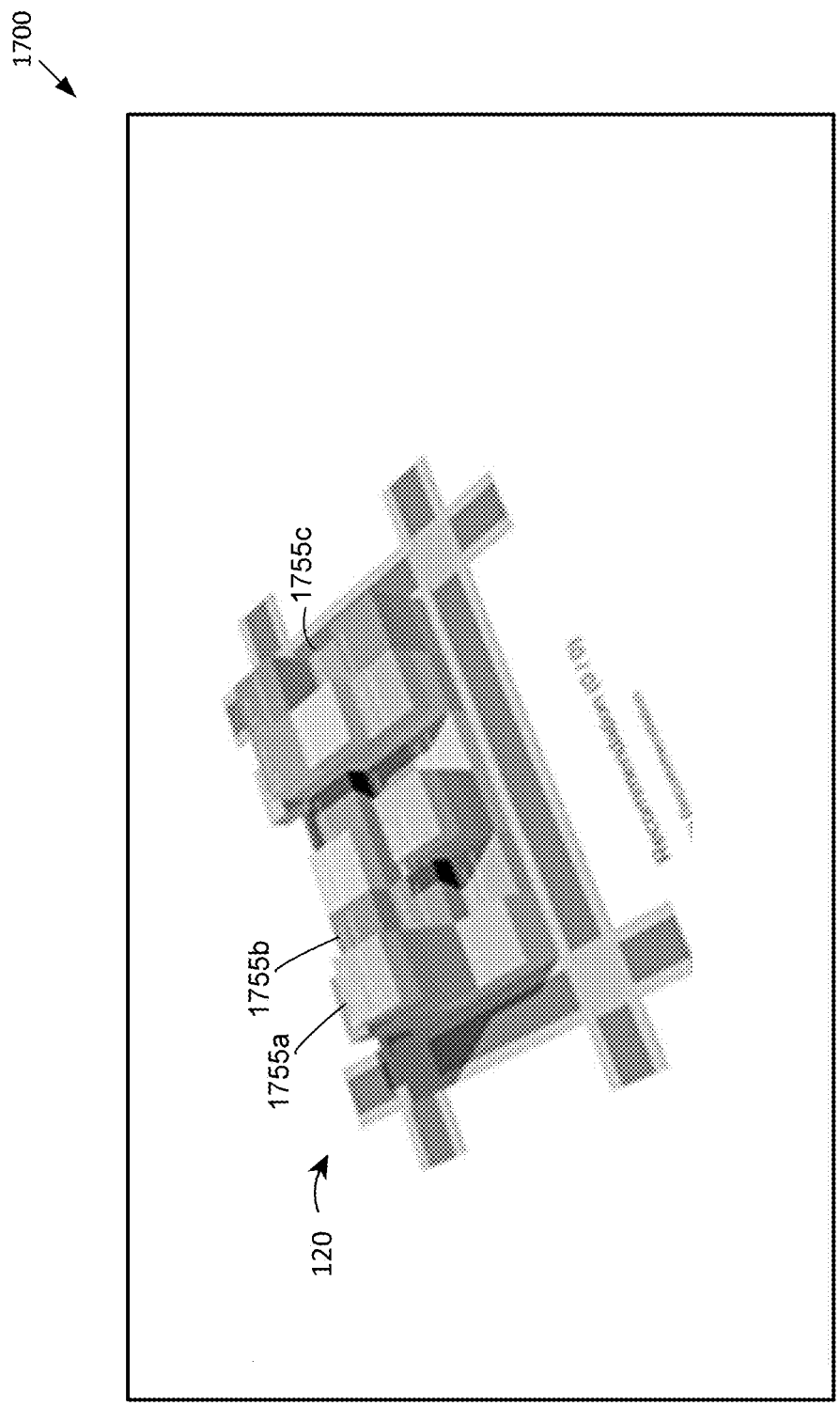
FIG. 17 illustrates a visualization of the updated shared design model of FIG. 14 using complex shapes, according to other various embodiments.

FIG. 16 illustrates a visualization 1600 of the updated shared design model 120 of FIG. 14 using complex shapes, according to various embodiments. As shown, the updated shared design model 120 comprises a plurality of voxels that have been mapped to a plurality of complex shapes 1655 (such as 1655a, 1655b, 1655c, etc.). FIG. 17 illustrates a visualization 1700 of the updated shared design model 120 of FIG. 14 using complex shapes, according to various embodiments. As shown, the updated shared design model 120 comprises a plurality of voxels that have been mapped to a plurality of simple shapes 1755 (such as 1755a, 1755b, 1755c, etc.). Although the simple shapes 1755 shown in the example of FIG. 17 comprise box shapes, in other embodiments, the simple shapes 1755 can comprise various simple shapes (such as wedges and truncated boxes). As shown, the voxels/shapes 1755 can have different colors that correspond to different personas and/or voxel types. For example, the color blue is assigned to voxels/shapes 1755 added by the Mayor persona, the color green is assigned to voxels/shapes 1755 added by the Ecologist persona, and so forth.

Rendering of the visualization of the shared design model 120 converts the shared design model 120 from a discrete grid space (voxel grid 700) to a continuous world space. In particular, each predefined shape in the set of predefined shapes comprises a 3D shape comprising continuous geometries. Therefore, the visualization of the shared design model 120 includes shapes having continuous 3D geometries. In this regard, the voxel grid 700 includes an origin, which is defined in the world space. In addition, the world-space size of each voxel (such as 30m×30m×12m) is specified by the size field 1540 in the updated voxel data structure 1450, which is used to translate the size of the voxel into world space. The origin of the voxel grid 700 and the size of each voxel together make it possible to map the grid-space coordinates of a voxel into world-space coordinates.

The visualization of the updated shared design model 120 is then displayed to the user via the user interface 140. The synchronization module 108 receives and broadcasts the updated shared design model 120 to one or more devices operating the one or more generative design applications 110. In particular, the synchronization module 108 can receive data associated with actions performed by a user and synchronize the updated shared design model 120 to reflect the changes made by the user. In some embodiments, the synchronization module 108 can maintain a local instance of the updated shared design model 120 in the shared compute instance 104. In such cases, the synchronization module 108 can synchronize the updated shared design model 120 by updating the local instance with data received from a given workstation instance 102 (e.g., data received from the workstation instance 102(1)) and can broadcast the updated local instance to the other workstation instances (e.g., 102(2), 102(3)) in order to have the other workstation instances update the local versions of the shared design model 120 to match and reflect the updates.

Heat Map Visualizations of a Design Model

In some embodiments, the visualization of a shared design model 120 comprises a visualization of a selected performance metric via a per-voxel heat map. In these embodiments, when the visualization of a shared design model 120 is rendered as discussed above, the visualization module 116 also retrieves values for the selected performance metric from the voxel data structure 1450 and renders the voxels of the shared design model 120 based on the values. The visualization module 116 can render each voxel independently and separately based on the value for the corresponding performance metric retrieved from the voxel data structure 1450.

In some embodiments, each performance metric is associated with a particular color. In these embodiments, each voxel in the heat map is rendered using the color associated with a selected performance metric, instead of the color associated with a persona or voxel type as discussed in other embodiments. For example, the carbon footprint metric can be associated with the color green, the daylight amount metric can be associated with the color yellow, and so forth. For a selected performance metric associated with a particular color, the visualization module 116 can determine a level of darkness, saturation, and/or intensity for the particular color to be assigned to each voxel in the shared design model 120 based on the value of the selected performance metric associated with the voxel in the voxel data structure 1450. In particular, the visualization module 116 can map different values of the selected performance metric to different levels of darkness, saturation, and/or intensity of the particular color to visually indicate the values of the selected performance metric. For example, the visualization module 116 can map lower values of the selected performance metric to lower levels of darkness, saturation, and/or intensity of the particular color and map higher values of the selected performance metric to higher levels of darkness, saturation, and/or intensity of the particular color and map. In other embodiments, the visualization module 116 can map higher values of the selected performance metric to lower levels of darkness, saturation, and/or intensity of the particular color and map lower values of the selected performance metric to higher levels of darkness, saturation, and/or intensity of the particular color and map. The set of mappings between metric values and darkness, saturation, and/or intensity values can be predefined for each particular performance metric, whereby the set of mappings can vary with different performance metrics. In this manner, the visualization module 116 can generate a per-voxel heat map visualization of the shared design model 120 that visually indicates different values of the selected performance metric for the different voxels of the shared design model 120.

Figure 18:
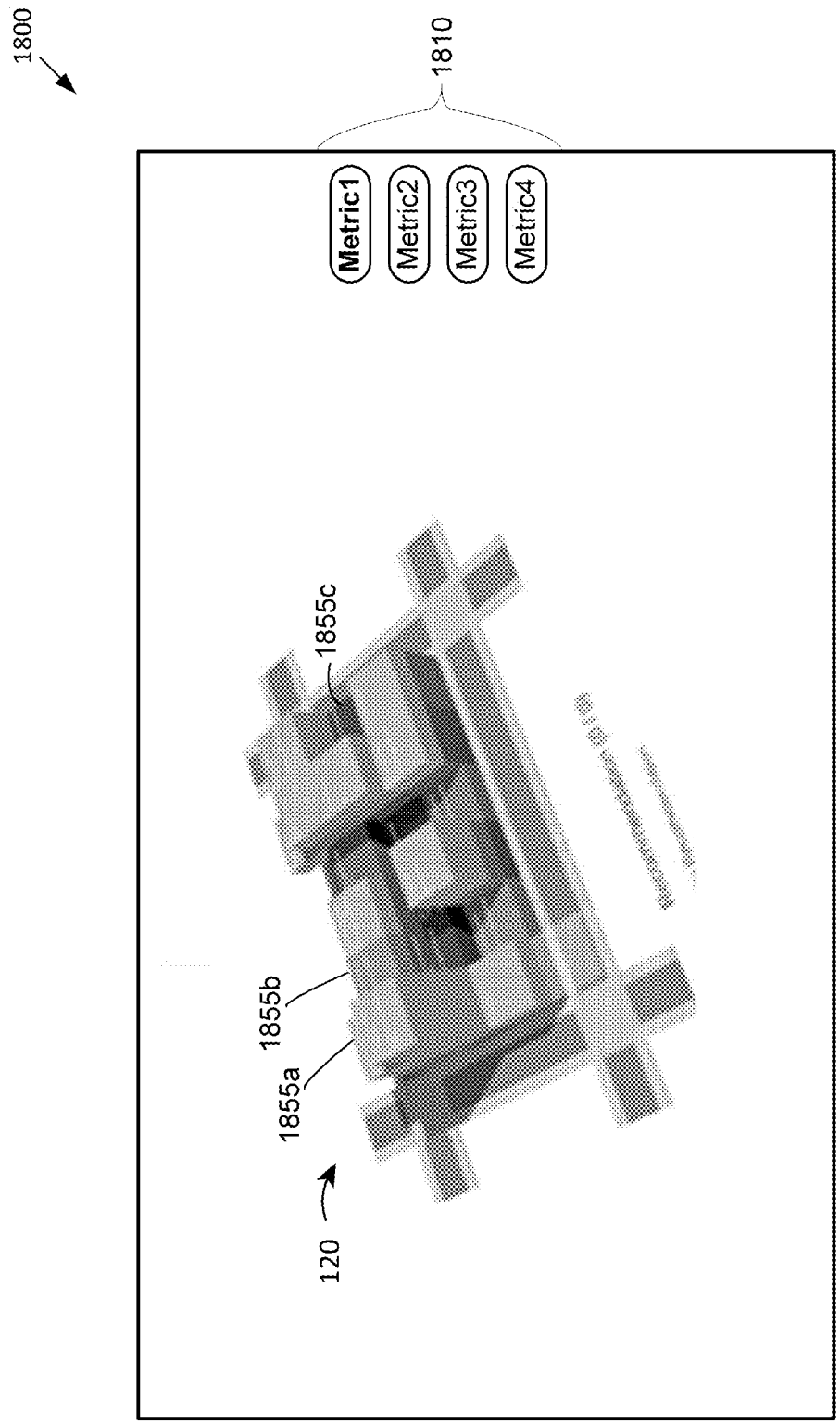
FIG. 18 illustrates a heat map visualization for a first metric of the shared design model of FIG. 17, according to various embodiments.

FIG. 18 illustrates a heat map visualization 1800 for a first metric of the shared design model of FIG. 17, according to various embodiments. As shown, the heat map visualization 1800 includes a set of selectable performance metrics 1810 and a visualization of the shared design model 120 comprising a plurality of voxels 1855 (such as 1855a, 1855b, 1855c, etc.). In the example of FIG. 18, the user has selected the first performance metric, whereby the first performance metric comprises the metric selection 1410 of FIG. 14. In response to receiving the metric selection 1410 via the user interface 140, the visualization module 116 retrieves, for each voxel in the shared design model 120, the value for the first performance metric ("PM1") included in the performance metrics field 1520 of the corresponding entry 1501 in the voxel data structure 1450. The first performance metric can be associated with a first color. For example, the first performance metric can comprise the carbon footprint metric associated with the color green.

For each voxel, the visualization module 116 maps the value of the first performance metric for the voxel to a particular level of darkness, saturation, and/or intensity of the first color to visually indicate the value of the first performance metric at the 3D location of the voxel in the voxel grid 700. The visualization module 116 maps the different values of the first performance metric to different levels of darkness, saturation, and/or intensity based on a first set of mappings that is predefined for the first performance metric. In this manner, the visualization module 116 generates a per-voxel heat map visualization 1800 of the shared design model 120 (shown as metric heat map 1470 in FIG. 14) that visually indicates different values of the first performance metric for the different voxels 1855 at different 3D locations of the shared design model 120. As shown, the different voxels 1855a, 1855b, and 1855c are displayed with the same color but with a different level of darkness, saturation, and/or intensity to indicate different values of the first performance metric corresponding to the different voxels 1855a, 1855b, and 1855c. The heat map visualization 1800 of the shared design model 120 is then displayed to the user via the user interface 140 (shown as metric heat map 1470).

Figure 19:
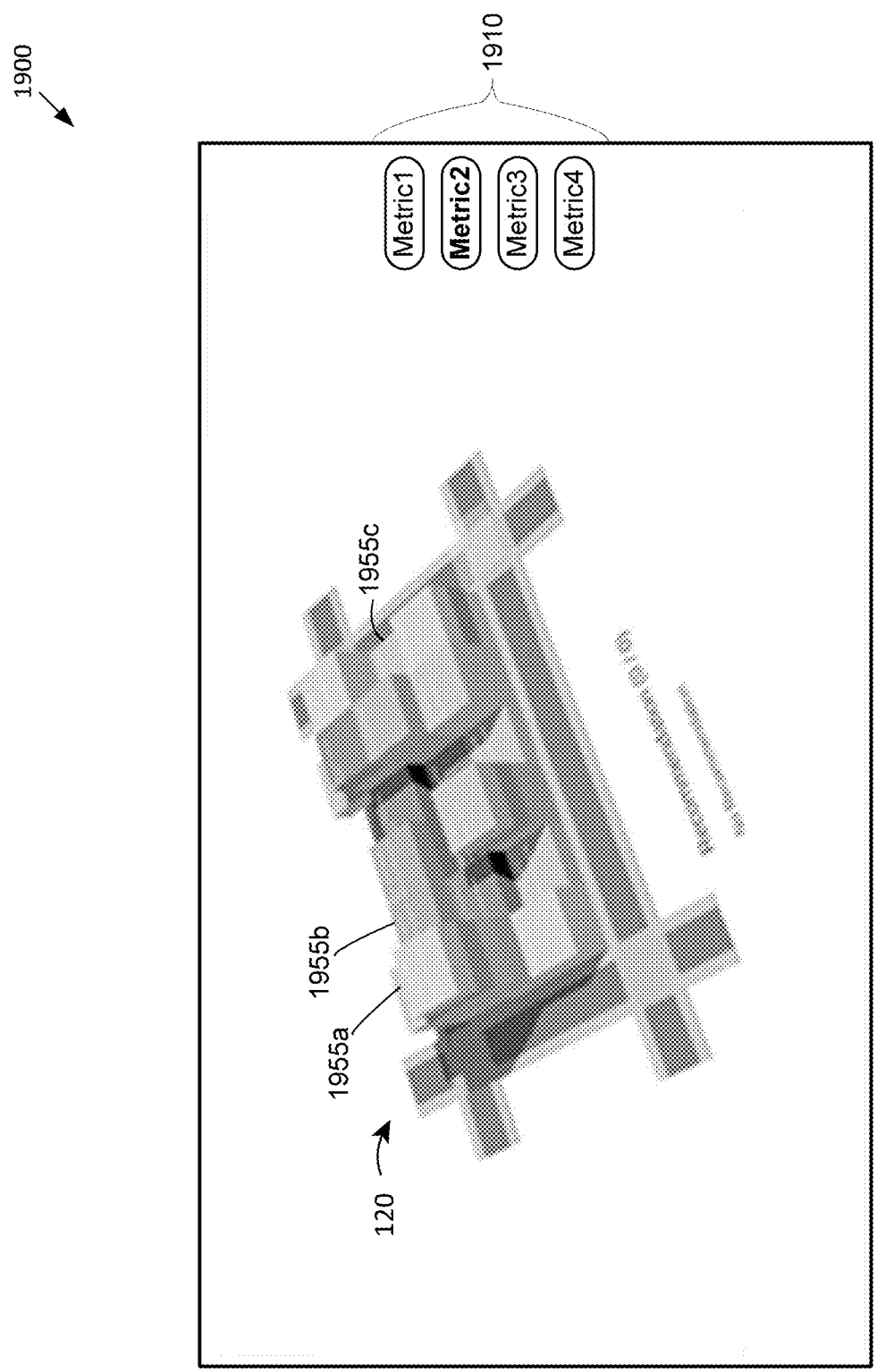
FIG. 19 illustrates a heat map visualization for a second metric of the shared design model of FIG. 17, according to various embodiments.

FIG. 19 illustrates a heat map visualization 1900 for a second metric of the shared design model of FIG. 17, according to various embodiments. As shown, the heat map visualization 1900 includes a set of selectable performance metrics 1910 and a visualization of the shared design model 120 comprising a plurality of voxels 1955 (such as 1955a, 1955b, 1955c, etc.). In the example of FIG. 19, the user has selected the second performance metric, whereby the second performance metric comprises the metric selection 1410 of FIG. 14. In response to receiving the metric selection 1410 via the user interface 140, the visualization module 116 retrieves, for each voxel in the shared design model 120, the value for the second performance metric ("PM2") included in the performance metrics field 1520 of the corresponding entry 1501 in the voxel data structure 1450. The second performance metric can be associated with a second color. For example, the second performance metric can comprise the daylight amount metric associated with the color yellow.

For each voxel, the visualization module 116 maps the value of the second performance metric for the voxel to a particular level of darkness, saturation, and/or intensity of the second color to visually indicate the value of the second performance metric. The visualization module 116 maps the different values of the second performance metric to different levels of darkness, saturation, and/or intensity based on a second set of mappings that is predefined for the second performance metric. In this manner, the visualization module 116 generates a per-voxel heat map visualization 1900 of the shared design model 120 (shown as metric heat map 1470 in FIG. 14) that visually indicates different values of the second performance metric for the different voxels 1955 of the shared design model 120. As shown, the different voxels 1955*a*, 1955*b*, and 1955*c* are displayed with the same color but with a different level of darkness, saturation, and/or intensity to indicate different values of the second performance metric corresponding to the different voxels 1955*a*, 1955*b*, and 1955*c*. The heat map visualization 1900 of the shared design model 120 is then displayed to the user via the user interface 140 (shown as metric heat map 1470).

In addition to displaying a heat map visualization via the user interface 140 of a given workstation instance, the synchronization module 108 can also broadcast the heat map visualization to other workstation instances. In particular, the synchronization module 108 receives and broadcasts the heat map visualization to one or more devices operating the one or more generative design applications 110. In some embodiments, the synchronization module 108 can maintain a local instance of the heat map visualization in the shared compute instance 104. In such cases, the synchronization module 108 can synchronize the heat map visualization by updating the local instance with data received from a given workstation instance 102 (e.g., workstation instance 102(1)) and broadcast the updated local instance to the other workstation instances (e.g., 102(2), 102(3)) to have the other workstation instances update the local versions of the shared design model 120 to match and reflect the updates.

In alternative embodiments, the visualization of a performance metric for a shared design model 120 implements other variations of visual appearances of the voxels other than variations of darkness, saturation and/or intensity for a particular color to visually indicates values for the performance metric. For example, variations of shading, cross hatching, texture, or any other visual attribute of the voxel can be used to visually indicate different values for the performance metric. In these embodiments, a first voxel having a first value for a first performance metric is displayed with a first visual appearance in the heat map, a second voxel having a second value for the first performance metric is displayed with a second visual appearance in the heat map, wherein the first value is different from the second value and the first visual appearance is different from the second visual appearance. The first visual appearance can be different from the second visual appearance in relation to any visual attribute (such as color, darkness, saturation, intensity, shading, hatching, etc.).

Advantageously, the visualization module 116 can easily render a heat map visualization of the shared design model 120 in real-time based on the voxel data structure 1450, while requiring less processing time and resources relative to conventional rendering techniques for heat maps. In particular, the visualization module 116 can render a heat map visualization of the shared design model 120 via simple mapping operations applied to different values of performance metrics of discrete voxels specified in the voxel data structure 1450 to different visual appearances for the discrete voxels. Such mapping operations for discrete voxels requires significantly less processing time and resources relative to conventional heat-map rendering techniques that rely on heat map simulations of the entire design model. Consequently, when implementing conventional heat-map visualization techniques, there is significant latency/delay from the time a user requests a heat-map visualization and when the heat-map visualization is rendered and displayed. In contrast, in the embodiments described herein, the values of the performance metrics for the individual voxels are previously computed and stored to the voxel data structure 1450 (typically in operations executed in the background) prior to selection of a performance metric by a user. As such, in the embodiments herein, the heat-map visualization of a performance metric can be rendered and displayed in real-time with greatly reduced latency/delay from the time the user requests the heat-map visualization. The user can further click through multiple different heat-map visualizations of different performance metrics in real-time with insignificant latency/delay.

Figure 20:
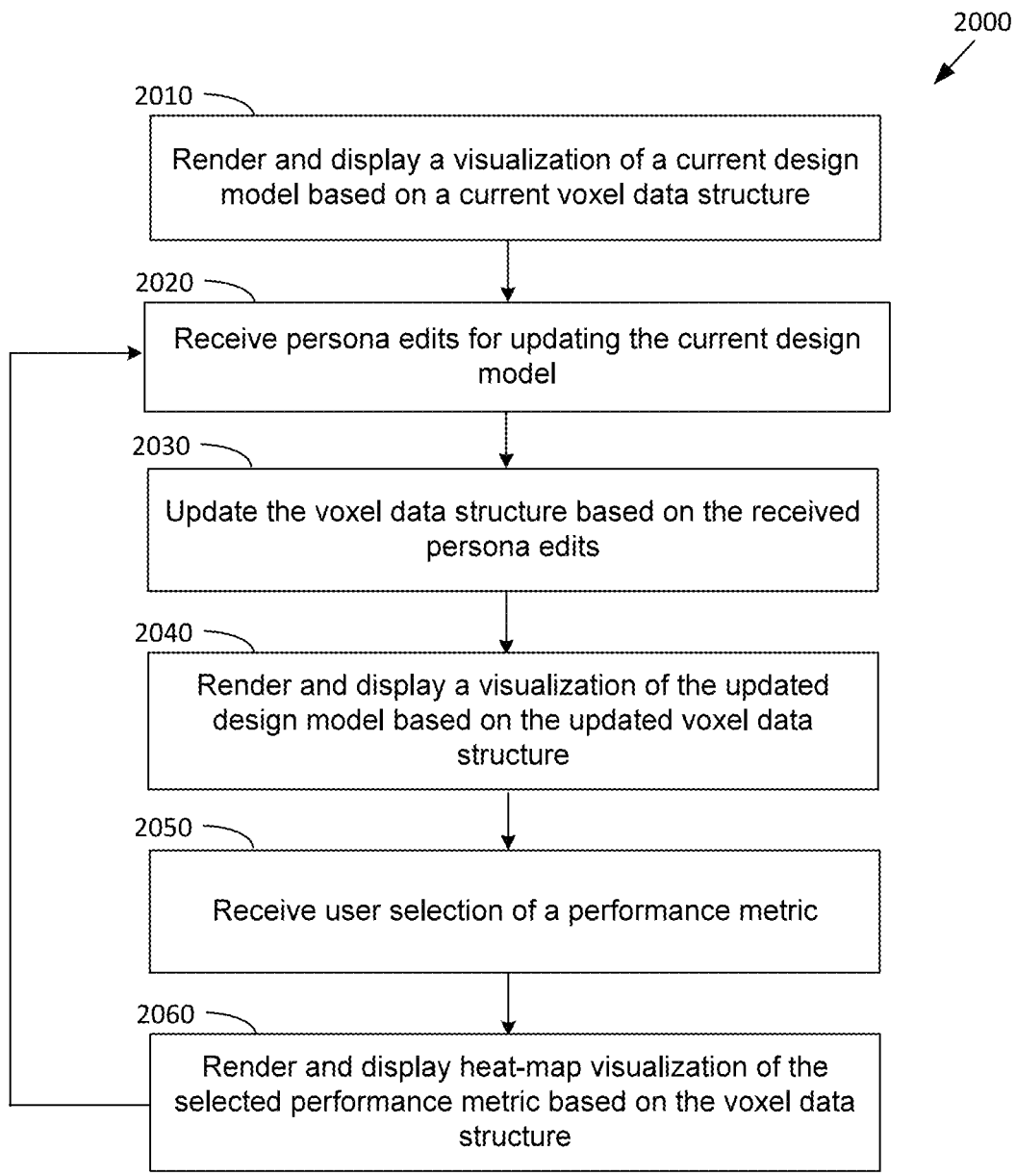
FIG. 20 sets forth a flow diagram of method steps for generating visualizations of a shared design model based on the voxel data structure of FIG. 15, according to various embodiments.

FIG. 20 sets forth a flow diagram of method steps for generating visualizations of a shared design model based on the voxel data structure 1450 of FIG. 15, according to various embodiments. Although the method steps are described with reference to the systems of FIGS. 1-11 and 14-19, persons skilled in the art will understand that any system configured to implement the method steps, in any order, falls within the scope of the disclosed embodiments. In some embodiments, the steps of the method 2000 are performed by various components of the generative design application 110 (such as the design model editor 114 and the visualization module 116) and the user interface 140.

As shown, a method 2000 begins at step 2010, where a visualization of a current shared design model 120 is rendered and displayed based on a current voxel data structure 1450. The current shared design model 120 comprises one or more voxels positioned within a 3D voxel grid 700. For each voxel in the current shared design model 120, the visualization module 116 maps visual properties associated with the voxel to corresponding graphic elements to render the voxel at the corresponding 3D location in the voxel grid 700. In particular, for each entry 1501 of a voxel in the current voxel data structure 1450, the visual properties specified in the visual properties field 1530 are mapped to corresponding graphic elements to render the voxel at the corresponding location of the voxel the 3D voxel grid. For example, for rendering the voxel, the color property is mapped to a specified color assigned to the voxel, the shape property (shape identifier) is mapped to a specified predefined shape assigned to the voxel, and so forth. The mapped predefined shape can comprise a simple shape or complex shape that is retrieved from the set of predefined shapes 1455. The rendered visualization of the current shared design model 120 is then displayed via the user interface 140.

At step 2020, the design model editor 114 receives a set of persona edits 410 from a user for adding, modifying, and/or removing a voxel from the current shared design model 120/voxel grid 700. The design model editor 114 applies the design rules 1460 based on the persona of the user to verify that the received persona edits 410 are valid.

At step 2030, the design model editor 114 updates the voxel data structure 1450 based on the received persona edits 410. For example, the persona edits 410 can be received from a user for adding a first voxel of a first voxel type at a first location of the shared design model 120/voxel grid 700. In response, the design model editor 114 generates a new entry 1501 in the voxel data structure 1450 and populates the data fields of the new entry 1501, including specifying the first location in the coordinates field 1505, specifying performance properties in the performance properties field 1510, computing performance metrics in the performance metrics field 1520 based on the performance properties, specifying visual properties (such as color and shape) in the visual properties field 1530, specifying a size in the size field 1540, and specifying the first voxel type in the voxel type field 1550. For example, the persona edits 410 can be received from a user for modifying a second voxel at a second location of the shared design model 120/voxel grid 700. In response, the design model editor 114 retrieves an entry 1501 from the voxel data structure 1450 based on the second location and modifies/updates one or more data fields of the retrieved entry 1501 based on the persona edits 410. For example, the persona edits 410 can be received from a user for deleting a third voxel at a third location of the shared design model 120/voxel grid 700. In response, the design model editor 114 identifies an entry 1501 from the voxel data structure 1450 based on the third location and removes the identified entry 1501.

At step 2040, the visualization of the updated shared design model 120 is rendered and displayed based on the updated voxel data structure 1450. The updated shared design model 120 comprises one or more new, modified, or deleted voxels relative to the previous shared design model 120. For each voxel in the updated shared design model 120, the visualization module 116 maps visual properties (such as color and shape) associated with the voxel to corresponding graphic elements to render the voxel at the corresponding 3D location in the voxel grid 700. The rendered visualization of the updated shared design model 120 is then displayed via the user interface 140. The rendered visualization of the updated shared design model 120 can also be broadcast to other workstation instances by the synchronization module 108.

At step 2050, the design model editor 114 receives a user selection of a particular performance metric (metric selection 1405) via the user interface 140. In some embodiments, the user selection of the particular performance metric is received after the values for the selected performance metric for the plurality of voxels in the shared design model 120 are already computed and stored to the voxel data structure 1450.

In response to step 2050, at step 2060, the visualization module 116 renders and displays a heat-map visualization of the shared design model 120 for the selected performance metric based on the voxel data structure 1450. In particular, the visualization module 116 can render each voxel separately based on the value of the selected performance metric for the voxel that is retrieved from the voxel data structure 1450. For example, each voxel can be rendered in a particular color associated with the selected performance metric, whereby the level of saturation and/or intensity for the particular color is determined based on the value of the selected performance metric for the voxel. The rendered heat-map visualization of the shared design model 120 is then displayed via the user interface 140. The rendered heat-map visualization can also be broadcast to other workstation instances by the synchronization module 108. The method 2000 then continues at step 2020.

Voxel-Based Visualizations of Optimized Design Solutions

Referring back to FIG. 15, the voxel data structure 1450 represents a voxel grid 700 visualization of a particular shared design model 120. The voxel data structure 1450 also includes a plurality of entries 1501 that store voxel-level information for the plurality of voxels in the shared design model 120. As shown, the voxel data structure 1450 also includes a design entry 1599 that stores design-level information associated with the entire shared design model 120 (as opposed to voxel-level information that is associated with a particular voxel of the shared design model 120). For example, the design entry 1599 can specify values ("x, y, z . . . ") for various design-level performance metrics ("DPM1, DPM2, DPM3 . . . ") that are computed for the shared design model 120 as a whole, taking into consideration all voxels of the shared design model 120. As such, the design-level performance metrics indicate overall performance scores for the shared design model 120. In some embodiments, the design-level performance metrics specified in the design entry 1599 includes the types of metrics that are included in the performance metrics field 1520, except at a design-level instead of a voxel-level. For example, the design-level performance metrics can include carbon footprint, urban density, number of residents, number of jobs, service access, daylight amount, and the like for the overall shared design model 120.

The evaluation module 112 of FIG. 4 generates a set of optimized design solutions based on the shared design model 120 through various optimization techniques. In some embodiments, the optimizer 406 of the evaluation module 112 performs a voxel-based optimization technique to generate a set of optimized design solutions for improving (increasing performance) one or more design-level performance metrics of the shared design model 120. The design model evaluator 404 of the evaluation module 112 can compute the design-level performance metrics for the shared design model 120 and each optimized design solution, which are used by the optimizer 406 to generate the set of optimized design solutions. The optimizer 406 generates a recommendation for each optimized design solution. In general, the recommendation for an optimized design solution indicates the difference/delta between the optimized design solution and the shared design model 120. In particular, the recommendation for an optimized design solution specifies a set of one or more voxels (set of different voxels) that are different between the optimized design solution and the shared design model 120. For each voxel in the set of different voxels, the recommendation can specify that the voxel is a new voxel that was added to the shared design model 120 at a particular location in the grid, the voxel is a previous voxel that was removed from the shared design model 120 at a particular location in the grid, or the voxel is a current voxel that was modified in the shared design model 120 at a particular location in the grid. For each voxel in the set of different voxels, the recommendation specifies the 3D location of the voxel in the voxel grid 700.

The evaluation module 112 and the voxel-based optimization technique are discussed in detail below in relation to FIGS. 25-27. The discussion in this section relates to voxel-based visualizations of the optimized design solutions which assumes that the evaluation module 112 has already generated a set of optimized design solutions, and generated a recommendation and an optimized voxel data structure 1450 for each optimized design solution. Each optimized design solution has at least one design-level performance metric that is superior to (improved over) at least one corresponding design-level performance metric of the shared design model 120. Each optimized design solution can also be added to the shared design space 130.

Figure 21:
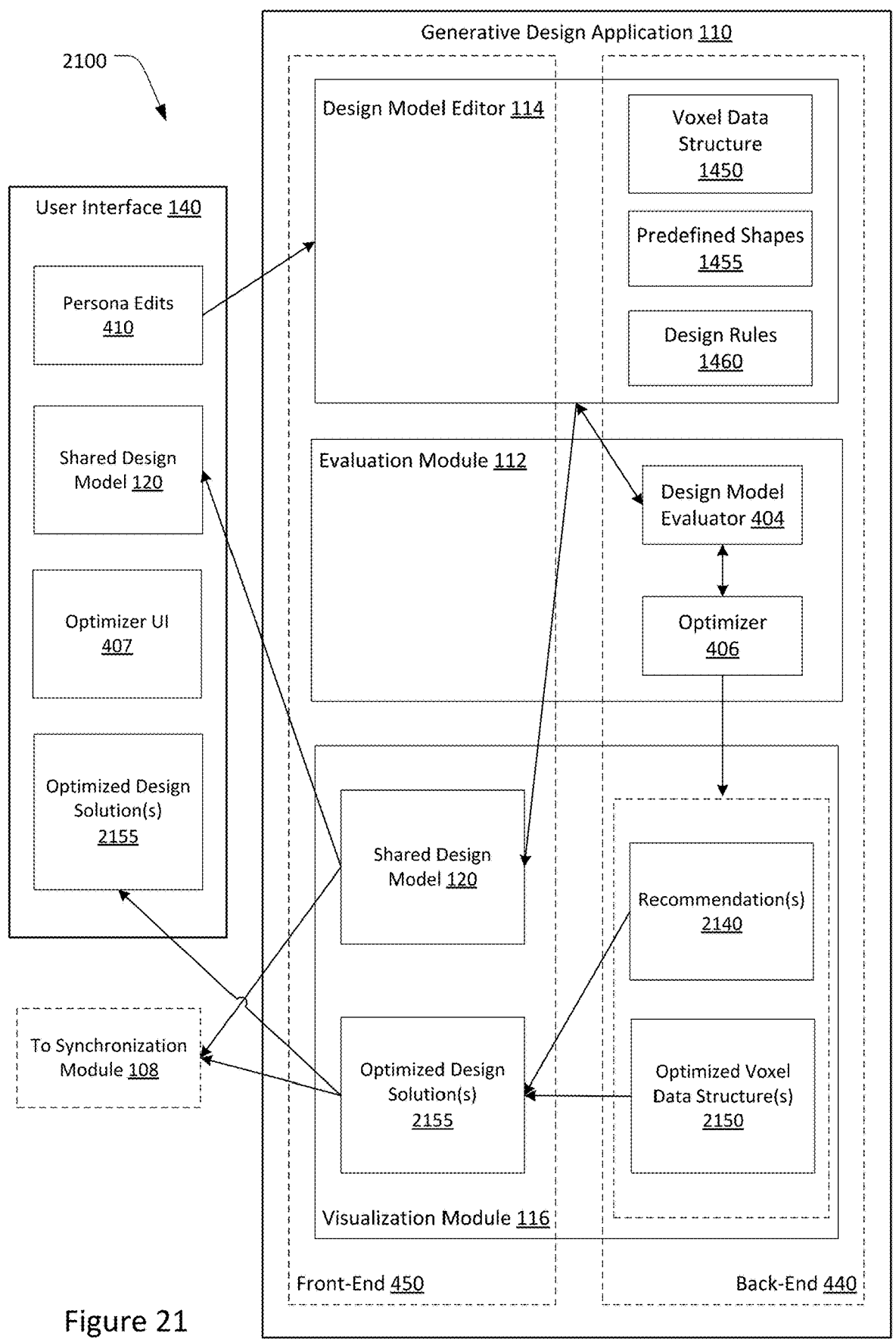
FIG. 21 is a diagram illustrating interactions between components of a workstation instance that implements voxel-based visualizations of optimized design solutions, according to various embodiments.

FIG. 21 is a diagram 2100 illustrating interactions between components of a workstation instance 102 that implements voxel-based visualizations of optimized design solutions, according to various embodiments. As shown, and without limitation, the diagram 2100 includes the generative design application 110 and the user interface 140. The generative design application 110 includes the design model editor 114, the evaluation module 112, and the visualization module 116. The design model editor 114 includes a voxel data structure 1450, a set of predefined shapes 1455, and a set of design rules 1460. The evaluation module 112 includes the design model evaluator 404 and the optimizer 406. The visualization module 116 includes the shared design model 120, at least one recommendation 2140, at least one optimized voxel data structure 2150, and at least one optimized design solution 2155. The user interface 140 includes a set of persona edits 410, the shared design model 120, an optimizer user interface (UI) 407, and at least one optimized design solution 2155. The optimizer UI 407 comprises a user interface for configuring various parameters of the optimizer 406, as discussed below in relation to FIG. 25. Various components of FIG. 21 are discussed above in relation to FIGS. 4 and 14, and thus are not discussed in detail here.

As discussed above in relation to FIG. 14, the user interface 140 and the design model editor 114 execute various interaction loops to enable a user to edit the shared design model 120 via persona edits 410, the shared design model 120 being represented by the voxel data structure 1450. In response to the updates to the shared design model 120, the design model editor 114 updates the voxel data structure 1450 to reflect the updates to the shared design model 120. After the voxel data structure 1450 is updated, the visualization module 116 renders a visualization of the updated shared design model 120 that is displayed to the user via the user interface 140.

In some embodiments, after a user updates the shared design model 120, the evaluation module 112 is triggered to generate at least one optimized design solution 2155 for improving (increasing performance of) one or more design-level performance metrics of the updated shared design model 120. In other embodiments, the evaluation module 112 is triggered to generate at least one optimized design solution 2155 by a user selection of the optimization process. In particular, the evaluation module 112 generates at least one optimized voxel data structure 2150, each optimized voxel data structure 2150 representing a particular optimized design solution 2155. The evaluation module 112 also generates a recommendation 2140 for each optimized design solution 2155 that specifies a set of different voxels between the optimized design solution 2155 and the shared design model 120. In other embodiments, the generative design application 110 can include a neural network that maps the shared design model 120 to each optimized design solution 2155 to determine the set of different voxels between the optimized design solution 2155 and the shared design model 120.

The generative design application 110 generates and stores a separate optimized voxel data structure 2150 for each optimized design solution 2155, for example, by copying the voxel data structure 1450 for the shared design model 120 and modifying the voxel data structure 1450 based on the corresponding recommendation 2140 to generate the optimized voxel data structure 2150. Each optimized design solution 2155 comprises a separate voxel grid 700 comprising a plurality of voxels. Each optimized voxel data structure 2150 is similar in structure and stores similar data fields as the voxel data structure 1450 shown in FIG. 15.

In particular, as shown in FIG. 15, each optimized voxel data structure 2150 for an optimized design solution 2155 comprises a plurality of entries 1501, each entry 1501 corresponding to a voxel included in a voxel grid 700 of the optimized design solution 2155. An entry 1501 for a particular voxel stores voxel-level information in a plurality of data fields, including a coordinates field 1505, a performance properties field 1510, a performance metrics field 1520, a visual properties field 1530, a size field 1540, and a voxel type field 1550. Each optimized voxel data structure 2150 also includes a design entry 1599 that stores design-level information associated with the entire optimized voxel data structure 2150. For example, the design entry 1599 can specify values ("x, y, z . . . ") for various design-level performance metrics ("DPM1, DPM2, DPM3 . . . "). The values for the data fields in the entries 1501 and 1599 of each optimized voxel data structure 2150 are computed in the same manner as for computing values for the data fields in the entries 1501 and 1599 of the voxel data structure 1450, as discussed above in relation to FIG. 15.

After at least one optimized voxel data structure 2150 for the at least one optimized design solution 2155 is generated by the evaluation module 112, the visualization module 116 renders a visualization of each optimized design solution 2155 based on the corresponding optimized voxel data structure 2150. Note that each optimized design solution 2155 is also represented by a separate voxel grid 700 that includes all voxels of the optimized design solution 2155 at corresponding 3D locations in the voxel grid 700. An optimized design solution 2155 is rendered based on a corresponding optimized voxel data structure 2150 in a manner similar to rendering the shared design model 120 based on the voxel data structure 1450 as discussed above. In particular, for each entry 1501 of a voxel in the optimized voxel data structure 2150, the visual properties specified in the visual properties field 1530 are mapped to corresponding graphic elements to render the voxel at the corresponding 3D location in the voxel grid 700 for the optimized design solution 2155. For example, the color property is mapped to a specified color assigned to the voxel, the shape property (shape identifier) is mapped to a specified predefined shape assigned to the voxel, and so forth. The visualization of each optimized design solution 2155 is then displayed to the user via the user interface 140. The rendered visualization of each optimized design solution 2155 can also be broadcast to other workstation instances by the synchronization module 108.

Figure 22:
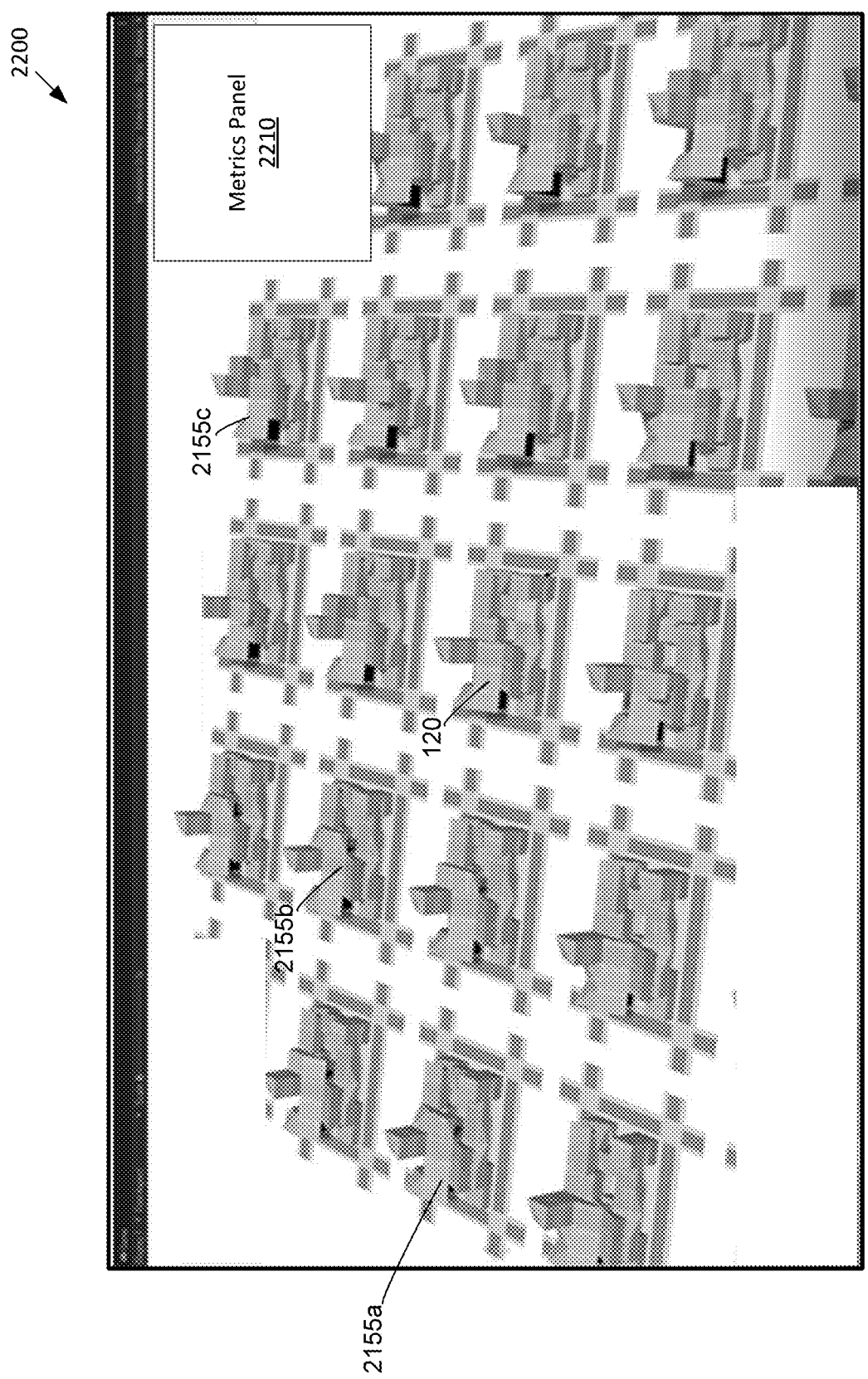
FIG. 22 illustrates a visualization of the optimized design solutions of FIG. 21, according to various embodiments.

FIG. 22 illustrates a visualization 2200 of the optimized design solutions 2155 of FIG. 21, according to various embodiments. As shown, the visualization 2200 includes a visualization of the shared design model 120 in the center and visualizations of a plurality of optimized design solutions 2155 (such as 2155a, 2155b, 2155c, etc.) surrounding the shared design model 2250. The visualization 2200 also includes a metrics panel 2210 for displaying design-level performance metrics associated with the shared design model 120 and the optimized design solutions 2155. The visualization 2200 is displayed to the user via the user interface 140. The user interface 140 enables the user to interact with the various optimized design solutions 2155. In some embodiments, the user can select a particular optimized design solution 2155 to replace the current shared design model 120 as the new shared design model 120. The user can then further modify/edit the new shared design model 120 via persona edits 410.

In other embodiments, the user can select a particular optimized design solution 2155 to view design-level performance metrics associated with the selected optimized design solution 2155 and/or the shared design model 120, which are displayed in the metrics panel 2210. For example, the visualization module 116 can display various design-level performance metrics for the selected optimized design solution 2155 and the shared design model 120 in the metrics panel 2210 for the user to compare. As another example, the visualization module 116 can display differences in values for various corresponding design-level performance metrics for the selected optimized design solution 2155 and the shared design model 120 in the metrics panel 2210. The visualization module 116 can display the design-level performance metrics for the selected optimized design solution 2155 based on the design-level performance metrics stored in the design entry 1599 in the corresponding optimized voxel data structure 2150. Likewise, the visualization module 116 can display the design-level performance metrics for the shared design model 120 based on the design-level performance metrics stored in the design entry 1599 in the voxel data structure 1450.

As shown in FIG. 22, it can be difficult for a user to discern the differences between a particular optimized design solution 2155 and the shared design model 120, especially when the changed voxels in the optimized design solution 2155 are obscured by other voxels in the optimized design solution 2155. In some embodiments, the visualization module 116 renders each optimized design solution 2155 so that a set of different voxels that are different between the optimized design solution 2155 and the shared design model 120 are visually highlighted (made visually distinct) relative to a set of common voxels that are common/mutual to the optimized design solution 2155 and the shared design model 120.

Figure 23:
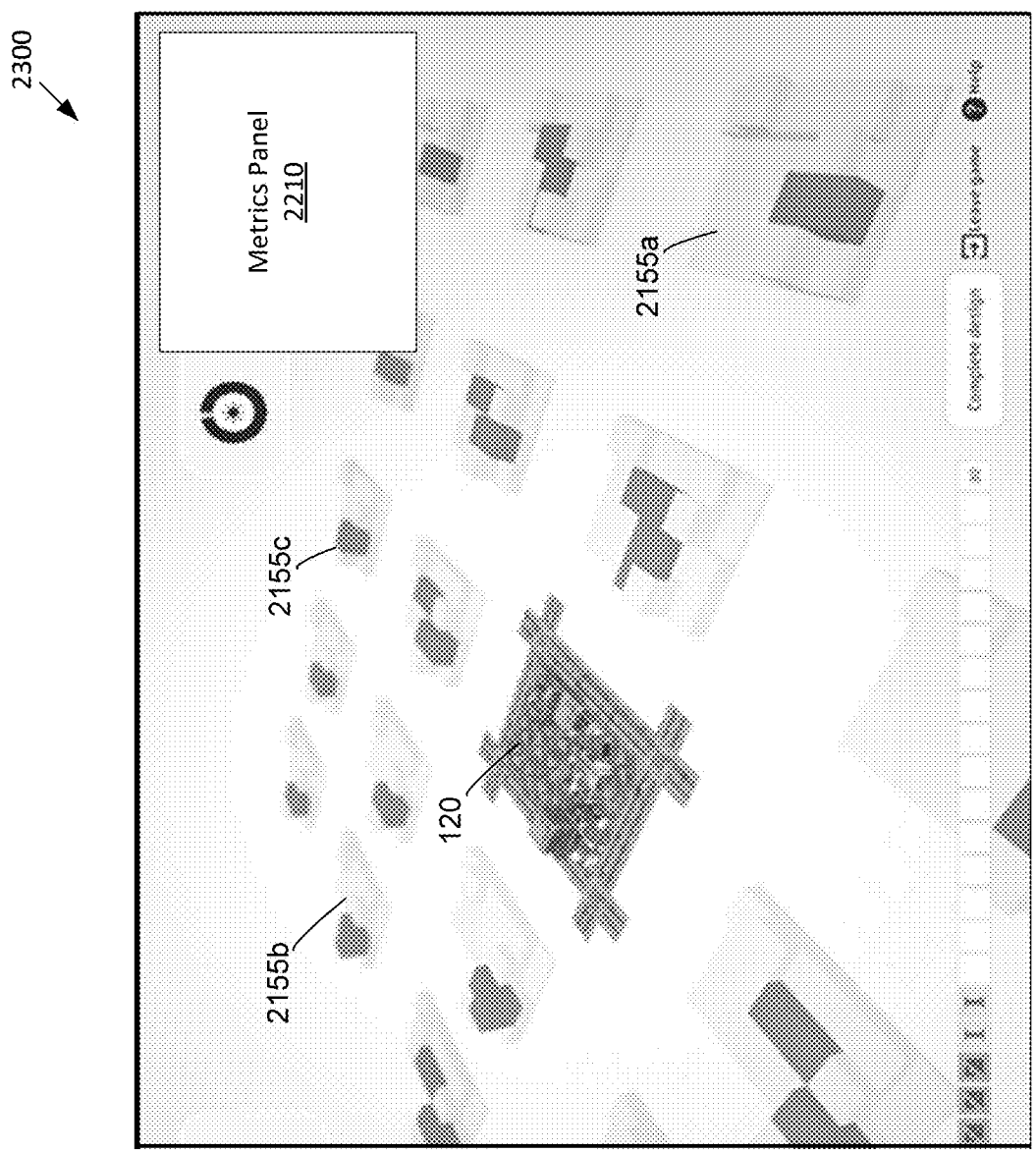
FIG. 23 illustrates a difference visualization of the optimized design solutions of FIG. 21, according to various embodiments.

FIG. 23 illustrates a difference visualization 2300 of the optimized design solutions 2155 of FIG. 21, according to various embodiments. As shown, the visualization 2300 includes a visualization of the shared design model 120 in the center and difference visualizations of a plurality of optimized design solutions 2155 (such as 2155a, 2155b, 2155c, etc.) surrounding the shared design model 2350. In some embodiments, the "normal" visualization 2200 of the optimized design solution 2155 of FIG. 22 is set as the default visualization mode. In these embodiments, the difference visualization 2300 of the optimized design solution 2155 of FIG. 23 can be selected by the user via the user interface 140. In other embodiments, the difference visualization 2300 is set as the default visualization mode and the user can select by the "normal" visualization via the user interface 140.

To render a difference visualization for a particular optimized design solution 2155, the visualization module 116 overrides the color properties specified in the visual properties field 1530 of the corresponding optimized voxel data structure 2150 in a manner described herein. In particular, the visualization module 116 determines a set of different voxels between the optimized design solution 2155 and the shared design model 120 based on the recommendation 2140 generated for the optimized design solution 2155. The remaining voxels in the optimized design solution 2155 comprise a set of common voxels between the optimized design solution 2155 and the shared design model 120. A common voxel can comprise a same voxel in the same position in both the optimized design solution 2155 and the shared design model 120.

For each voxel in the set of different voxels, when rendering the voxel using the visual properties field 1530 in the corresponding entry 1501 of the optimized voxel data structure 2150, the visualization module 116 changes the color property to a first predetermined color. For each voxel in the set of common voxels, when rendering the voxel using the visual properties field 1530 in the corresponding entry 1501 of the optimized voxel data structure 2150, the visualization module 116 changes the color property to a second predetermined color. The first predetermined color is different than the second predetermined color. The first predetermined color indicates to the user that the voxel is in the set of different voxels and the second predetermined color indicates to the user that the voxel is in the set of common voxels. For example, the first predetermined color can be significantly darker than the second predetermined color, as shown in FIG. 21. For example, the second predetermined color can be clear, white, light grey, etc. For example, the first predetermined color can be the same hue as the second predetermined color, but have a different saturation and/or intensity. In some embodiments, the first predetermined color is based on the current persona of the user (such as blue for the Mayor persona). In this manner, the set of different voxels of the optimized design solution 2155 is rendered and displayed in a different color than the set of common voxels of the optimized design solution 2155 so that the set of different voxels are highlighted and made easily visible to the user.

In other embodiments, each voxel in the set of different voxels can be assigned a particular color based on a modification operation associated with the voxel that is performed on the shared design model 120 to generate the optimized design solution 2155. For example, when rendering an added voxel that has been added to the shared design model 120, the visualization module 116 can change the color property to a first predetermined color. When rendering a removed voxel that has been removed from the shared design model 120, the visualization module 116 can change the color property to a second predetermined color. When rendering a modified voxel that has been modified/enhanced in the shared design model 120, the visualization module 116 can change the color property to a third predetermined color. When rendering each voxel in the set of common voxels, the visualization module 116 can change the color property to a fourth predetermined color. Each of the first, second, third, and fourth predetermined colors are different from each other. The first, second, and third predetermined colors indicates to the user that the voxel is in the set of different voxels and the fourth predetermined color indicates to the user that the voxel is in the set of common voxels. In some embodiments, each of the first, second, and third predetermined colors are each significantly darker than the fourth predetermined color so that the set of different voxels has a highlighted/distinct visual appearance relative to the set of common voxels. For example, the fourth predetermined color can be clear, white, light grey, etc.

In alternative embodiments, the set of different voxels are rendered and displayed with a first visual appearance and the set of common voxels are rendered and displayed with a second visual appearance. In these embodiments, the first visual appearance is different from the second visual appearance in relation to any visual attribute (such as color, shading, hatching, etc.). In this manner, the set of different voxels of the optimized design solution 2155 is rendered and displayed with a different visual appearance than the set of common voxels of the optimized design solution 2155 so that the set of different voxels are highlighted and made easily visible to the user.

Figure 24:
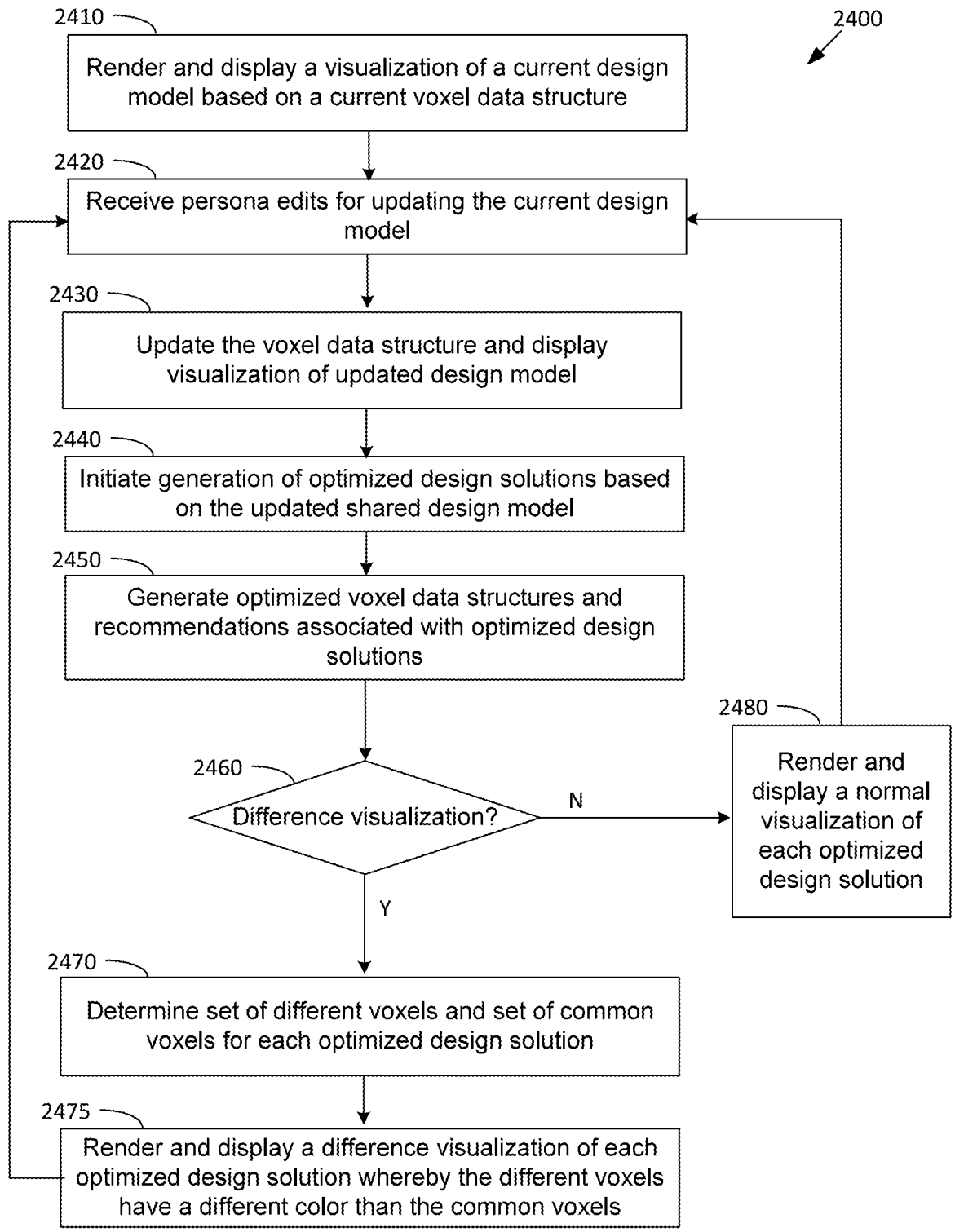
FIG. 24 sets forth a flow diagram of method steps for generating visualizations of one or more optimized design solutions, according to various embodiments.

FIG. 24 sets forth a flow diagram of method steps for generating visualizations of one or more optimized design solutions, according to various embodiments. Although the method steps are described with reference to the systems of FIGS. 1-11, 14-19, and 21-23, persons skilled in the art will understand that any system configured to implement the method steps, in any order, falls within the scope of the disclosed embodiments. In some embodiments, the steps of the method 2400 are performed by various components of the generative design application 110 (such as the design model editor 114, the evaluation module 112, and the visualization module 116) and the user interface 140.

As shown, a method 2400 begins at step 2410, where a visualization of a current shared design model 120 is rendered and displayed based on a current voxel data structure 1450. For each voxel in the current shared design model 120, the visualization module 116 maps visual properties associated with the voxel to corresponding graphic elements. The rendered visualization of the current shared design model 120 is then displayed via the user interface 140.

At step 2420, the design model editor 114 receives a user input that indicates that the optimization process of the evaluation module 112 is to be initiated. For example, the user input can comprise a set of persona edits 410 from a user for adding, modifying, and/or removing a voxel from the current shared design model 120/voxel grid 700. In other embodiments, the user input can comprise another type of input, such as a user selection of the optimization process. At step 2430, the design model editor 114 updates the voxel data structure 1450 based on the received persona edits 410 and the visualization module 116 renders and displays an updated shared design model 120 based on the updated voxel data structure 1450. The visualization of the updated shared design model 120 is then displayed via the user interface 140.

At step 2440, the design model editor 114 initiates the evaluation module 112 to generate a set of optimized design solutions 2155 based on the updated shared design model 120. At step 2450, the evaluation module 112 generates at least one optimized voxel data structure 2150 representing at least one optimized design solution 2155 and at least one recommendation 2140 associated with the at least one optimized design solution 2155. At step 2460, the visualization module 116 determines if the visualization mode is set to the difference visualization. If so, the method 2400 continues to step 2470.

At step 2470, for each optimized design solution 2155, the visualization module 116 determines a set of different voxels between the optimized design solution 2155 and the updated shared design model 120 based on the associated recommendation 2140. The remaining voxels in the optimized design solution 2155 comprise a set of common voxels between the optimized design solution 2155 and the updated shared design model 120. At step 2475, the visualization module 116 renders and displays a difference visualization of each optimized design solution 2155 based on the corresponding optimized voxel data structure 2150. In particular, for each voxel in the optimized design solution 2155, the visualization module 116 maps visual properties in the visual properties field 1530 in the optimized voxel data structure 2150 to corresponding graphic elements. However, to render the difference visualization, the visualization module 116 overrides the color properties in the visual properties field 1530 in the optimized voxel data structure 2150. In particular, the visualization module 116 renders the set of different voxels to have a first predetermined color and the set of common voxels to have a second predetermined color that is different from the first predetermined color. The difference visualization for each optimized design solution 2155 is then displayed via the user interface 140. The difference visualization of each optimized design solution 2155 can also be broadcast to other workstation instances by the synchronization module 108. The method 2400 then returns to step 2420.

At step 2460, if the visualization module 116 determines that the visualization mode is not set to the difference visualization, the method 2400 continues to step 2480. At step 2480, the visualization module 116 renders and displays a "normal" visualization of each optimized design solution 2155 based on the corresponding optimized voxel data structure 2150. In particular, for each voxel in the optimized design solution 2155, the visualization module 116 maps visual properties in the visual properties field 1530 in the optimized voxel data structure 2150 to corresponding graphic elements. The "normal" visualization for each optimized design solution 2155 is then displayed via the user interface 140. The "normal" visualization of each optimized design solution 2155 can also be broadcast to other workstation instances by the synchronization module 108. The method 2400 then returns to step 2420.

Voxel-Based Optimization Technique

As discussed above, conventional design software typically generates and operates on geometry-based design models that include complex continuous geometries for defining the various structures of the design models. These geometries are typically specified via a large number of continuous parameters. Likewise, conventional optimization techniques operate on a continuous geometry-based design model to generate optimized design solutions. Conventional optimization techniques are based on continuous geometry-based parametric models that require a large number of different input parameters. For example, typical geometry-based parametric models can require thousands of input parameters that require highly complex computations for generating optimized design solutions. Therefore, conventional optimization techniques require significant processing time and resources and are not capable of generating optimized design solutions in real-time.

In some embodiments, the evaluation module 112 of FIG. 21 generates a set of optimized design solutions 2155 based on the shared design model 120 via a voxel-based optimization technique. As shown in FIG. 21, the evaluation module 112 includes the design model evaluator 404 and the optimizer 406. The optimizer 406 of the evaluation module 112 performs the voxel-based optimization technique based on the voxel-based shared design model 120 to generate a set of voxel-based optimized design solutions 2155 in real-time. Input parameters of the voxel-based optimization technique can include an action type, voxel location in the grid, and a voxel type.

Advantageously, implementing a voxel-based shared design model 120 significantly reduces input parameters of the optimization technique relative to the large number of input parameters required for conventional continuous geometry-based design models. The voxel-based shared design model 120 significantly reduces processing time and resources required by the optimization technique for generating the set of optimized design solutions 2155, relative to conventional approaches. Consequently, the voxel-based optimization technique is suitable for optimization of a design model in real-time. In some embodiments, the voxel-based optimization technique implements an evolutionary algorithm. Evolutionary algorithms are particularly effective at processing a relatively low number of input parameters and rapidly generating output solutions based on the input parameters.

Design-Level Performance Metrics

Each optimized design solution 2155 has at least one design-level performance metric that is superior to (improved over) at least one corresponding design-level performance metric of the shared design model 120. For each optimized design solution 2155, the voxel-based optimization technique adds, modifies, and/or deletes one or more voxels at one or more locations in the shared design model 120 to generate the optimized design solution 2155.

For example, the optimizer 406 can generate a first optimized design solution that improves the design-level performance of the shared design model 120 by adding multiple park voxels adjacent to an existing residential voxel within the shared design model 120, which improves (increases performance of) at least one design-level performance metric of the shared design model 120. For example, the first optimized design solution can reduce the design-level carbon footprint compared to the shared design model 120. The optimizer 406 can also generate a second optimized design solution by modifying/enhancing an existing residential voxel to also include a retail hub voxel (e.g., replacing the residential voxel with an enhanced residential voxel), which improves at least one design-level performance metric of the shared design model 120. For example, the second optimized design solution can increase the design-level access to services compared to the shared design model 120.

Each optimized design solution 2155 comprises a plurality of voxels arranged in a voxel grid 700. In particular, each optimized design solution 2155 comprises a voxel grid 700 comprising a discrete three-dimensional (3D) grid space of discrete voxels, as shown in FIG. 7. For each optimized design solution 2155, the optimizer 406 generates and stores an optimized voxel data structure 1450 that represents the optimized design solution 2155. In addition, for each optimized design solution 2155, the optimizer 406 generates and stores a corresponding recommendation 2140 associated with the optimized design solution 2155. A recommendation 2140 associated with an optimized design solution 2155 specifies a set of one or more different voxels between the optimized design solution 2155 and the shared design model 120. For each voxel in the set of different voxels, the recommendation can specify that the voxel is a new voxel that was added to the shared design model 120 at a particular location in the voxel grid 700, the voxel is a previous voxel that was removed from the shared design model 120 at a particular location in the voxel grid 700, or the voxel is a current voxel that was modified in the shared design model 120 at a particular location in the voxel grid 700.

The design model evaluator 404 of the evaluation module 112 computes the design-level performance metrics for the shared design model 120 based on the plurality of voxel-level performance metrics stored to the voxel data structure 1450 that represents the shared design model 120. Likewise, the design model evaluator 404 computes the design-level performance metrics for each optimized design solution 2155 based on the plurality of voxel-level performance metrics stored to the optimized voxel data structure 2150 that represents the optimized design solution 2155. The design-level performance metrics for the shared design model 120 and the optimized design solutions 2155 are used by the optimizer 406 to perform the voxel-based optimization technique.

For a particular design (shared design model 120 or an optimized design solution 2155), the design model evaluator 404 computes a particular design-level performance metric based on the voxel-level performance metrics specified for the plurality of voxels of the particular design in the corresponding voxel data structure (voxel data structure 1450 or optimized voxel data structure 2150). The specific technique implemented by the design model evaluator 404 for computing the design-level performance metric can vary depending on the particular design-level performance metric. In some embodiments, the design model evaluator 404 implements a technique based on an aggregation of the voxel-level performance metrics of the plurality of voxels to compute the design-level performance metric.

In some embodiments, for a particular design, the design model evaluator 404 computes a particular design-level performance metric for the design based on the values for the corresponding voxel-level performance metric specified in the plurality of entries 1501 of the voxel data structure 1450 representing the particular design. To illustrate, the design model evaluator 404 can compute a first design-level performance metric for the design based on the plurality of values for the first voxel-level performance metric specified in the plurality of entries 1501 of the voxel data structure 1450.

For example, the design model evaluator 404 can compute the design-level carbon footprint metric for a particular design based on the values for the voxel-level carbon footprint metric specified in the plurality of entries 1501 of the voxel data structure 1450 representing the particular design. The design model evaluator 404 can compute the design-level carbon footprint metric by summing the values of the voxel-level carbon footprint metrics for all the voxels of the particular design. As another example, the design model evaluator 404 can compute the design-level daylight amount metric for the design based on the values for the voxel-level daylight amount metric specified in the plurality of entries 1501 of the voxel data structure 1450 representing the particular design. The design model evaluator 404 can compute the design-level daylight amount metric by averaging the values of the voxel-level daylight amount metric specified for the bottom X % (such as the bottom 20%) of the voxels of the particular design, whereby the voxels are ranked by the voxel-level daylight amount metric.

In some embodiments, for a particular design, the design model evaluator 404 computes a particular design-level performance metric for the design based on the values for one or more non-corresponding voxel-level performance metrics specified in the plurality of entries 1501 of the voxel data structure 1450 representing the particular design. To illustrate, the design model evaluator 404 can compute a first design-level performance metric for the design based on the plurality of values for a second and/or third voxel-level performance metric specified in the plurality of entries 1501 of the voxel data structure 1450. For example, the design model evaluator 404 can compute the design-level urban density metric for the design based on the values for the voxel-level number of residents metric and the voxel-level number of jobs metric specified in the plurality of entries 1501 of the voxel data structure 1450. The design model evaluator 404 can compute the design-level urban density metric by summing the values of the voxel-level number of residents metric and the voxel-level number of jobs metric for the plurality of voxels of the particular design.

Advantageously, the design model evaluator 404 computes the design-level performance metrics for the shared design model 120 based on the voxel-level performance metrics stored to the corresponding voxel data structure 1450 and computes the design-level performance metrics for each optimized design solution 2155 based on the voxel-level performance metrics stored to the corresponding optimized voxel data structure 2150. Therefore, the design model evaluator 404 implements computation techniques based on a computation (such as aggregation) of previously computed voxel-level performance metrics to compute the design-level performance metrics for a particular design. These computation techniques leverage the voxel-level performance metrics that are already computed and stored to the corresponding voxel data structure. As such, these computation techniques require lower processing time and resources relative to conventional techniques that implement simulations on a continuous geometry-based design to derive design-level performance metrics for the design. Such conventional techniques require complex computations that generate simulations on the entirety of the continuous geometry-based design to determine the design-level performance metrics. Although some voxel-level performance metrics stored in the voxel data structure can be computed using simulation techniques, these simulations are performed on small sub-sets of discrete voxels of a particular design, which require significantly less processing time and resources than performing a simulation on the entirety of a continuous geometry-based design.

Voxel-Based Optimization Technique Using an Evolutionary Algorithm

Figure 25:
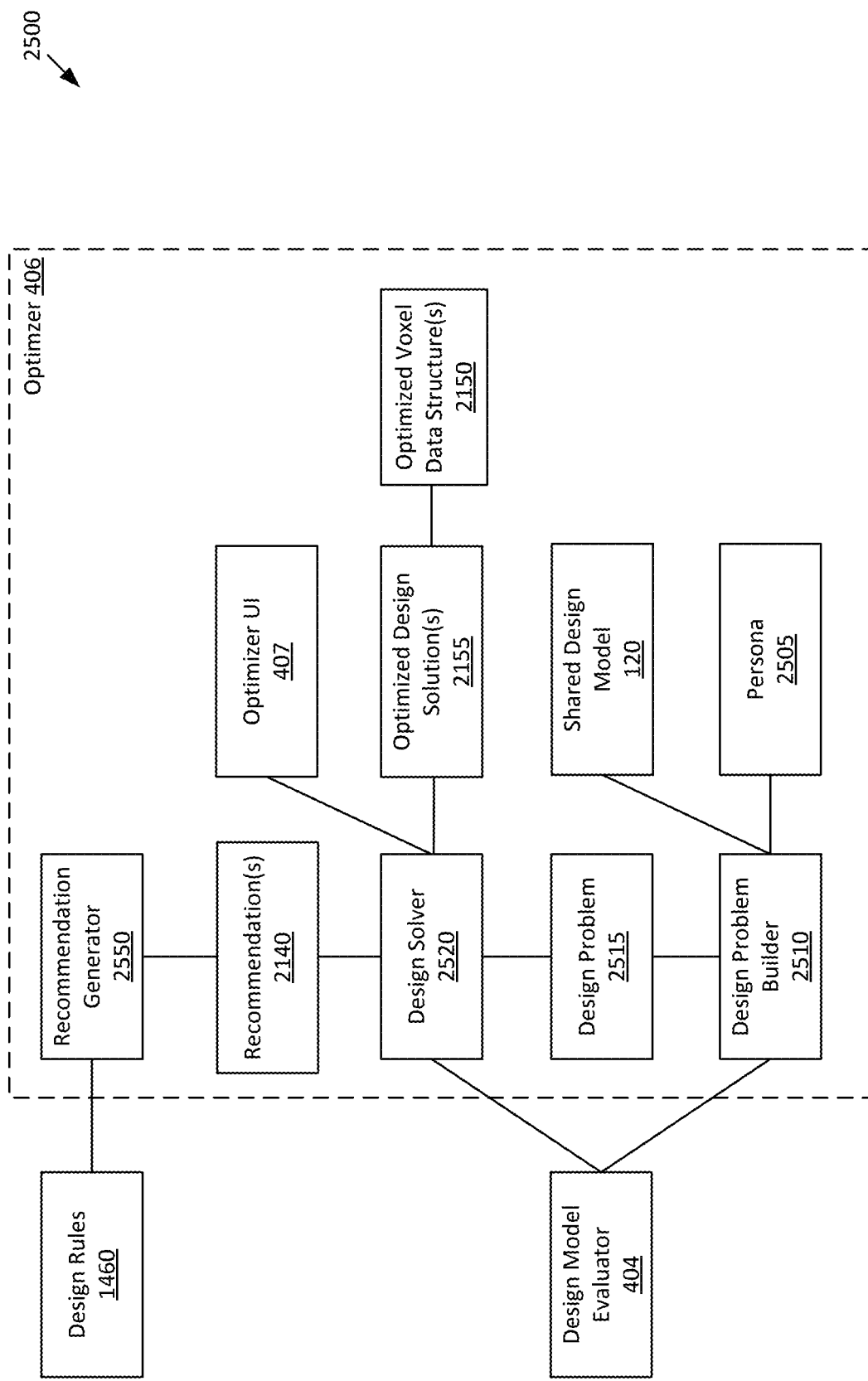
FIG. 25 is a diagram illustrating interactions between components of the evaluation module of FIG. 21 that implements a voxel-based optimization technique, according to various embodiments.

FIG. 25 is a diagram 2500 illustrating interactions between components of the evaluation module 112 of FIG. 21 that implements a voxel-based optimization technique, according to various embodiments. As shown, and without limitation, the diagram 2500 includes the evaluation module 112 comprising the design model evaluator 404 and the optimizer 406. The optimizer 406 comprises various software components and data components including a persona 2505, the shared design model 120, a design problem builder 2510, a design problem 2515, a design solver 2520, a recommendation generator 2550, a set of recommendations 2140, a set of optimized design solutions 2155, a set of optimized voxel data structures 2150, and an optimizer UI 407. In addition, the optimizer 406 accesses the design rules 1460 of the design model editor 114. In some embodiments, the voxel-based optimization technique implements an evolutionary algorithm.

In summary, the design problem builder 2510 receives and analyzes the shared design model 120, the persona 2505, and the design-level performance metrics for the shared design model 120 from the design model evaluator 404. Based on the analysis, the design problem builder 2510 generates the design problem 2515 comprising an optimization problem for the design solver 2520 to solve. After the design problem 2515 is produced, the optimizer 406 invokes the recommendation generator 2550 to generate a set of recommendations 2140. Each recommendation 2140 comprises a set of steps/commands that changes/updates the shared design model 120. The design solver 2520 receives each recommendation 2140 and executes the recommendation 2140 on the shared design model 120 to generate a corresponding optimized design solution 2155 that is represented by an optimized voxel data structure 2150. The design solver 2520 receives the design-level performance metrics for each optimized design solution 2155 from the design model evaluator 404. The design solver 2520 then determines if each optimized design solution 2155 is a valid solution to the design problem 2515 based on a comparison between the design-level performance metrics of the shared design model 120 and the optimized design solution 2155. The shared design model 120 and the valid optimized design solutions 2155 are displayed to the user via the user interface 140 (not shown).

The design problem builder 2510 receives the persona 2505 which indicates the current persona of the user. In some embodiments, the recommendations 2140 and optimized design solutions 2155 are generated based on the current persona of the user. The design problem builder 2510 also receives the shared design model 120 that is represented by the voxel data structure 1450. The design problem builder 2510 invokes the design model evaluator 404 to generate a set of design-level performance metrics for the shared design model 120 based on the voxel-level performance metrics stored to the voxel data structure 1450. The set of design-level performance metrics are then stored to the voxel data structure 1450.

The design problem builder 2510 then generates the design problem 2515 based on an analysis of the persona 2505, shared design model 120, and the set of design-level performance metrics for the shared design model 120. The design problem builder 2510 can generate the design problem 2515 based on one or more specific selected design-level performance metrics within the set of design-level performance metrics. In some embodiments, the selected design-level performance metrics comprise one or more user-selected performance metrics in the set of design-level performance metrics received via the optimizer UI 407.

In other embodiments, the design problem builder 2510 automatically selects the one or more design-level performance metrics. For example, the design problem builder 2510 can select one or more design-level performance metrics that include one or more relatively inferior/poor-scoring performance metrics in the set of design-level performance metrics for the shared design model 120. For example, the selected design-level performance metrics can include the X lowest performing design-level metrics (such as the lowest or two lowest) in the set of design-level metrics for the shared design model 120, wherein X is a positive integer number. For example, the design problem builder 2510 can rank the design-level performance metrics according to performance level and select the X lowest ranked (such as the lowest ranked or two lowest ranked) design-level performance metrics as the design-level performance metrics for being optimized. The X lowest ranked design-level performance metrics are considered the X lowest performing design-level performance metrics. The design-level performance metrics that are relatively lower performing and lower ranked can have a higher priority value for optimization than design-level performance metrics that are relatively higher performing and higher ranked.

The design problem builder 2510 can implement any feasible technique for ranking the design-level performance metrics, including linear or non-linear techniques. For example, the design problem builder 2510 can rank the design-level performance metrics based on the values of the design-level performance metrics and the corresponding ranges of values for the design-level performance metrics. In particular, for each value of a particular design-level performance metric, the design problem builder 2510 can compute a minimum and maximum value range for the particular design-level performance metric and a percentage value that indicates a percentage position/level of the value within the value range. The design problem builder 2510 can then rank the design-level performance metrics according to the percentage values. In other embodiments, non-linear techniques are used to determine the ranking of the design-level performance metrics.

The design problem 2515 comprises an optimization problem for optimizing/improving (minimizing or maximizing) the one or more selected design-level performance metrics of the shared design model 120 based on the current persona 2505. A selected design-level performance metric is optimized/improved by minimizing or maximizing the metric depending on the particular selected design-level performance metric. In particular, a design-level performance metric can be optimized by minimizing/reducing the value of the design-level performance metric, whereas another design-level performance metric can be optimized by maximizing/increasing the value of the design-level performance metric. For example, the carbon footprint metric is optimized by minimizing/reducing the value of the carbon footprint metric. In contrast, the service access metric is optimized by maximizing/increasing the value of the service access metric. Consequently, the objectives of the design problem 2515 are to optimize/improve the one or more selected design-level performance metrics of the shared design model 120 based on the current persona 2505.

After the design problem 2515 is produced, the optimizer 406 invokes the recommendation generator 2550 and the design solver 2520 to generate a set of optimized design solutions 2155 that solve the design problem 2515. In some embodiments, the recommendation generator 2550 and the design solver 2520 solve the design problem 2515 by generating the set of optimized design solutions 2155 using an evolutionary algorithm. An evolutionary algorithm comprises a population-based algorithm that implements heuristic search methods based on natural selection (Darwinian evolution) to generate solutions to optimization problems. Evolutionary algorithms are particularly effective at processing a relatively low number of input parameters (genotypes) and rapidly generating output solutions (phenotypes) based on the input parameters. In particular, an evolutionary algorithm uses a genotype (recommendation) to represent the inputs of a phenotype (solution) to an optimization problem in a form that can be handled by genetic operators (such as crossover operators and mutation operators) of the evolutionary algorithm. Each genotype comprises a particular recommendation 2140, which is converted to a corresponding phenotype by executing the recommendation 2140 on the shared design model 120. The phenotype represents a solution (optimized design solution 2155) to the optimization problem (design problem 2515).

In some embodiments, the recommendation generator 2550 generates the set of recommendations 2140 using an evolutionary algorithm. Each recommendation 2140 comprises an ordered set (sequence) of one or more actionable steps/commands to be executed on the shared design model 120 that changes/updates the shared design model 120. Each command specifies a particular action to be performed at a particular location in the voxel grid 700 of the shared design model 120. In particular, each command specifies three command parameters, including an action parameter, location parameter, and a voxel type parameter. The action parameter specifies an action type, including a placement action or removal action. The location parameter specifies a particular 3D location in the voxel grid 700. The voxel type parameter specifies a particular voxel type.

For example, to add a new voxel to the shared design model 120, an add command can specify adding a new first voxel of a first voxel type at a first location in the voxel grid 700 of the shared design model 120. Therefore, the add command specifies a placement action, the first location, and the first voxel type. Note that for an add command, the specified location is an empty location in the voxel grid 700. To remove a current voxel from the shared design model 120, a remove command can specify removing a current second voxel at a second location in the voxel grid 700 of the shared design model 120. Therefore, the remove command specifies a removal action, and the second location. Note that for a remove command having the removal action, the voxel type is not specified. To modify/enhance a current voxel in the shared design model 120, a enhance command can specify enhancing a current third voxel at a third location in the voxel grid 700 of the shared design model 120 by replacing a current first voxel type with a new second voxel type. Therefore, the enhance command specifies a placement action, the third location, and the second voxel type. Note that for a enhance command, the specified location is a voxel-occupied location in the voxel grid 700 (in contrast to an add command where the specified location is an empty location in the voxel grid 700).

The recommendation generator 2550 can randomly generate different recommendations. To do so, the recommendation generator 2550 generates a plurality of different/unique commands by varying the three command parameters to generate different combinations of the three command parameters. Each different/unique command comprises a unique combination of the three command parameters. The recommendation generator 2550 also generates a plurality of different/unique recommendations by including unique combinations of the unique commands in each recommendation. Each unique recommendation comprises a unique combination of the unique commands. In some embodiments, to generate a set of unique recommendations 2140, the recommendation generator 2550 implements customized Design of Experiments (DoE), crossover operators, and mutation operators that have been developed/customized to generate unique recommendations. The customized crossover and mutation operators work on different command parameters of the commands to generate the unique recommendations. Configuration parameters for the crossover operators and mutation operators can also be specified by a user via the optimizer UI 407, as discussed below in relation to FIG. 26.

The recommendation generator 2550 can randomly generate different recommendations. For the action parameter, the customized mutation operator can randomly change the action type (placement action and removal action). For the voxel type parameter, the customized mutation operator can randomly change the voxel type (such as park, habitat, urban farm, etc.). For the location parameter, the customized crossover operator can randomly change the location.

The customized crossover operator can also be used to randomly recombine commands from a pair of recommendations to generate new and different recommendations. In some embodiments, the customized crossover operator can randomly recombine commands in a selected pair of recommendations based on common crossover operator logic, such as a Two-Point crossover operator. A selected pair of recommendations can be determined to meet certain conditions indicating the pair is compatible for a crossover operation. The selected pair of recommendations includes a first recommendation comprising a first set of commands and a second recommendation comprising a second set of commands. For example, a Two-Point crossover operator can be used to process the pair of recommendations by selecting two random command positions in the first set of commands and the same two command positions in the second set of commands, subdivide each of the first set of commands and the second set of commands into three subsets of commands based on the two command positions, and exchange the middle subsets of commands in the first set of commands and the second set of commands to generate two new recombined recommendations. In this manner, the crossover operator can recombine commands from a pair of recommendations to generate new and different recommendations. In other embodiments, other applicable crossover operators are used to randomly change the location parameter and/or recombine commands from a pair of recommendations.

The ordered set (sequence) of commands of an initial recommendation can also be randomly changed to generate at least one different recommendation having the same set of commands but in a different order/sequence than the initial recommendation. In particular, the initial ordering of the set of commands of the initial recommendation can be randomly generated by a customized DoE. The customized mutation operator can then be used to exchange positions of commands within the initial recommendation to alter the sequential ordering of the commands to generate a different recommendation. Note that two recommendations having the same set of commands but executed on the shared design model 120 in a different sequence can have a different resulting effect on the shared design model 120.

The recommendation generator 2550 can further generate the recommendations 2140 based on various configuration parameters of the optimizer 406. For example, a configuration parameter can specify the maximum number of commands in each recommendation (such as four commands per recommendation). For example, a configuration parameter can specify the maximum number of recommendations and/or optimized solutions to be generated by the optimizer 406. In some embodiments, the configuration parameters of the optimizer 406 can be received from a user via the optimizer UI 407, as discussed below in relation to FIG. 26. In other embodiments, the configuration parameters of the optimizer 406 can comprise default configuration parameters.

For each generated command of a recommendation 2140, the recommendation generator 2550 determines if the command is valid based on the design rules 1460. As discussed above, the design model editor 114 enforces the set of design rules 1460 during the real-time collaboration session to ensure that the shared design model 120 is updated based on only valid user inputs (persona edits 410). The set of design rules 1460 can also be applied to the generated commands to ensure that each recommendation 2140 includes only valid commands so that the shared design model 120 is later updated based on only valid commands.

In some embodiments, the set of design rules 1460 are applied to each generated command based on the current persona 2505 of the user. Each persona 2505 has a different set of capabilities in regards to operations that can be performed on the shared design model 120, such as the ability to make a subset of inputs for adding, modifying, and/or removing particular types of voxels. In these embodiments, the set of design rules 1460 include different subsets of design rules for different personas. For example, a first subset of design rules can apply to a first persona and a second subset of design rules can apply to a second persona, the second subset of design rules being different than the first subset of design rules. In some embodiments, the set of design rules 1460 also include at least some design rules that apply to all personas 2505 (are applied regardless of the type of persona).

If the recommendation generator 2550 determines that the generated command is valid based on the design rules 1460 and the current persona 2505, the command is included in the recommendation 2140. If the recommendation generator 2550 determines that the generated command is not valid based on the design rules 1460 and the current persona 2505, the command is not included in the recommendation 2140. In this manner, the recommendation generator 2550 validates each command of a recommendation 2140 as a command that the current persona 2505 is authorized to perform, which ensures that the entire recommendation 2140 is valid. Therefore, the recommendation generator 2550 generates the set of recommendations 2140 based on the current persona 2505 of the user, wherein the set of different recommendations 2140 comprises only those recommendations 2140 that can be performed by the current persona 2505 (that the current persona 2505 is authorized to perform).

In some embodiments, the design solver 2520 generates the set of optimized design solutions 2155 based on the set of recommendations 2140 using an evolutionary algorithm. In general, the design solver 2520 receives the design problem 2515 from the design problem builder 2510 and each recommendation 2140 from the recommendation generator 2550. The design solver 2520 executes each recommendation 2140 on the shared design model 120 to generate a corresponding optimized design solution 2155. The design solver 2520 invokes the design model evaluator 404 to compute design-level performance metrics for the optimized design solution 2155. The design solver 2520 then determines if the optimized design solution 2155 is a valid solution to the design problem 2515 based on a comparison between the design-level performance metrics of the shared design model 120 and the optimized design solution 2155.

In particular, the design solver 2520 executes each recommendation 2140 (genotype) on the shared design model 120 to generate a corresponding optimized design solution 2155 (phenotype). Each recommendation 2140 comprises an ordered set of one or more commands, wherein the design solver 2520 executes each command in the specified order on the shared design model 120. Each executed command adds, removes, or modifies a voxel in the shared design model 120 to generate the optimized design solution 2155. Consequently, executing a recommendation 2140 on the shared design model 120 creates a difference/delta between the shared design model 120 and the corresponding optimized design solution 2155. As discussed above, a set of different voxels comprises voxels that are different between the shared design model 120 and the optimized design solution 2155. The recommendation 2140 executed on the shared design model 120 specifies this set of different voxels, each voxel in the set of different voxels corresponding to a particular command in the recommendation 2140.

After the design solver 2520 generates an optimized design solution 2155, the design solver 2520 generates and stores an optimized voxel data structure 2150 that represents the optimized design solution 2155. For example, the optimized voxel data structure 2150 can be generated by copying the voxel data structure 1450 for the shared design model 120 and modifying the voxel data structure 1450 based on the corresponding recommendation 2140 to generate the optimized voxel data structure 2150. In particular, a set of entries 1501 of the optimized voxel data structure 2150 can be modified based on the ordered set of commands (sequence of commands) of the recommendation 2140, each entry 1501 in the set of entries corresponding to a particular command in the set of commands. In addition, the voxel-level performance metrics for each voxel in the optimized design solution 2155 is re-computed and stored in the performance metrics field 1520 in the corresponding entry 1501 of the optimized voxel data structure 2150. The set of different voxels between the shared design model 120 and the optimized design solution 2155 will cause one or more voxel-level performance metrics of one or more voxels of the optimized design solution 2155 to change from the shared design model 120. Therefore, the voxel-level performance metrics of the voxels of the optimized design solution 2155 can be re-computed and stored to the optimized voxel data structure 2150 (via similar processes used for determining the voxel-level performance metrics of the voxels of the shared design model 120 discussed above).

For each optimized design solution 2155, the design solver 2520 invokes the design model evaluator 404 to compute a set of design-level performance metrics for the optimized design solution 2155. The design model evaluator 404 computes the set of design-level performance metrics for the optimized design solution 2155 based on the voxel-level performance metrics stored to the corresponding optimized voxel data structure 2150 (via similar processes used for determining the design-level performance metrics of the shared design model 120 discussed above). For each the optimized design solution 2155, the design solver 2520 determines if the optimized design solution 2155 is a valid solution to the design problem 2515 based on a comparison between the design-level performance metrics of the shared design model 120 and the optimized design solution 2155.

In some embodiments, the optimized design solution 2155 is a valid solution if at least one design-level performance metric of the optimized design solution 2155 is improved over at least one corresponding design-level performance metric of the shared design model 120. An improved design-level performance metric of the optimized design solution 2155 can have a lower/decreased or higher/increased value relative to the shared design model 120 depending on the particular design-level performance metric. In other embodiments, the set of design-level performance metrics include at least one selected design-level performance metric (such as a user-selected metric or a relatively poor-scoring performance metric). In these embodiments, the optimized design solution 2155 is a valid solution if at least one of the selected design-level performance metrics of the optimized design solution 2155 is improved over at least one corresponding design-level performance metric of the shared design model 120. Note that in some embodiments, a valid optimized design solution 2155 can have at least one improved design-level performance metric, but can also have one or more degraded/worsened design-level performance metrics relative to the shared design model 120 (known as a "tradeoff" solution). Such "tradeoff" solutions can still be considered valid and later presented to the user via the user interface 140. In further embodiments, the optimized design solution 2155 is a valid solution if at least one design-level performance metric of the optimized design solution 2155 is improved over at least one corresponding design-level performance metric of the shared design model 120 and no design-level performance metrics are degraded/worsened relative to the shared design model 120.

If the design solver 2520 determines that the optimized design solution 2155 is a valid solution, the optimized design solution 2155 is retained. If the design solver 2520 determines that the optimized design solution 2155 is not a valid solution, the optimized design solution 2155 is discarded. For each valid and retained optimized design solution 2155, the design solver 2520 links/associates the optimized design solution 2155 with the corresponding recommendation 2140 that was used to generate the optimized design solution 2155 and the design-level performance metrics computed for the optimized design solution 2155. The optimized design solution 2155 and the corresponding recommendation 2140 and the design-level performance metrics can be displayed to the user via the user interface 140. The above process can be repeated until a predetermined number of valid optimized design solutions 2155 is generated.

In some embodiments, a customized DoE generates an initial population in the evolutionary algorithm. The customized DoE utilizes certain procedural content generation (PCG) techniques to create meaningful structures by arranging the ordered positions of the commands in a recommendation, such as a stack, a bridge, etc. Based on the design problem 2515, to create a DoE of a set of recommendations, each recommendation consisting of R total commands, the limited number of commands are used to create meaningful voxel structures using PCG. For instance, in the case of $R=W+X+Y+Z$, for each recommendation, the DoE can allocate W commands to create one or more bridges, each bridge comprising a horizontal row of voxels connected to existing voxels at both ends. The DoE can also allocate X commands to create one or more stacks, each stack comprising a vertical row of voxels on top of an existing voxel. The DoE can also allocate Y commands to create one or more stair (diagonal) structures connected to an existing voxel. The DoE can further allocate Z commands to randomly place voxels on designs with previous commands in the executed recommendation.

FIG. 26 illustrates an example user screen 2600 of the optimizer UI 407 of FIG. 25, according to various embodiments. As shown, and without limitation, the user screen 2600 of the optimizer UI 407 includes a plurality of user-selectable configuration parameters 2610 for the optimizer 406. The configuration parameters 2610 includes a persona selector 2620, a maximum number of commands selector 1830, a maximum number of solutions selector 1840, a crossover probability selector 1850, mutation probability selector 1860, a performance metrics selector 1870, and a start selector 1890.

The persona selector 2620 can be used to select a current persona 2505 of the user. The maximum number of commands selector 1830 can be used to select the maximum number of commands for each generated recommendation 2140. The maximum number of solutions selector 1840 can be used to select the maximum number of valid optimized design solutions 2155 generated by the optimizer 406 for a given shared model design 120. The crossover probability selector 1850 and mutation probability selector 1860 configure parameters for the crossover operators and mutation operators of the evolutionary algorithm. For example, both the crossover probability and the mutation probability can comprise real numbers between 0.0 and 1.0, inclusively. Typically, the crossover probability is significantly higher than the mutation probability due to having different effects on the evolution algorithm. The crossover operator recombines commands from two recommendations to generate different recommendations. The mutation operator helps prevent the recommendation population from getting prematurely trapped in a local optimum by randomly changing a small number of commands in a recommendation. However, the mutation should be limited to a low probability to prevent excessive disruption over an evolved recommendation population.

The performance metrics selector 1870 can be used to select one or more specific design-level performance metrics in a set of design-level performance metrics to be optimized by the optimizer 406. The design problem builder 2510 can generate the design problem 2515 based on the one or more selected design-level performance metrics within the set of design-level performance metrics. The performance metrics selector 1870 can also be used to select different weights for one or more design-level performance metrics in the set of design-level performance metrics. The start selector 1890 can be used to initiate/trigger the optimization technique of the optimizer 406 to generate the set of optimized design solutions 2155 for a given shared model design 120.

Figure 27:
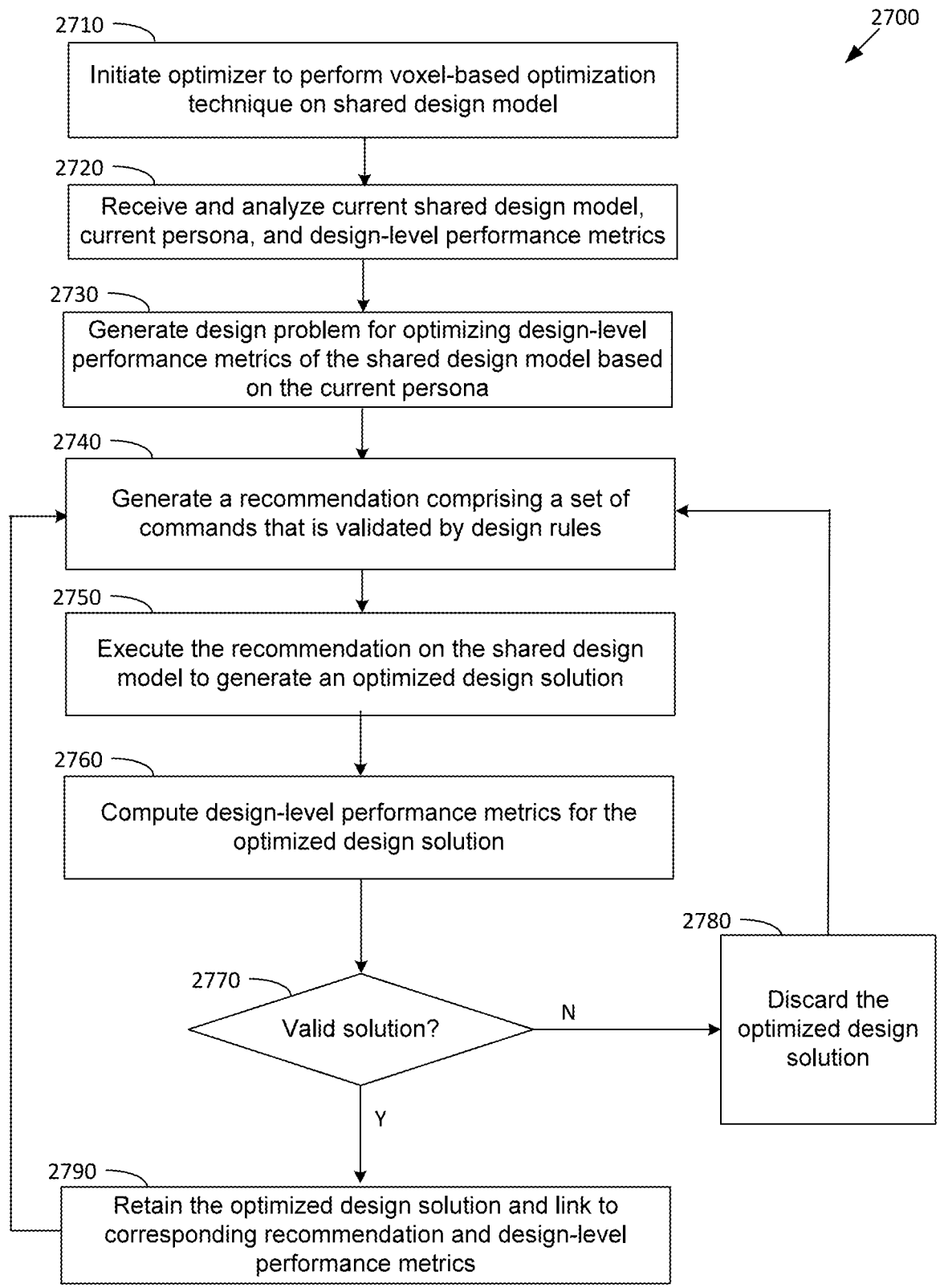
FIG. 27 sets forth a flow diagram of method steps for performing a voxel-based optimization technique, according to various embodiments.

FIG. 27 sets forth a flow diagram of method steps for performing a voxel-based optimization technique, according to various embodiments. Although the method steps are described with reference to the systems of FIGS. 1-11, 14-19, 21-23, and 25-26, persons skilled in the art will understand that any system configured to implement the method steps, in any order, falls within the scope of the disclosed embodiments. In some embodiments, the steps of the method 2700 are performed by various components of the generative design application 110 (such as the design model editor 114, and the evaluation module 112) and the user interface 140.

As shown, a method 2700 begins at step 2710, where the optimizer 406 is triggered/initiated to perform the voxel-based optimization technique. In some embodiments, the optimizer 406 is triggered to perform the voxel-based optimization technique in response to a user updating the shared design model 120 via the user interface 140 by submitting a set of persona edits 410. In other embodiments, the optimizer 406 is triggered to perform the voxel-based optimization technique in response to a user selection for starting the optimization process. In some embodiments, the voxel-based optimization technique implements an evolutionary algorithm.

At step 2720, design problem builder 2510 of the optimizer 406 receives and analyzes the current shared design model 120, the persona 2505, and a set of design-level performance metrics for the current shared design model 120. The current shared design model 120 can comprise the shared design model 120 after being updated by received user inputs. The current shared design model 120 is represented by a voxel data structure 1450. The persona 2505 indicates the current persona of the user. To receive the set of design-level performance metrics for the current shared design model 120, the design problem builder 2510 invokes the design model evaluator 404 to generate the set of design-level performance metrics based on the voxel-level performance metrics stored to the voxel data structure 1450. The design-level performance metrics are then stored to the voxel data structure 1450.

At step 2730, the design problem builder 2510 generates the design problem 2515 based on the analysis of the persona 2505, shared design model 120, and the set of design-level performance metrics for the shared design model 120. The design problem 2515 comprises an optimization problem for optimizing/improving (minimizing or maximizing) one or more design-level performance metrics of the shared design model 120 based on the current persona 2505. In some embodiments, the one or more design-level performance metrics to be optimized comprise one or more specific selected design-level performance metrics within the set of design-level performance metrics (such as the X lowest performing design-level performance metrics or user-selected design-level performance metrics).

At step 2740, the recommendation generator 2550 generates a recommendation 2140. The recommendation 2140 comprises an ordered set of one or more actionable commands to be executed on the shared design model 120. Each command specifies a particular action to be performed at a particular location in the voxel grid 700 of the shared design model 120. Each command specifies three command parameters, including an action parameter, location parameter, and a voxel type parameter. The recommendation generator 2550 can generate different/unique recommendations using an evolutionary algorithm. In particular, crossover and mutation operators of the evolutionary algorithm can operate on different parameters of the commands to generate unique commands (by varying the three command parameters) and unique combinations of the unique commands to generate different recommendations. The recommendation generator 2550 can generate the recommendation 2140 based on various configuration parameters of the optimizer 406, such as the maximum number of commands for each recommendation 2140. The configuration parameters of the optimizer 406 can be received via the optimizer UI 407. The recommendation generator 2550 also confirms that the recommendation 2140 is valid for the current persona 2505 based on the design rules 1460.

At step 2750, the design solver 2520 executes the recommendation 2140 (genotype) on the shared design model 120 to generate a corresponding optimized design solution 2155 (phenotype). Each recommendation 2140 comprises an ordered set of commands, wherein the design solver 2520 executes each command in the specified order on the shared design model 120. As such, each recommendation 2140 specifies a sequence of commands that are executed in sequential order in accordance with the recommendation 2140. The design solver 2520 generates and stores an optimized voxel data structure 2150 that represents the optimized design solution 2155. The voxel-level performance metrics for each voxel in the optimized design solution 2155 is computed and stored in the performance metrics field 1520 in the corresponding entry 1501 of the optimized voxel data structure 2150.

At step 2760, the design model evaluator 404 computes a set of design-level performance metrics for the optimized design solution 2155 based on the voxel-level performance metrics stored to the corresponding optimized voxel data structure 2150. At step 2770, the design solver 2520 determines if the optimized design solution 2155 is a valid solution to the design problem 2515 based on a comparison between the design-level performance metrics of the shared design model 120 and the optimized design solution 2155. In some embodiments, the optimized design solution 2155 is a valid solution if at least one design-level performance metric (such as a specific selected design-level performance metric) of the optimized design solution 2155 is improved relative to at least one corresponding design-level performance metric of the shared design model 120.

If the design solver 2520 determines the optimized design solution 2155 is not a valid solution (at step 2770—No), the optimized design solution 2155 is discarded at step 2780 and the method 27 continues at step 2740, whereby the recommendation generator 2550 generates a next different recommendation 2140. If the design solver 2520 determines the optimized design solution 2155 is a valid solution (at step 2770—Yes), the method 27 continues at step 2790. At step 2790, the optimized design solution 2155 is retained and linked/associated with the corresponding recommendation 2140 that was used to generate the optimized design solution 2155 and the design-level performance metrics computed for the optimized design solution 2155. The method 27 then continues at step 2740, whereby the recommendation generator 2550 generates a next different recommendation 2140.

The above steps 2740-2790 of the method 2700 can be repeated iteratively until a predetermined number of valid optimized design solutions 2155 is generated. In some embodiments, the predetermined number of valid optimized design solutions 2155 can comprise a default number or can be specified by the user via the optimizer UI 407.

Voxel-Based Recommendation Visualizations

As discussed above, the evaluation module 112 applies a voxel-based optimization technique on the shared design model 120 to generate a set of recommendations 2140 for optimizing the shared design model 120. Each recommendation 2140 improves one or more design-level performance metrics of the shared design model 120 if applied to the shared design model 120. In particular, each recommendation 2140 comprises a sequence of steps/commands that changes/updates the shared design model 120. Each command in the sequence of steps/commands can specify an action (such as add voxel, remove voxel, enhance voxel), a 3D location in the voxel grid 700, and a voxel type (for the add and enhance actions).

In some embodiments, the evaluation module 112 includes a recommender 420 that receives recommendations 2140 from the optimizer 406 and generates recommendation visualizations 430 of the received recommendations 2140. In these embodiments, for each recommendation, the recommender 420 can generate a corresponding recommendation visualization 430 comprising a set of recommendation markers that visually illustrates the sequence of steps/commands specified in the recommendation 2140. In particular, each recommendation marker in the recommendation visualization 430 graphically represents a particular command in the sequence of steps/commands specified in the recommendation 2140. The set of recommendation markers can be visually integrated with a visualization of the shared design model 120 to enable easy visualization of the corresponding recommendation on the shared design model 120. The set of recommendation markers can also be rendered to be visually distinct from the voxels of the shared design model 120 to also enable easy visualization of the corresponding recommendation on the shared design model 120.

As discussed above in relation to FIG. 26, recommendations 2140 are generated based on various configuration parameters 2610 of the optimizer 406 that can be specified via the optimizer UI 407. For example, the configuration parameters 2610 can include a maximum number of commands selector 1830 to select the maximum number of commands for each generated recommendation 2140. In this manner, the user can control the increment amount of each iteration of the optimization process. In particular, the user can control the increment amount that each recommendation produces towards the completion of the design process. For example, the user can specify a small increment amount that each recommendation produces by specify a relatively low maximum number of commands for each recommendation 2140 (such as two maximum commands per recommendation). The user can specify a moderate increment amount that each recommendation produces by specify a medium maximum number of commands for each recommendation 2140 (such as four maximum commands per recommendation). Alternatively, the user can specify a large increment amount that each recommendation produces by specify a high maximum number of commands for each recommendation 2140 (such as ten maximum commands per recommendation).

As discussed above, conventional optimization techniques generate optimized design solutions that represent completed design solutions for a current design model. For example, a conventional optimized design solution can represent a completed design solution that is achieved by executing 25-30 steps/commands on the current design model. As such, conventional optimization techniques significantly limit user control and user involvement in the optimization process. In contrast, the disclosed techniques enable the user to specify the maximum number of steps/commands in each recommendation, which controls the amount of optimization increment of the optimization process on the current design model. As such, the current design model can be optimized in smaller increments, one recommendation at a time, to iteratively complete optimization of the current design model, rather than completing optimization in one iteration. Therefore, the disclosed techniques provide greater user control and user involvement in the optimization process relative to conventional optimization techniques that implement "all or nothing" optimization of the design model.

In addition, in some embodiments, a recommendation visualization 430 representing a recommendation can comprise an interactive visualization. The recommendation visualization 430 comprises a set of recommendation markers, each recommendation marker graphically representing a corresponding command in the recommendation and provides detailed information for the corresponding command. In these embodiments, the recommender 420 configures each recommendation marker to be interactive to enable a user to execute or ignore the corresponding command in the recommendation. In this manner, the disclosed techniques provide even greater user control and user involvement in the optimization process relative to conventional optimization techniques by providing detailed information and user control for each command in the recommendation.

Figure 28:
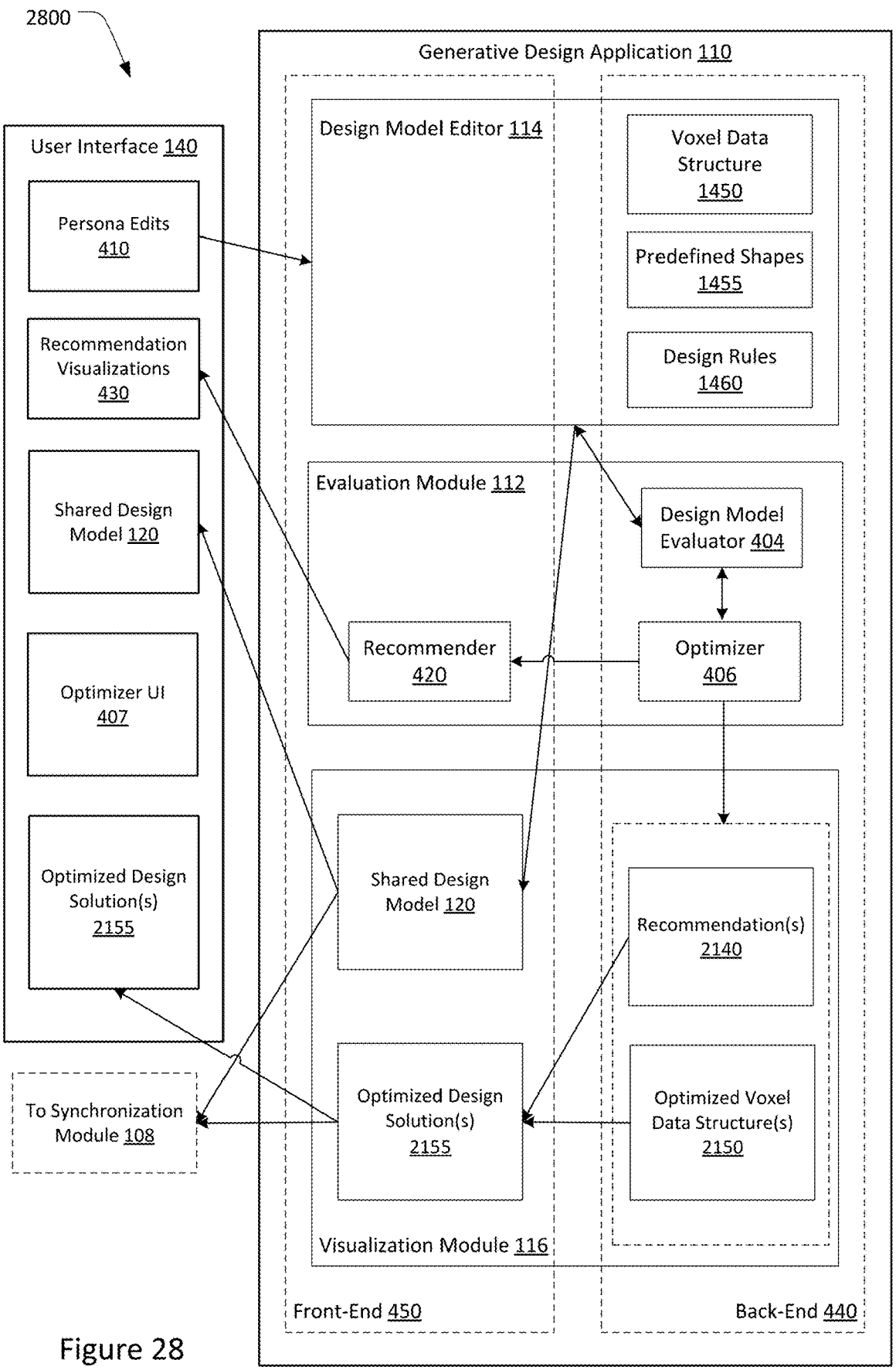
FIG. 28 is a diagram illustrating interactions between components of a workstation instance included in the system of FIG. 1 that implements recommendation visualizations, according to other various embodiments.

FIG. 28 is a diagram illustrating interactions between components of a workstation instance included in the system of FIG. 1 that implements recommendation visualizations, according to other various embodiments. As shown, and without limitation, the diagram 2800 includes the generative design application 110 and the user interface 140. The generative design application 110 includes the design model editor 114, the evaluation module 112, and the visualization module 116. As shown, the evaluation module 112 includes a recommender 420 that receives recommendations 2140 from the optimizer 406 and generates recommendation visualizations 430 of the received recommendations 2140. In these embodiments, for each recommendation 2140, the recommender 420 can cause the user interface 140 to display a corresponding recommendation visualization 430. The various components of the generative design application 110 and the user interface 140 are discussed in detail in relation to FIG. 21 and are not discussed in detail here.

Figure 29:
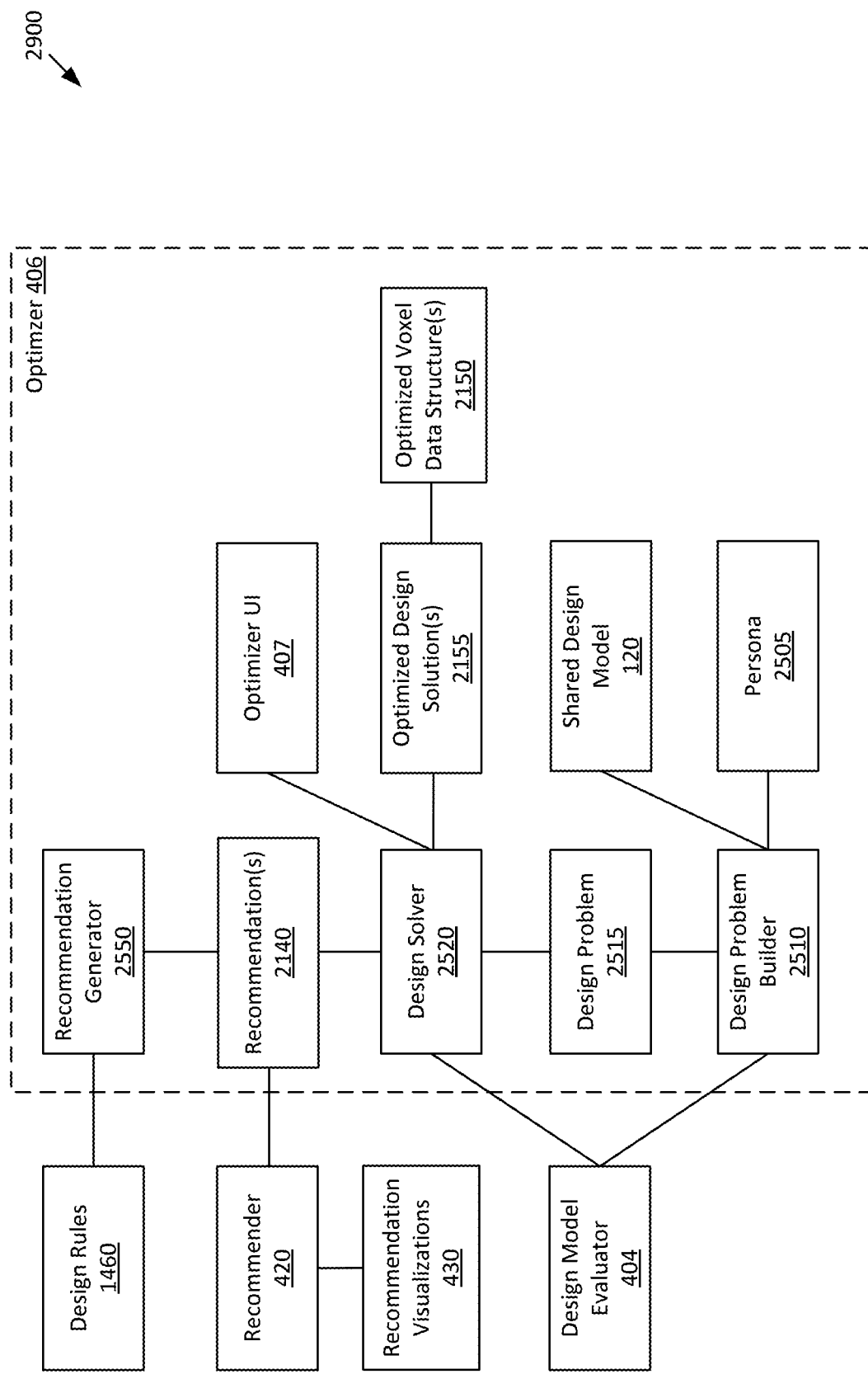
FIG. 29 is a diagram illustrating interactions between components of the evaluation module of FIG. 28 that implements a recommendation visualization technique, according to various embodiments.

FIG. 29 is a diagram illustrating interactions between components of the evaluation module of FIG. 28 that implements a recommendation visualization technique, according to various embodiments. As shown, and without limitation, the diagram 2900 includes the evaluation module 112 comprising the design model evaluator 404, the optimizer 406, and the recommender 420. The optimizer 406 comprises various software components and data components including the shared design model 120, a set of recommendations 2140, a set of optimized design solutions 2155, a set of optimized voxel data structures 2150, and an optimizer UI 407. The various components of the evaluation module 112 are discussed in detail in relation to FIG. 25 and are not discussed in detail here.

In summary, the optimizer 406 generates a set of recommendations 2140, each recommendation 2140 comprising a sequence of steps/commands that changes/updates the shared design model 120. The design solver 2520 executes each recommendation 2140 on the shared design model 120 to generate a corresponding optimized design solution 2155 that is represented by an optimized voxel data structure 2150. The design solver 2520 receives design-level performance metrics for the shared design model 120 and each optimized design solution 2155 from the design model evaluator 404. The design solver 2520 then determines if each optimized design solution 2155 is a valid solution to the design problem 2515 based on a comparison between the design-level performance metrics of the shared design model 120 and the optimized design solution 2155.

Each valid recommendation 2140 executed on the shared design model 120 generates a corresponding valid optimized design solution 2155 for the shared design model 120. Each valid recommendation 2140 specifies a set of different voxels that are different between the optimized design solution 2155 and the shared design model 120. In these embodiments, the recommendation visualization 430 visually highlights (makes visually distinct) the set of different voxels between the optimized design solution 2155 and the shared design model 120 relative to a set of common voxels that are common/mutual to the optimized design solution 2155 and the shared design model 120. In particular, each recommendation marker in the recommendation visualization 430 graphically represents a particular voxel in the set of different voxels. Therefore, each recommendation marker in the recommendation visualization 430 graphically represents a particular command in the recommendation 2140, and a particular voxel in the set of different voxels.

Each valid optimized design solution 2155 (represented as an optimized voxel data structure 2150) has a corresponding valid recommendation 2140 that was used to generate the valid optimized design solution 2155. Therefore, each valid optimized design solution 2155 has associated design-level performance metrics (stored to the optimized voxel data structure 2150) that is also associated with the corresponding valid recommendation 2140. The optimized voxel data structure 2150 also stores voxel-level performance metrics 1520 for each voxel in the set of different voxels between the optimized design solution 2155 and the shared design model 120. In some embodiments, the recommender 420 receives a valid recommendation 2140, design-level performance metrics associated with the valid recommendation 2140, voxel-level performance metrics 1520 for each voxel in the set of different voxels, and design-level performance metrics of the shared model design 120 from the optimizer 406, and generates the recommendation visualizations 430 based on the valid recommendation 2140, associated design-level performance metrics, voxel-level performance metrics 1520 for the set of different voxels, and design-level performance metrics of the shared model design 120.

Figure 30:
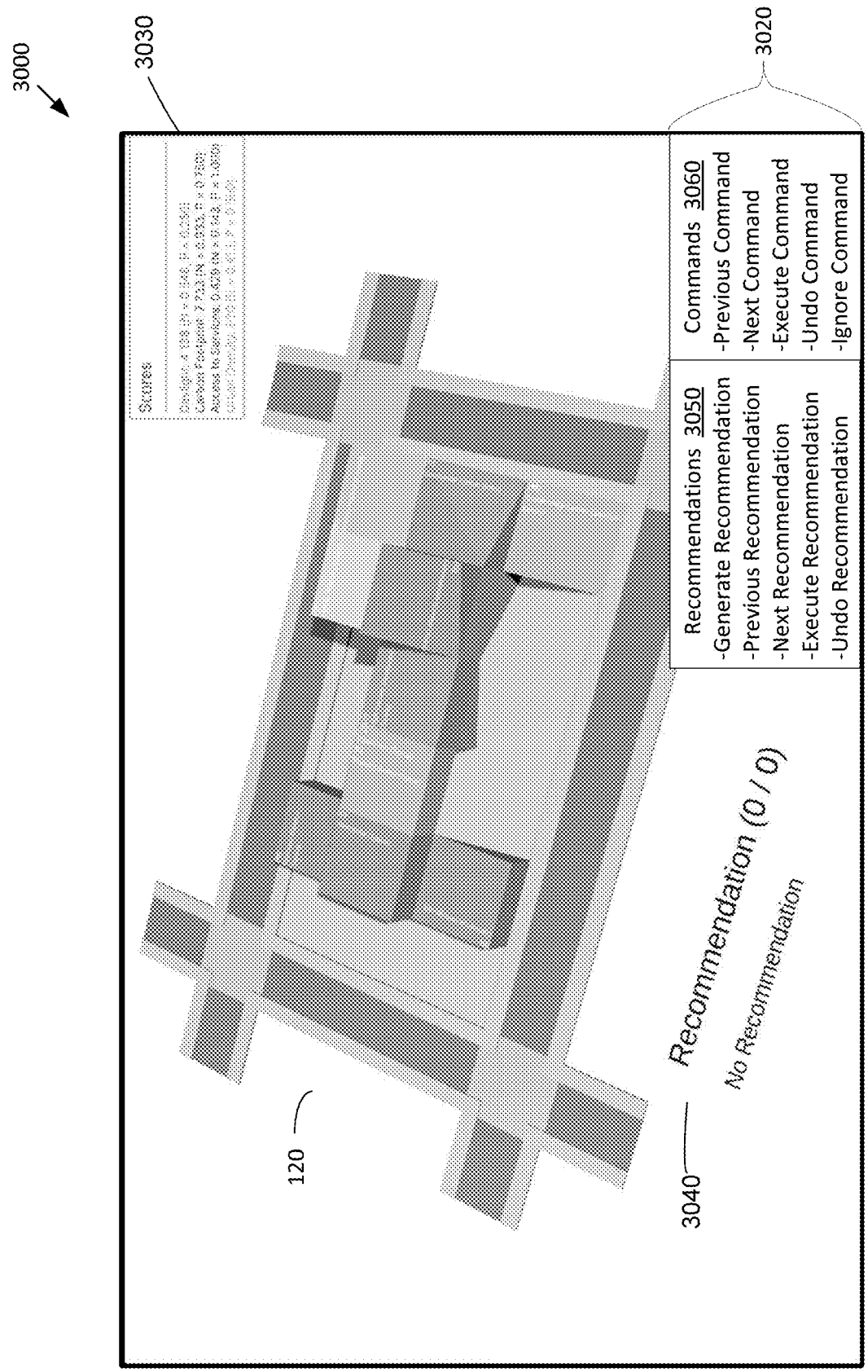
FIG. 30 illustrates an exemplar user screen for a visualization of a shared design model prior to displaying a recommendation visualization, according to various embodiments.

FIG. 30 illustrates an exemplar user screen 3000 for a visualization of a shared design model prior to displaying a recommendation visualization, according to various embodiments. As shown, and without limitation, the example user screen 3000 includes a visualization of a shared design model 120, an action panel 3020, a scoring panel 3030, and a recommendation panel 3040. The generative design application 110/recommender 420 can cause the user screen 3000 to be displayed via the user interface 140. The user interface 140 enables the user to interact with the shared design model 120 and the action panel 3020. The user can also modify/edit the shared design model 120 via persona edits 410.

The action panel 3020 includes controls to perform user-selectable actions associated with the shared design model 120 and/or various recommendation visualizations 430 (not shown). For example, the action panel 3020 include can include various actions shown in the participant action panel 820 of FIG. 8, such as actions to add, move, and/or remove block items, move the camera view, change the candidate design solutions in the shared design space 130, and exit the generative design application 110 (not shown).

In addition, the action panel 3020 can include various recommendation-based actions 3050, such as generate recommendations, previous recommendation, next recommendation, execute recommendation, and undo recommendation. Selection of the "generate recommendations" action can initiate the evaluation module 112 to generate a set of recommendations 2140 for the current shared design model 120 and generate a set of recommendation visualizations 430 corresponding to the set of recommendations 2140. The "previous recommendation" action and "next recommendation" action can be selected to toggle/step through the various recommendations 2140 and corresponding recommendation visualizations 430 generated by the evaluation module 112. The "execute recommendation" action can be selected to execute the current recommendation 2140 that is graphically represented by a currently displayed recommendation visualization 430. Executing the current recommendation 2140 comprises executing the set of commands specified in the current recommendation 2140 on an initial shared design model 120 to produce an updated shared design model 120. Another consequence of executing the current recommendation 2140 is clearing the current set of recommendations, since the set of recommendations is now outdated and not applicable to the updated shared design model 120. The "undo recommendation" action can be selected to undo/reverse the most recently executed recommendation 2140, comprising undoing/reversing the set of commands specified in the most recently executed recommendation 2140 to produce the initial shared design model 120. Another consequence of executing the "undo recommendation" action is clearing the current set of recommendations, since the set of recommendations is now outdated and not applicable to the initial shared design model 120.

The action panel 3020 can further include various command-based actions 3060, such as previous command, next command, execute command, undo command, and ignore command. The "previous command" action and "next command" action can be selected to toggle/step through the set of commands specified in a current recommendation 2140 that is graphically represented by a currently displayed recommendation visualization 430 comprising a set of recommendation markers corresponding to the set of commands. In particular, the "previous command" action and "next command" action can be used to select a current recommendation marker in the set of recommendation markers that corresponds to a current command in the set of commands. The currently selected recommendation marker/command can be graphically highlighted in the recommendation visualization 430 to visually distinguish the currently selected recommendation marker/command from the other recommendation markers/commands of the recommendation visualization 430.

The "execute command" action can be selected to execute the currently selected recommendation marker/command on an initial shared design model 120 to produce an updated shared design model 120. The "undo command" action can be selected to undo/reverse the most recently executed command on the updated shared design model 120 to produce the initial shared design model 120. The "ignore command" action can be selected to ignore the currently selected recommendation marker/command, comprising not executing the currently selected command, removing the currently selected recommendation marker from the current recommendation visualization 430, and removing the currently selected command from the current recommendation 2140.

The score panel 3030 displays design-level performance metrics associated with the shared design model 120 that are generated by the design model evaluator 404. The design model evaluator 404 can update the design-level performance metrics in real time as a user modifies the shared design model 120, for example, by submitting persona edits 410, executing a current recommendation, undoing an executed recommendation, executing a current command, and/or undoing an executed command.

In some embodiments, the score panel 3030 displays the design-level performance metrics with particular graphical appearances based on the relative performance levels of the design-level performance metrics. The design-level performance metrics can be divided into a plurality of different classifications based on the relative performance levels of the design-level performance metrics, such as relatively low performing metrics, relatively medium performing metrics, and relatively high performing metrics. Note that the relatively low performing metrics with have relatively higher priority (P) values for optimization and relatively high performing metrics with have relatively lower priority (P) values for optimization. In these embodiments, the low performing metrics are displayed with a first graphical appearance, the medium performing metrics are displayed with a second graphical appearance, and the high performing metrics are displayed with a third graphical appearance, wherein each of the first graphical appearance, second graphical appearance, and third graphical appearance comprise different graphical appearances. For example, the low performing metrics can be displayed with red text, the medium performing metrics can be displayed with yellow text, and the high performing metrics can be displayed with green text.

The design-level performance metrics displayed in the score panel 3030 will be constantly updated as recommendations are applied to the shared design model 120. The disclosed techniques implement an iterative design process in which incremental recommendations are applied to the shared design model 120, which incrementally improves the various design-level performance metrics. For example, an initial shared design model can have associated design-level performance metrics that are mostly categorized as low performing metrics that are displayed with a first graphical appearance (such as red text). After several iterations of executing recommendations on the shared design model 120, the updated shared design model can have associated design-level performance metrics that are mostly categorized as medium performing metrics that are displayed with a second graphical appearance (such as yellow text). After more iterations of executing recommendations on the shared design model 120, a final shared design model can have associated design-level performance metrics that are mostly categorized as high performing metrics that are displayed with a third graphical appearance (such as green text).

The recommender 420 can be configured to determine the relative performance levels of the design-level performance metrics for categorizing each design-level performance metric into the appropriate classification. The recommender 420 can implement any feasible technique for categorizing the design-level performance metrics into the appropriate classifications, including linear or non-linear techniques. For example, for each design-level performance metric, the recommender 420 can determine a plurality of classifications and a range of values associated with each classification. For example, the range of values for each classification can be set by a user or by using default values. Each design-level performance metric is then included a particular classification having an associated range of values that includes the current value for the design-level performance metric.

The recommendation panel 3040 displays detailed information for a current recommendation 2140 that is graphically represented by a currently displayed recommendation visualization 430. As shown, the recommendation panel 3040 displays "Recommendation 0/0" which indicates that no recommendations for the shared design model 120 have been generated yet.

As discussed above, selection of the "generate recommendations" action in the action panel 3020 can initiate the evaluation module 112 to generate a set of recommendations 2140 for the current shared design model 120 and generate a set of recommendation visualizations 430. In some embodiments, the evaluation module 112 can also be initiated to generate the set of recommendations 2140 and the set of recommendation visualizations 430 in response to receiving persona edits 410 for the shared design model 120.

Figure 31:
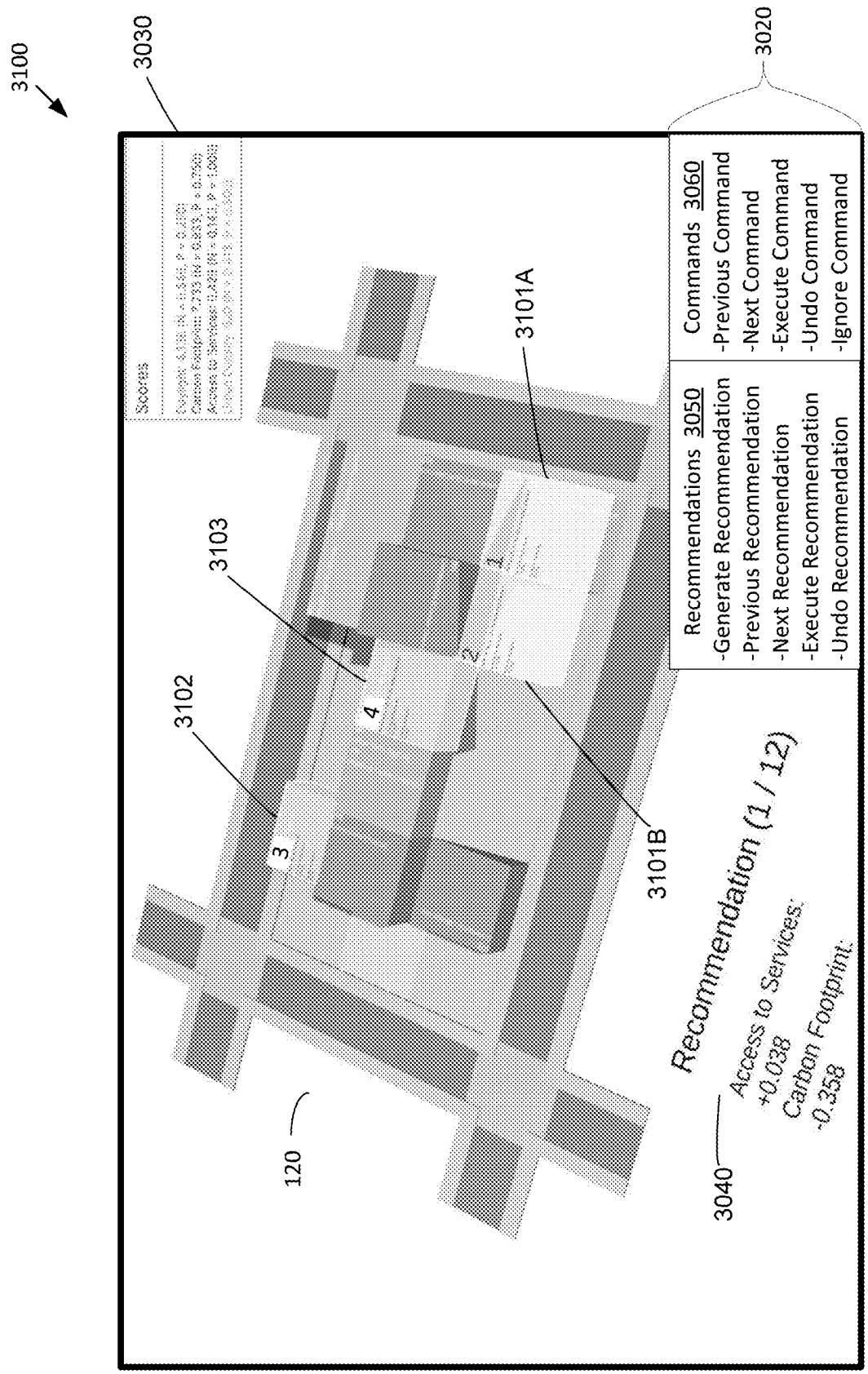
FIG. 31 illustrates an exemplar user screen for a first recommendation visualization for the shared design model of FIG. 30, according to various embodiments.

FIG. 31 illustrates an exemplar user screen 3100 for a first recommendation visualization for the shared design model of FIG. 30, according to various embodiments. As shown, and without limitation, the example user screen 3100 includes the shared design model 120, the action panel 3020, the scoring panel 3030, and the recommendation panel 3040 that are discussed in detail in relation to FIG. 30. In the example of FIG. 31, the user has selected the "generate recommendations" action which initiates the evaluation module 112 to generate a set of recommendations 2140 for the shared design model 120 and display a first recommendation visualization 430 corresponding to a first recommendation in the set of recommendations 2140.

The first recommendation 2140 comprises a sequence of one or more actionable steps/commands that can be executed on the shared design model 120 that changes/updates the shared design model 120. Each command specifies a particular action to be performed at a particular 3D location in the voxel grid 700 of the shared design model 120. In particular, each command specifies an action parameter (adding a voxel, removing a voxel, or enhancing a voxel), a 3D location parameter, and a voxel type parameter (for the adding and enhancing actions).

The first recommendation visualization 430 graphically represents the first recommendation. In particular, the first recommendation visualization 430 comprises a set of recommendation markers 3101A, 3101B, 3102, and 3103, each recommendation marker graphically representing a corresponding command in the first recommendation. In some embodiments, the recommendation markers are displayed with a translucent appearance. As shown, the set of recommendation markers can be visually integrated with a visualization of the shared design model 120 to enable easy visualization of the corresponding recommendation on the shared design model 120. A recommendation marker corresponding to a particular command is placed at a 3D location in the voxel grid 700 of the shared design model 120 that is specified by the corresponding command.

In some embodiments, each recommendation marker is rendered to be visually integrated with a visualization of the shared design model 120. In this regard, each recommendation marker can be rendered as a voxel shape. In other embodiments, each recommendation marker can be rendered in different distinct shapes. As such, the first recommendation visualization 430 graphically illustrates the voxel changes (set of different voxels) that would occur to the shared design model 120 if the first recommendation were executed on the shared design model 120.

The set of recommendation markers comprises different types of recommendation markers, including an add recommendation marker 3101 for representing add commands, a remove recommendation marker 3102 for representing remove commands, and an enhance recommendation marker 3103 for representing enhance commands. An add recommendation marker 3101 is integrated into the visualization of the shared design model 120 by placing the add recommendation marker 3101 at a location in the voxel grid 700 specified by the corresponding add command. A remove recommendation marker 3102 is integrated into the visualization of the shared design model 120 by overlapping/merging the remove recommendation marker 3102 with a current voxel in the voxel grid 700 to be removed as specified by the corresponding remove command. An enhance recommendation marker 3103 is integrated into the visualization of the shared design model 120 by overlapping/merging the enhance recommendation marker 3103 with a current voxel in the voxel grid 700 to be enhanced as specified by the corresponding enhance command. In some embodiments, the recommendation markers are displayed with a translucent appearance, so that the user can still see the corresponding voxels of the current display model 120, (especially in the case of remove and enhance actions where the recommendation marker and the corresponding voxel overlap).

Each different type of recommendation marker can be rendered and displayed to be visually distinct from the current voxels of the shared design model 120 to enable easy visualization of the corresponding recommendation on the shared design model 120. In some embodiments, the recommendation markers are displayed with a translucent appearance, so that the user can still see the corresponding voxels of the current display model 120, (especially in the case of remove and enhance actions where the recommendation marker and the corresponding voxel overlap). In addition, each different type of recommendation marker can be displayed with a unique visual appearance that is visually distinct from the other types of recommendation markers. Therefore, each different type of recommendation marker can be displayed with a unique visual appearance that indicates the type of recommendation marker. For example, each add recommendation marker 3101 can be rendered with a first appearance, each remove recommendation marker 3102 can be rendered with a second appearance, and each enhance recommendation marker 3102 can be rendered with a third appearance, wherein the first appearance, second appearance, and third appearance comprise different appearances. The first appearance, second appearance, and third appearance can comprise unique appearances in terms of any type of visual characteristic, such as shape, color, hatching, shading, level of darkness, saturation, color intensity, and the like. In some embodiments, each different type of recommendation marker can be displayed with a different type of translucent appearance that indicates the type of recommendation marker.

For example, the first recommendation 2140 can include a first command for adding a first voxel of a first voxel type at a first 3D location, a second command for adding a second voxel of a second voxel type at a second 3D location, a third command for removing a third voxel at a third 3D location, and a fourth command for enhancing a fourth voxel with a fourth voxel type at a fourth 3D location. As shown, the first recommendation visualization 430 includes a first recommendation marker 3101A for representing the first command, a second recommendation marker 3101B for representing the second command, a third recommendation marker 3102 for representing the third command, and a fourth recommendation marker 3103 for representing the fourth command. The first recommendation marker 3101A comprises an add recommendation marker 3101 that is rendered with a first appearance at the first 3D location specified by the first command. The second recommendation marker 3101B also comprises an add recommendation marker 3101 that is rendered with the first appearance at the second 3D location specified by the second command. The third recommendation marker 3102 comprises a remove recommendation marker 3102 that is rendered with a second appearance at the third 3D location specified by the third command. The fourth recommendation marker 3103 comprises an enhance recommendation marker 3103 that is rendered with a third appearance at the fourth 3D location specified by the fourth command. In some embodiments, the first, second, and third appearances each comprise a different type of translucent appearance that indicates the corresponding type of recommendation marker.

The recommendation panel 3040 displays detailed information for the current recommendation 2140 that is graphically represented by the current recommendation visualization 430. As shown, the recommendation panel 3040 displays "Recommendation 1/12" which indicates that the current recommendation is the first recommendation in twelve total recommendations that have been generated. In some embodiments, the recommendation panel 3040 displays design-level performance metrics associated with the current recommendation. In particular, the recommendation panel 3040 can display changes in particular design-level performance metrics of the shared design model 120 that will occur if the current recommendation is executed on the shared design model 120.

In some embodiments, the recommendation panel 3040 displays an increase amount or decrease amount in a value of at least one design-level performance metric of the shared design model 120 that will result/occur if the current recommendation is executed on the shared design model 120. For example, the recommendation panel 3040 can display an increase amount (such as "+0.038") in a first value of a first design-level performance metric and decrease amount (such as "−0.358") in a second value of a second design-level performance metric of the shared design model 120 that will occur if the current recommendation is executed. In other embodiments, the recommendation panel 3040 displays a resulting value of at least one design-level performance metric of the shared design model 120 that will be achieved if the current recommendation is executed on the shared design model 120. For example, the recommendation panel 3040 can display a first value of a first design-level performance metric and a second value of a second design-level performance metric of the shared design model 120 that will be achieved if the current recommendation is executed.

The various design-level performance metrics associated with the current recommendation displayed in the recommendation panel 3040 can be determined based on a comparison between the design-level performance metrics of the shared design model 120 and the design-level performance metrics of the optimized design solution 2155 corresponding to the current recommendation. As discussed above, each valid recommendation 2140 is executed on the shared design model 120 to generate a corresponding valid optimized design solution 2155. Each valid optimized design solution 2155 has associated design-level performance metrics (stored to the corresponding optimized voxel data structure 2150) that is also associated with the corresponding valid recommendation 2140. Therefore, the various design-level performance metrics displayed in the recommendation panel 3040 can be determined based on the design-level performance metrics of the shared design model 120 and the design-level performance metrics associated with the current recommendation (stored to the corresponding optimized voxel data structure 2150).

Figure 32:
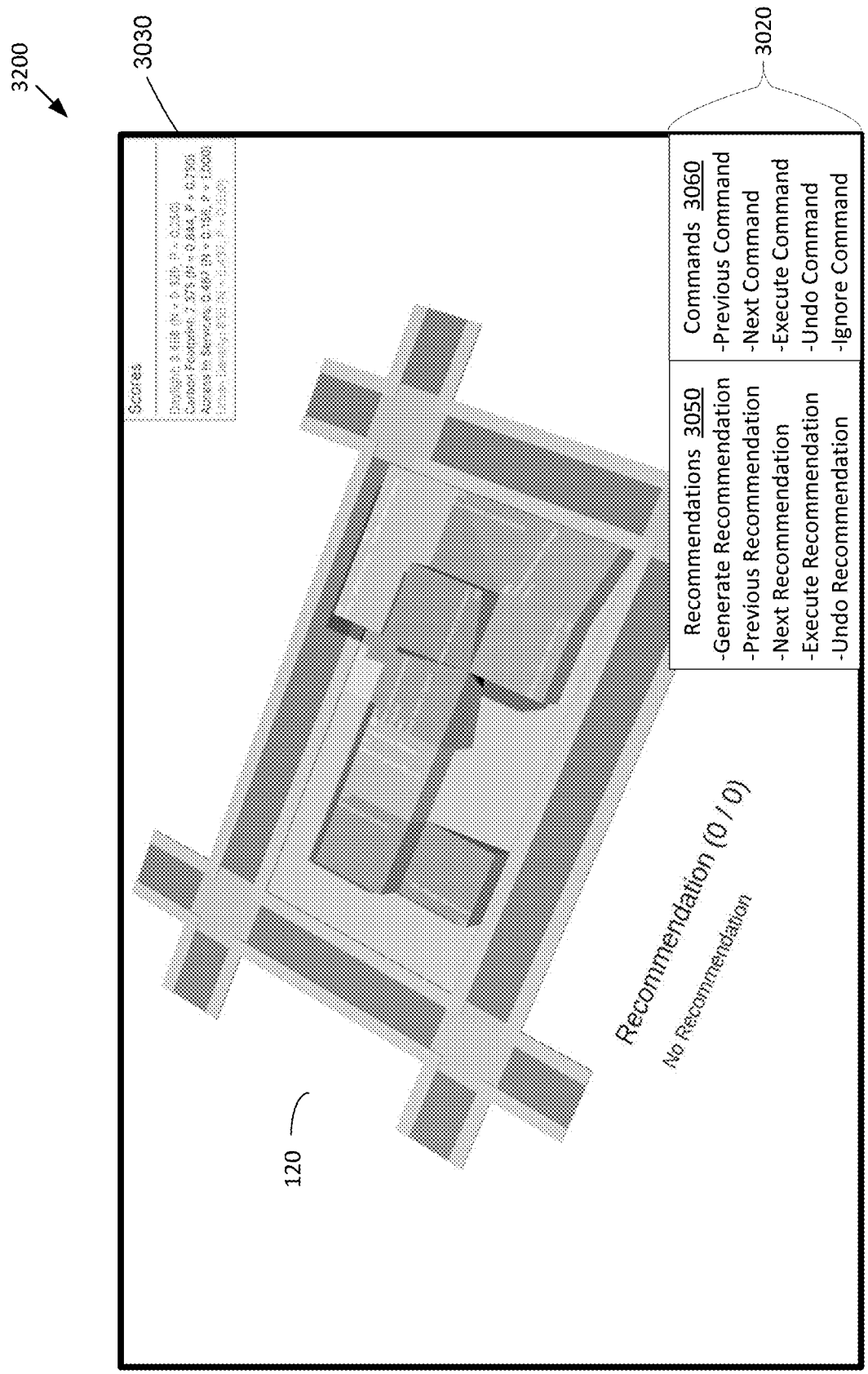
FIG. 32 illustrates an exemplar user screen for an executed recommendation that generates an update of the shared design model of FIG. 30, according to various embodiments.

FIG. 32 illustrates an exemplar user screen 3200 for an executed recommendation that generates an update of the shared design model of FIG. 30, according to various embodiments. The updated shared design model 120 comprises the state of the shared design model 120 after the first recommendation 2140 (represented by the first recommendation visualization 430) is executed on the shared design model 120 of FIG. 31. As shown, in accordance with the first recommendation 2140, the first voxel of the first voxel type is added at the first 3D location, the second voxel of the second voxel type is added at the second 3D location, the third voxel is removed at the third 3D location, and the fourth voxel is enhanced with the fourth voxel type at the fourth 3D location. As shown, the score panel 3030 displays updated design-level performance metrics associated with the updated shared design model 120. The updated shared design model 120 also comprises the optimized design solution 2155 corresponding to the first recommendation, whereby the updated design-level performance metrics are associated with the optimized design solution 2155. Note that the first recommendation 2140 can be executed on the shared design model 120 of FIG. 31 in response to the user selecting the "execute recommendation" action. The first recommendation 2140 can also be undone in response to the user selecting the "undo recommendation" action, which would return the state of the shared design model 120 to the initial shared design model 120 of FIG. 30.

Figure 33:
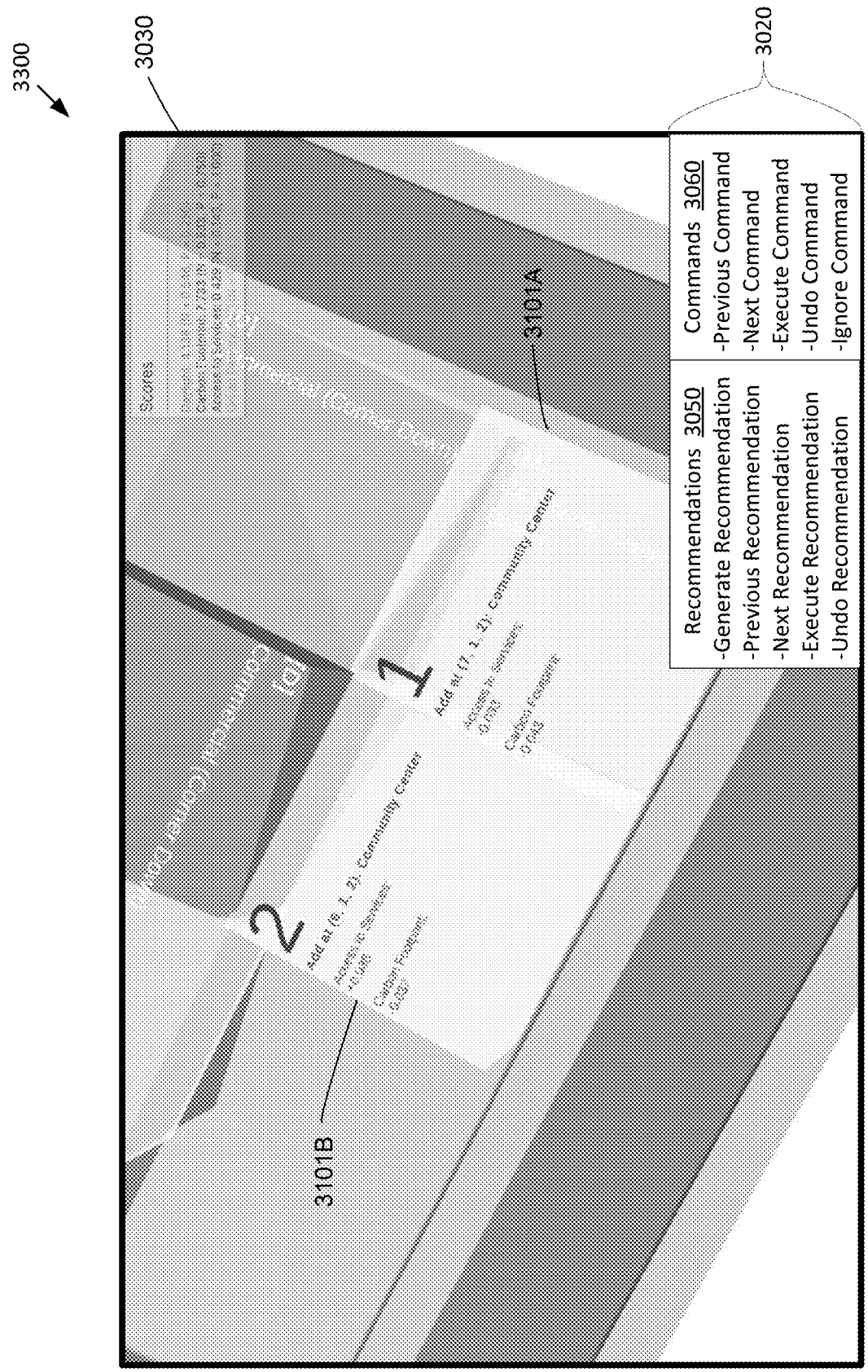
FIG. 33 illustrates an exemplar user screen for a first recommendation marker associated with the first recommendation visualization of FIG. 31, according to various embodiments.

In some embodiments, each recommendation marker in the recommendation visualization 430 can display detailed information for the command corresponding to the recommendation marker. FIG. 33 illustrates an exemplar user screen 3300 for a first recommendation marker associated with the first recommendation visualization of FIG. 31, according to various embodiments. In some embodiments, when a particular recommendation marker is selected within the user interface 140, the camera view of the user interface 140 can automatically zoom to the selected recommendation marker so that the detailed information for the corresponding command is readable to the user. In other embodiments, the user can manually navigate the camera view to a recommendation marker so that the detailed information for the corresponding command is readable.

In some embodiments, the text information displayed on a recommendation marker can include detailed information associated with the corresponding command including, without limitation, a command sequence index number, voxel grid location, an action type (add, remove, enhance), a voxel type, and various design-level performance metrics associated with the corresponding command. Note that the voxel type can be specified only for add and enhance actions. In the example of FIG. 33, the first recommendation marker 3101A represents a first command of the first recommendation 2140 that specifies adding a first voxel of a first voxel type at a first 3D location. As shown, the text information displayed on the first recommendation marker 3101A includes a sequence index number ("1"), voxel grid location ("7, 1, 2"), an action type ("Add"), a voxel type ("Community Center"), and various design-level performance metrics ("Access to Services: −0.033" and "Carbon Footprint: −0.043") associated with the first command. Also shown is the second recommendation marker 3101B representing a second command of the first recommendation 2140 that also displays detailed information associated with the corresponding second command.

The sequence index number of a command indicates the sequence order number of the command within the sequence of steps/commands of the corresponding recommendation. For example, a first command in the recommendation has a sequence index number of 1, a second command in the recommendation has a sequence index number of 2, and so forth. Therefore, the sequence index numbers indicate the execution sequence of the commands of the recommendation. The execution sequence of the commands is important in that two recommendations having the same set of commands but executed on the shared design model 120 in a different sequence can produce a different result on the shared design model 120. Since each command is executed on a current state of the shared design model 120, the execution of each command depends on the state of the shared design model 120 resulting from the execution of the previous command(s).

For example, assume a first recommendation comprises a first command for adding voxel A at position X and a second command for adding voxel B at position Y, where Y is above X on the voxel grid 700. Therefore, execution of the first recommendation includes executing the first recommendation and subsequently executing the second recommendation, which results in adding to the shared design model 120 the voxel A at position X and voxel B above voxel A at position Y. However, if the execution sequence of the first command and the second command were reversed, the execution of the recommendation would result in an error when the second command is executed first to add voxel B at position Y, since there is no existing structural support below voxel B in the voxel grid 700. Therefore, execution of the second command and the recommendation would result in an error and the second command and/or the recommendation can be ignored/rejected as invalid.

In some embodiments, a recommendation marker representing a command also displays one or more design-level performance metrics associated with the command. A recommendation marker for a command can display an increase amount or decrease amount in a value of at least one design-level performance metric of the shared design model 120 that will result/occur if the particular command is executed on the shared design model 120. For example, the recommendation marker can display an increase amount (such as "+0.X") in a first value of a first design-level performance metric and decrease amount (such as "−0.Y") in a second value of a second design-level performance metric of the shared design model 120 that will occur if the command is executed.

In other embodiments, the recommendation marker displays a resulting value of at least one design-level performance metric of the shared design model 120 that will be achieved if the command is executed on the shared design model 120. For example, the recommendation marker can display a first value of a first design-level performance metric and a second value of a second design-level performance metric of the shared design model 120 that will be achieved if the command is executed. Advantageously, the user can view the effect of each individual command on the design-level performance metrics of the shared design model 120, which further increases user involvement in the optimization process.

The various design-level performance metrics associated with the command displayed in the recommendation marker can be determined based on the design-level performance metrics of the shared design model 120 and the voxel-level performance metrics of the voxel specified in the command. As discussed above, each valid recommendation 2140 is executed on the shared design model 120 to generate a corresponding valid optimized design solution 2155. Each valid optimized design solution 2155 has associated voxel-level performance metrics for each voxel of the optimized design solution 2155 (stored to the corresponding optimized voxel data structure 2150). Therefore, the voxel-level performance metrics of the voxel specified in the command can be retrieved from the corresponding optimized voxel data structure 2150.

In some embodiments, a recommendation visualization 430 representing a current recommendation can comprise an interactive visualization. In these embodiments, the recommender 420 configures the recommendation visualization 430 to be interactive to enable a user to toggle/step through the set of commands and the corresponding set of recommendation markers of the current recommendation (via the "previous command" action and "next command" action in the action panel 3020). The recommender 420 can also configure each recommendation marker to be interactive to enable a user to execute, undo, or ignore a current command in the recommendation (via the "execute command" action, "undo command" action, or "ignore command" action, respectively, in the action panel 3020). In this manner, the disclosed techniques provide detailed information for each command (as displayed on the corresponding recommendation marker) and direct user-control over the execution of each command in the recommendation. Advantageously, the disclosed techniques provide greater user control and user involvement in the optimization process relative to conventional optimization techniques. Accordingly, FIGS. 34-37 illustrate the direct user-control of the execution of each command in a current recommendation via an interactive recommendation visualization 430.

Figure 34:
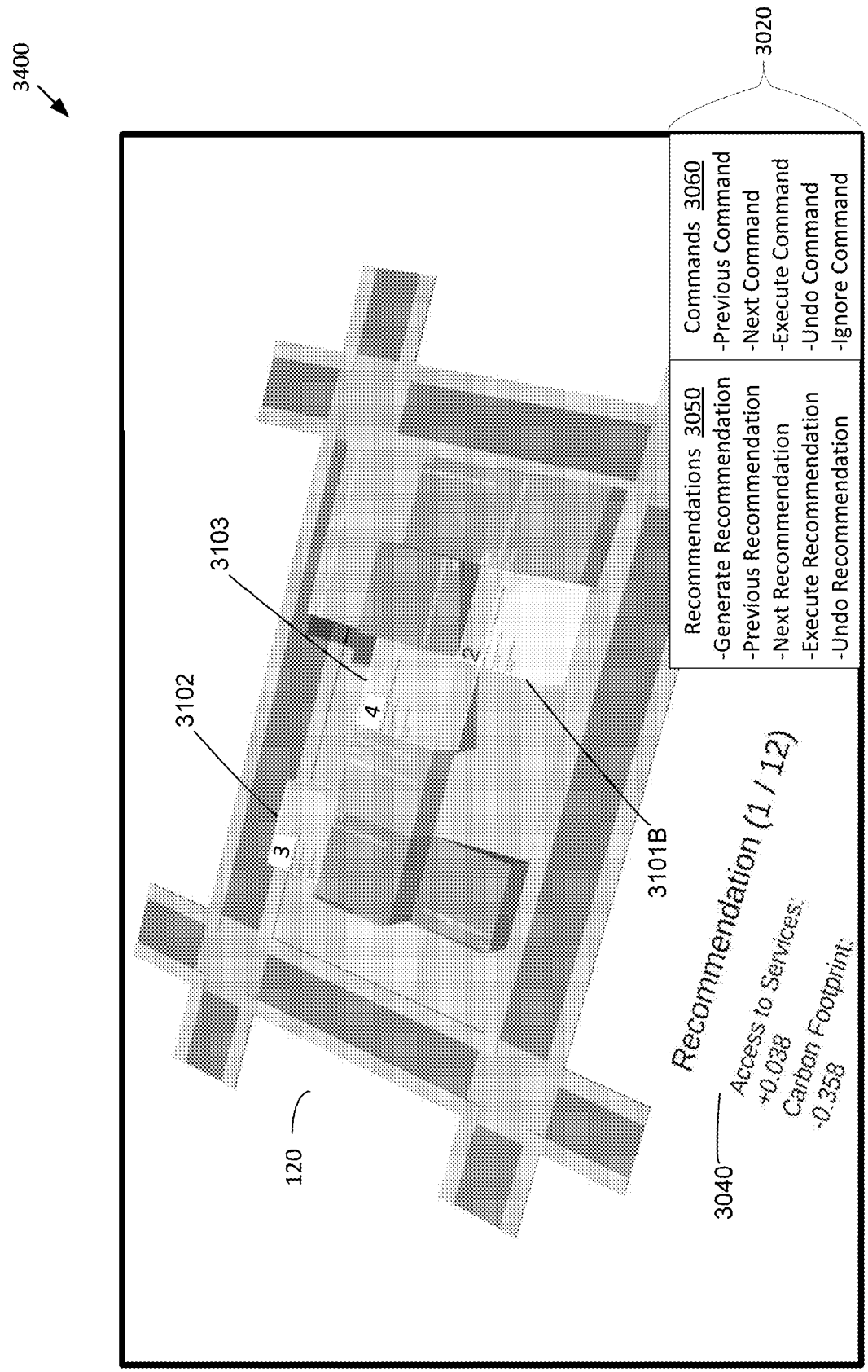
FIG. 34 illustrates an exemplar user screen for an executed first command that generates an update of the shared design model of FIG. 30, according to various embodiments.

FIG. 34 illustrates an exemplar user screen 3400 for an executed first command that generates an update of the shared design model of FIG. 30, according to various embodiments. In the example of FIG. 34, the user has selected the first recommendation marker 3101A corresponding to the first command of the first recommendation 2140, for example, by toggling through the set of commands using the "previous command" action and "next command" action in the action panel 3020. The user then selected to execute the first command by selecting the "execute command" action in the action panel 3020. In response to the user selection of the "execute command" action, only the first command in the first recommendation is executed on the shared design model 120 (whereby no other commands in the first recommendation are executed in response to the user selections of the first recommendation marker 3101A and the "execute command" action). Execution of the first command adds the first voxel of the first voxel type at the first 3D location, which produces the updated shared design model 120 shown in FIG. 34. Since the first command is executed, the first recommendation marker 3101A is then removed from the recommendation visualization 430. Executing the first command causes one or more of the design-level performance metrics of the shared design model 120 to change. The score panel 3030 (not shown) displays updated design-level performance metrics associated with the updated shared design model 120. Note that the execution of the first command can be undone by the user selecting the "undo command" action.

Figure 35:
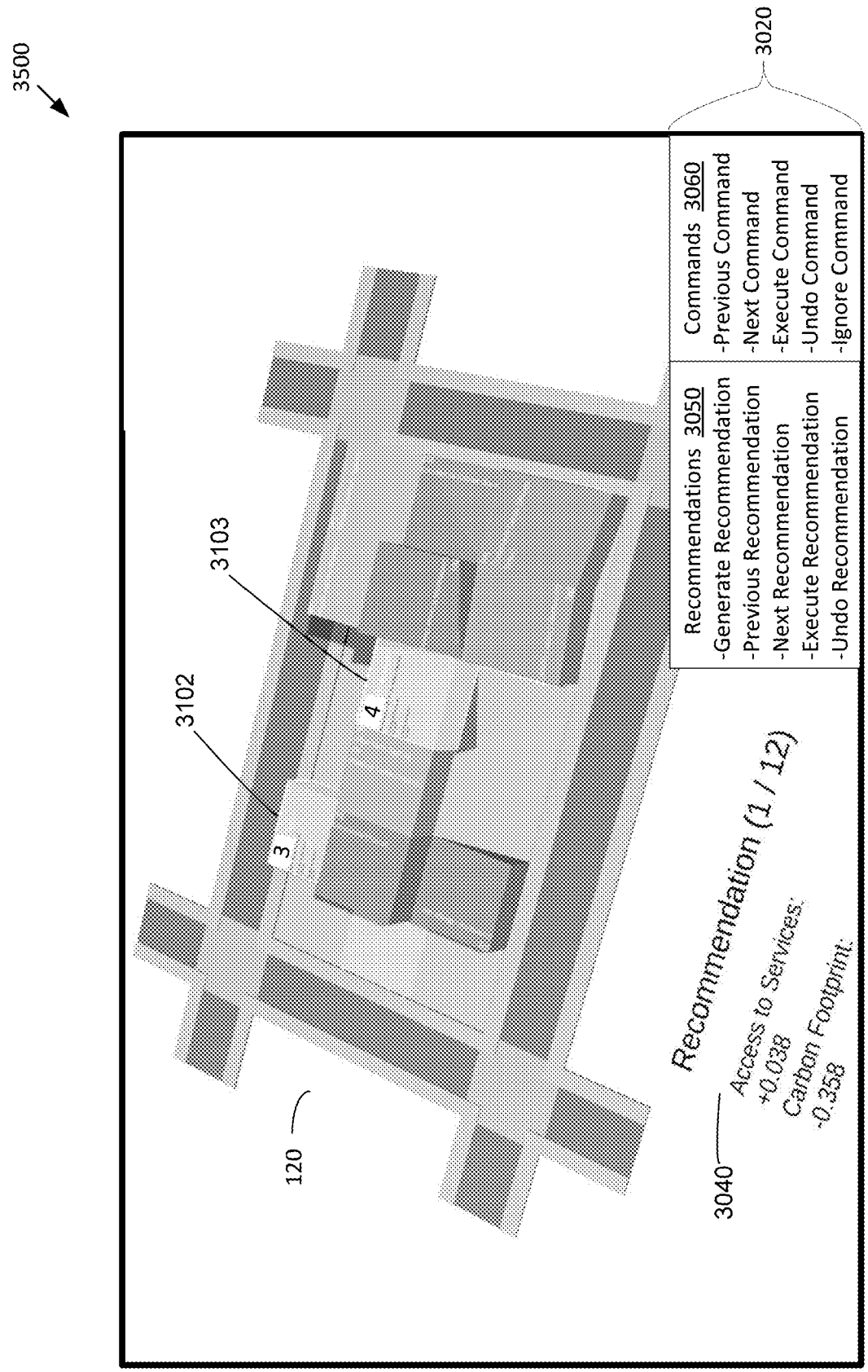
FIG. 35 illustrates an exemplar user screen for an executed second command that generates an update of the shared design model of FIG. 34, according to various embodiments.

FIG. 35 illustrates an exemplar user screen 3500 for an executed second command that generates an update of the shared design model of FIG. 34, according to various embodiments. In the example of FIG. 35, the user has selected the second recommendation marker 3101B corresponding to the second command of the first recommendation 2140, for example, by toggling through the set of commands using the "previous command" action and "next command" action in the action panel 3020. Once the user has selected the second recommendation marker 3101B corresponding to the second command in the first recommendation, the user has selected to execute the second command by selecting the "execute command" action in the action panel 3020. In response to the user selection of the "execute command" action, only the second command in the first recommendation is executed on the shared design model 120 (whereby no other commands in the first recommendation are executed in response to the user selections of the second recommendation marker 3101B and the selection of the "execute command" action). Execution of the second command adds the second voxel of the second voxel type at the second 3D location, which produces the updated shared design model 120 shown in FIG. 35. Since the second command is executed, the second recommendation marker 3101B is then removed from the recommendation visualization 430. Executing the second command causes one or more of the design-level performance metrics of the shared design model 120 to change. The score panel 3030 (not shown) displays updated design-level performance metrics associated with the updated shared design model 120. Note that the execution of the second command can be undone by the user selecting the "undo command" action.

Figure 36:
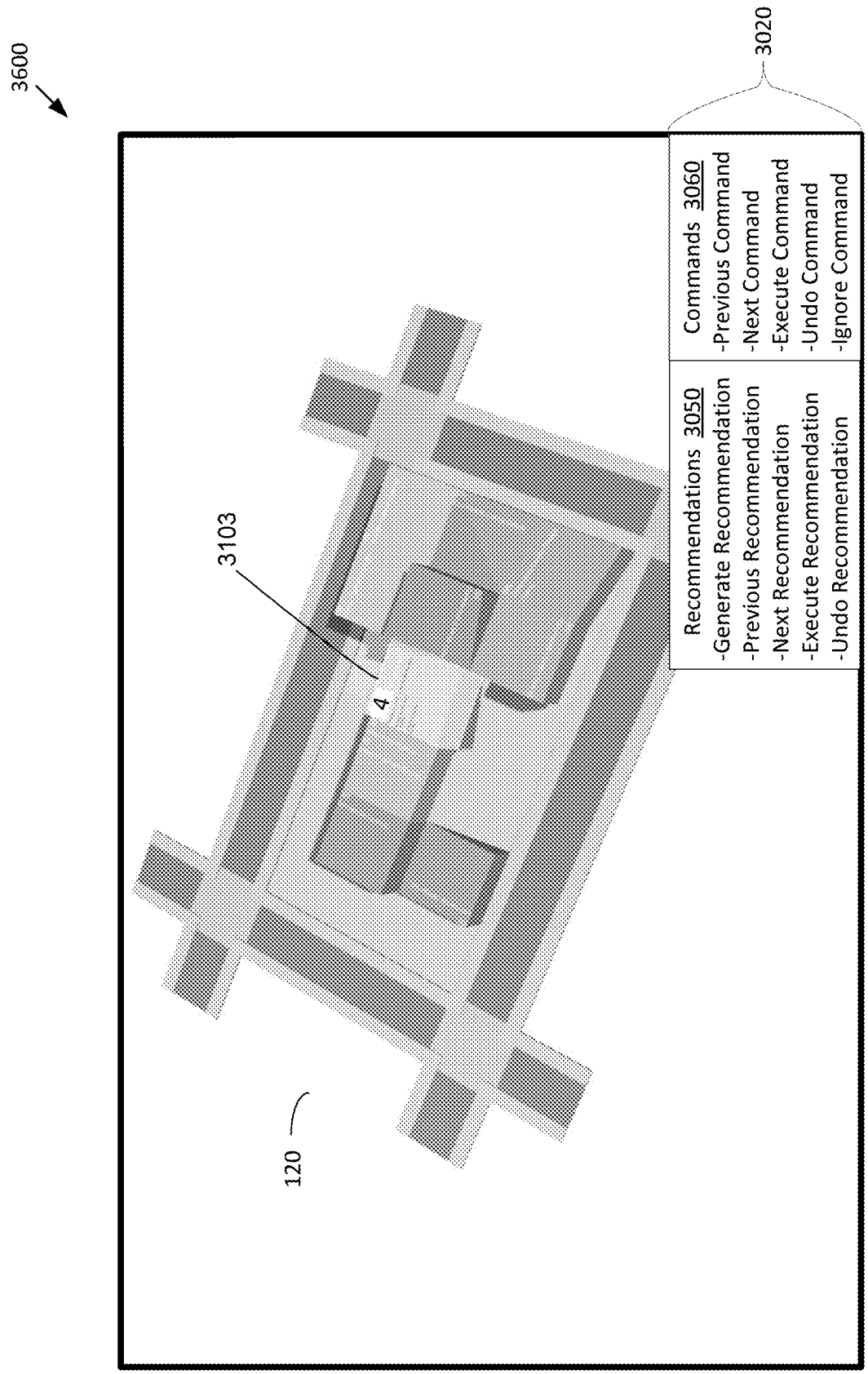
FIG. 36 illustrates an exemplar user screen for an executed third command that generates an update of the shared design model of FIG. 35, according to various embodiments.

FIG. 36 illustrates an exemplar user screen 3600 for an executed third command that generates an update of the shared design model of FIG. 35, according to various embodiments. In the example of FIG. 36, the user has selected the third recommendation marker 3102 corresponding to the third command of the first recommendation 2140. The user then selected to execute the third command by selecting the "execute command" action in the action panel 3020. In response to the user selection of the "execute command" action, only the third command in the first recommendation is executed on the shared design model 120 (whereby no other commands in the first recommendation are executed in response to the user selections of the third recommendation marker 3102 and the "execute command" action). Execution of the third command removes the third voxel at the third 3D location, which produces the updated shared design model 120 shown in FIG. 36. Since the third command is executed, the third recommendation marker 3102 is then removed from the recommendation visualization 430. The score panel 3030 (not shown) displays updated design-level performance metrics associated with the updated shared design model 120. Note that the execution of the third command can be undone by the user selecting the "undo command" action.

Figure 37:
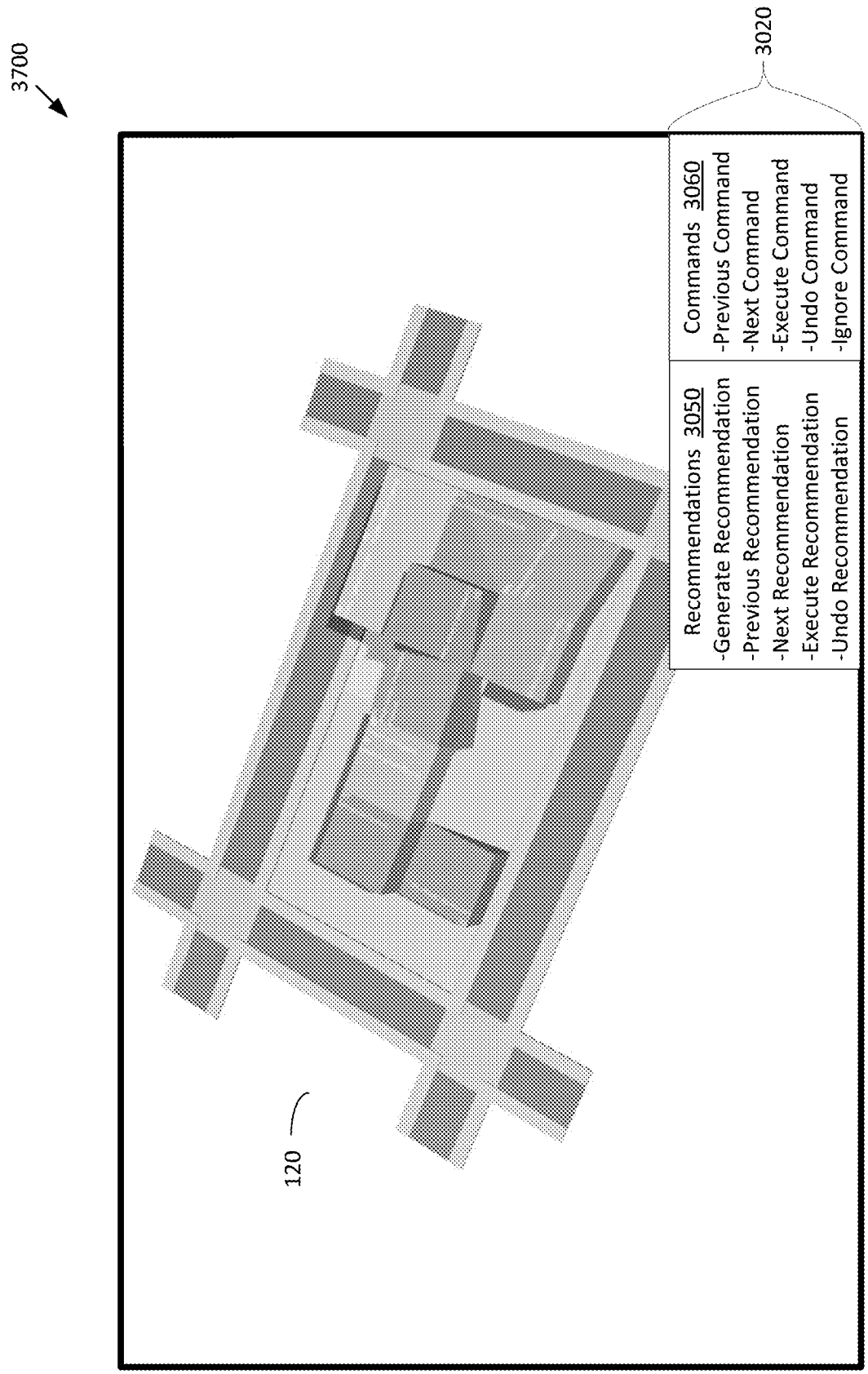
FIG. 37 illustrates an exemplar user screen for an ignored fourth command that generates an update of the shared design model of FIG. 36, according to various embodiments.

FIG. 37 illustrates an exemplar user screen 3700 for an ignored fourth command that generates an update of the shared design model of FIG. 36, according to various embodiments. In the example of FIG. 37, the user has selected the fourth recommendation marker 3103 corresponding to the fourth command of the first recommendation 2140. The user then selected to ignore the fourth command by selecting the "ignore command" action in the action panel 3020. In response to the user selection of the "ignore command" action, the fourth command is not executed, and the recommender 420 removes the fourth command from the first recommendation and removes the fourth recommendation marker 3103 from the recommendation visualization 430, as shown in FIG. 37.

In some embodiments, before the fourth command can be ignored, the recommender 420 determines whether the fourth command can be ignored without causing any other commands in the first recommendation to become invalid commands. In these embodiments, in response to the "ignore command" action for the fourth command, the recommender 420 can first analyze each of the other commands in the first recommendation to verify that each command remains valid if the fourth command is not executed. If the recommender 420 determines that each of the other commands remain valid, the recommender 420 can then perform the above steps for ignoring the fourth command. If the recommender 420 determines that at least one other command becomes invalid if the fourth command is not executed, the recommender 420 does not ignore fourth command and executes the fourth command and/or displays an error message via the user interface 140 indicating that ignoring the fourth command is an invalid operation. In other embodiments, the recommender 420 can display a warning message indicating that by ignoring the fourth command, all subsequent commands that are affected by ignoring the fourth command will be removed automatically, and enables the user to confirm the removing of the subsequent commands. In addition, the error message can indicate which command in the first recommendation will become invalid if the fourth command is ignored.

To further illustrate, assume for example that the fourth command in the first recommendation is for adding voxel A at position X and a subsequent fifth command in the first recommendation is for adding voxel B at position Y, where Y is above X on the voxel grid 700. In this situation, the fourth command cannot be ignored since doing so would cause the fifth command to become invalid. This is due to the fact that the fifth command cannot be executed to add voxel B at position Y, since there is no existing structural support below voxel B in the voxel grid 700 if the fourth command is ignored/not executed. In this situation, the recommender 420 does not ignore fourth command and/or displays an error message via the user interface 140.

Referring back to FIG. 31, the action panel 3020 includes "previous recommendation" action and "next recommendation" action that can be selected to toggle/step through the various recommendations 2140 and corresponding recommendation visualizations 430 generated by the evaluation module 112. Advantageously, the user can easily and visually compare different recommendations for optimizing the shared design model 120 via the different recommendation visualizations 430 that can be quickly toggled/stepped through in the user interface 140, which further increases user involvement in the optimization process.

Figure 38:
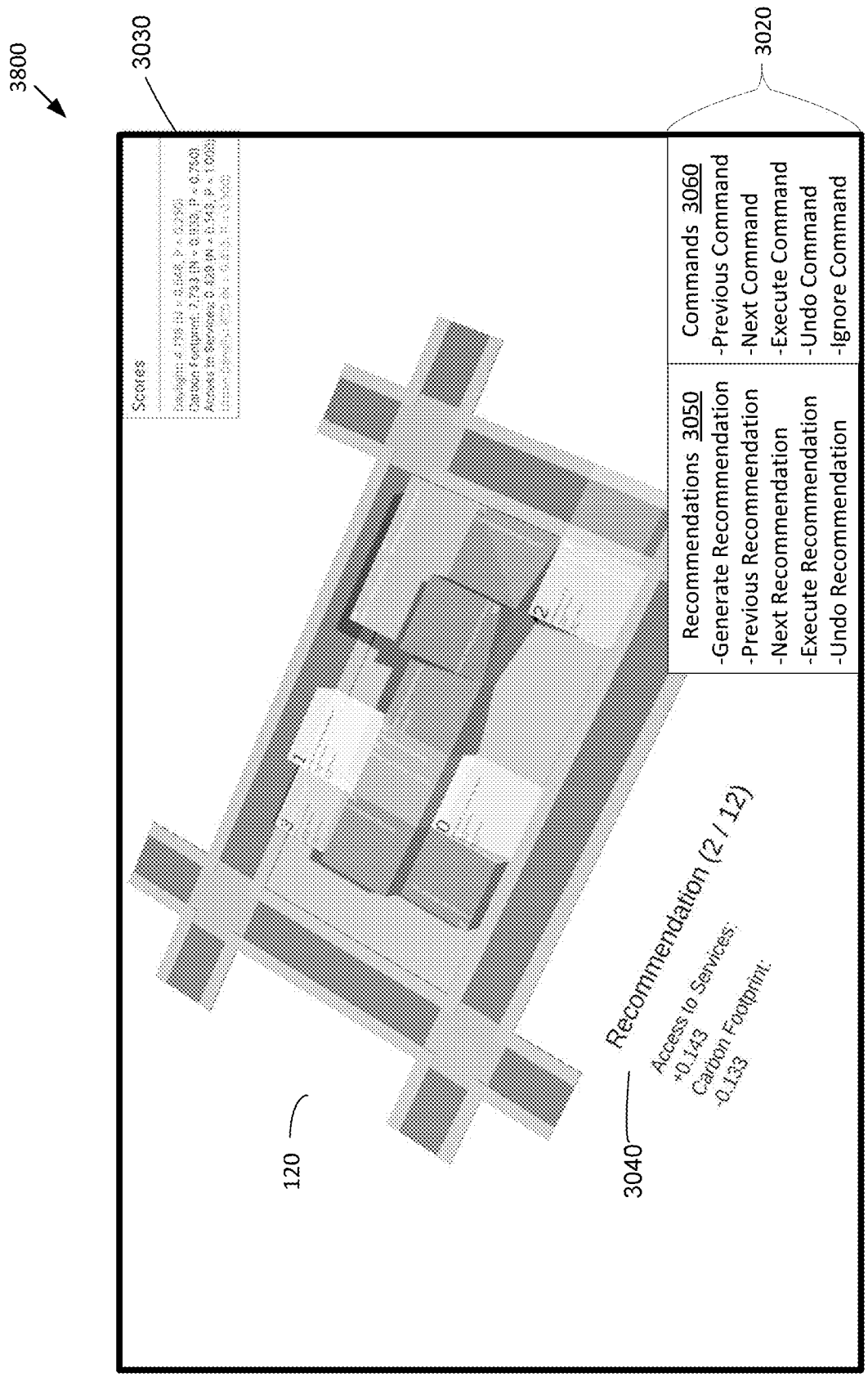
FIG. 38 illustrates an exemplar user screen for a second recommendation visualization for the shared design model of FIG. 30, according to other various embodiments.

FIG. 38 illustrates an exemplar user screen 3800 for a second recommendation visualization for the shared design model of FIG. 30, according to other various embodiments. In the example of FIG. 38, the user has selected the "next recommendation" action in FIG. 31, which initiates the recommender 420 to display a second recommendation visualization 430 corresponding to a second recommendation in the set of recommendations 2140. The second recommendation visualization 430 comprises a set of recommendation markers that visually illustrates the sequence of steps/commands of the second recommendation 2140. The recommendation panel 3040 displays detailed information for the second recommendation. As shown, the recommendation panel 3040 displays "Recommendation 2/12" which indicates that the current recommendation is the second recommendation in twelve total recommendations that have been generated. In some embodiments, the recommendation panel 3040 displays design-level performance metrics associated with the second recommendation, such as changes in particular design-level performance metrics of the shared design model 120 that will occur if the second recommendation is executed on the shared design model 120.

Figure 39:
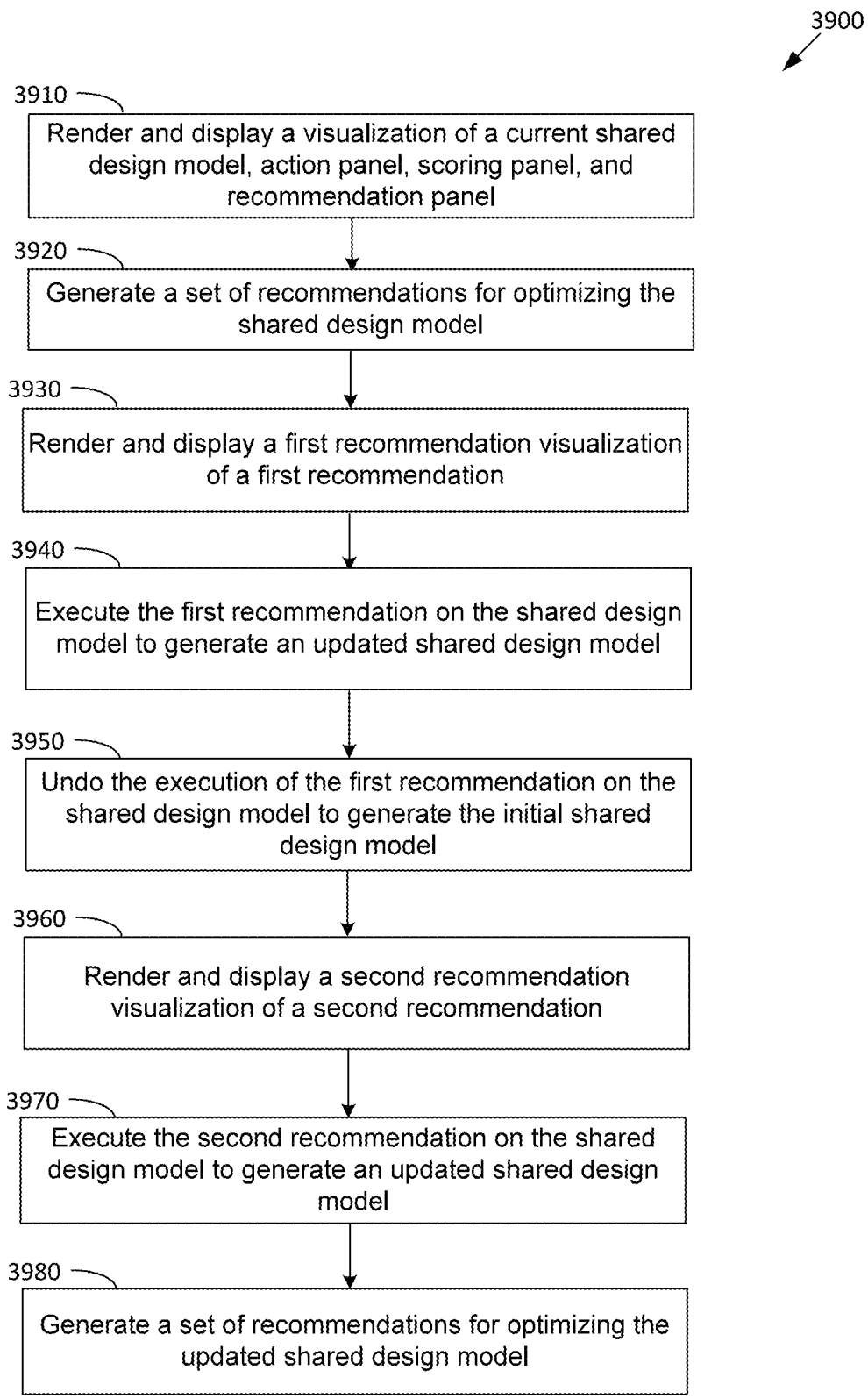
FIG. 39 sets forth a flow diagram of method steps for performing a recommendation visualization technique, according to various embodiments.

FIG. 39 sets forth a flow diagram of method steps for performing a recommendation visualization technique via recommendation-based actions, according to various embodiments. Although the method steps are described with reference to the systems of FIGS. 1-11, 14-19, 21-23, 25-26, and 28-38, persons skilled in the art will understand that any system configured to implement the method steps, in any order, falls within the scope of the disclosed embodiments. In some embodiments, the steps of the method 3900 are performed using the various recommendation-based actions 3050 shown in FIG. 30. In some embodiments, the steps of the method 3900 are performed by various components of the generative design application 110 (such as the design model editor 114, the evaluation module 112, and the visualization module 116) and the user interface 140.

As shown, a method 3900 begins at step 3910, where the generative design application 110 renders and displays a visualization of a current shared design model 120 (current voxel grid 700) in a user screen of the user interface 140. Referring back to FIG. 30, the user screen displays a visualization of the current shared design model 120, an action panel 3020, a scoring panel 3030, and a recommendation panel 3040. The action panel 3020 includes various recommendation-based actions 3050, such as generate recommendations, previous recommendation, next recommendation, execute recommendation, and undo recommendation. The score panel 3030 displays design-level performance metrics associated with the current shared design model 120. The score panel 3030 can display the design-level performance metrics with particular graphical appearances based on the relative performance levels of the design-level performance metrics. The recommendation panel 3040 displays detailed information for a current recommendation 2140 that is graphically represented by a currently displayed recommendation visualization 430. As shown, the recommendation panel 3040 displays "Recommendation 0/0" which indicates that no recommendations for the shared design model 120 have been generated yet.

At step 3920, the generative design application 110 generates a set of recommendations 2140 for optimizing the shared design model 120 in response to receiving the "generate recommendations" action from the user. Each recommendation 2140 improves one or more design-level performance metrics of the shared design model 120 if applied to the shared design model 120. Each recommendation 2140 comprises a sequence of steps/commands that changes/updates the shared design model 120. Each command can specify an action (such as add voxel, modify voxel, remove voxel), a 3D location in the voxel grid 700, and a voxel type (for the add and enhance actions).

At step 3930, the generative design application 110 renders and displays a first recommendation visualization 430 of a first recommendation 2140 in the set of recommendations 2140. Referring back to FIG. 31, the first recommendation visualization 430 comprises a set of recommendation markers that visually illustrates the sequence of steps/commands of the first recommendation 2140. In particular, each recommendation marker graphically represents a particular command specified in the first recommendation 2140. The set of recommendation markers comprises different types of recommendation markers, including an add recommendation marker 3101 for representing add commands, a remove recommendation marker 3102 for representing remove commands, and an enhance recommendation marker 3103 for representing enhance commands, wherein each different type of recommendation marker is displayed with a unique visual appearance. The recommendation panel 3040 displays "Recommendation 1/12" which indicates that the current recommendation is the first recommendation in twelve total recommendations that have been generated for the current shared design model 120. The recommendation panel 3040 also displays design-level performance metrics associated with the first recommendation.

At step 3940, the generative design application 110 executes the first recommendation on the current shared design model 120 in response to receiving an "execute recommendation" action from the user. Referring back to FIG. 32, executing the first recommendation on the current shared design model 120 generates an updated shared design model 120. As shown, the score panel 3030 displays updated design-level performance metrics associated with the updated shared design model 120.

At step 3950, the generative design application 110 undoes/reverses the execution of the first recommendation on the shared design model 120 in response to receiving an "undo recommendation" action from the user. Undoing/reversing the execution of the first recommendation returns the state of the updated shared design model 120 shown in FIG. 32 back to the initial shared design model 120 shown in FIG. 31.

At step 3960, the generative design application 110 renders and displays a second recommendation visualization 430 of a second recommendation 2140 in the set of recommendations 2140 in response to receiving a "next recommendation" action from the user. Referring back to FIG. 38, the second recommendation visualization 430 comprises a set of recommendation markers that visually illustrates the sequence of steps/commands of the second recommendation 2140. The recommendation panel 3040 displays "Recommendation 2/12" which indicates that the current recommendation is the second recommendation in twelve total recommendations. The recommendation panel 3040 also displays design-level performance metrics associated with the second recommendation.

At step 3970, the generative design application 110 executes the second recommendation on the current shared design model 120 in response to receiving an "execute recommendation" action from the user. Executing the second recommendation on the current shared design model 120 generates an updated shared design model 120. The score panel 3030 displays updated design-level performance metrics associated with the updated shared design model 120.

At step 3980, the generative design application 110 generates a set of recommendations 2140 for optimizing the updated shared design model 120 in response to receiving the "generate recommendations" action from the user. Each recommendation 2140 improves one or more design-level performance metrics of the updated shared design model 120 if applied to the updated shared design model 120.

The method 3900 can be performed multiple times, where the shared design model 120 is updated repeatedly by iteratively applying various user-selected recommendations to the shared design model 120. During each iteration, for each generated recommendation, the method 4000 of FIG. 40 can also be performed to execute command-based actions on the shared design model 120.

Figure 40:
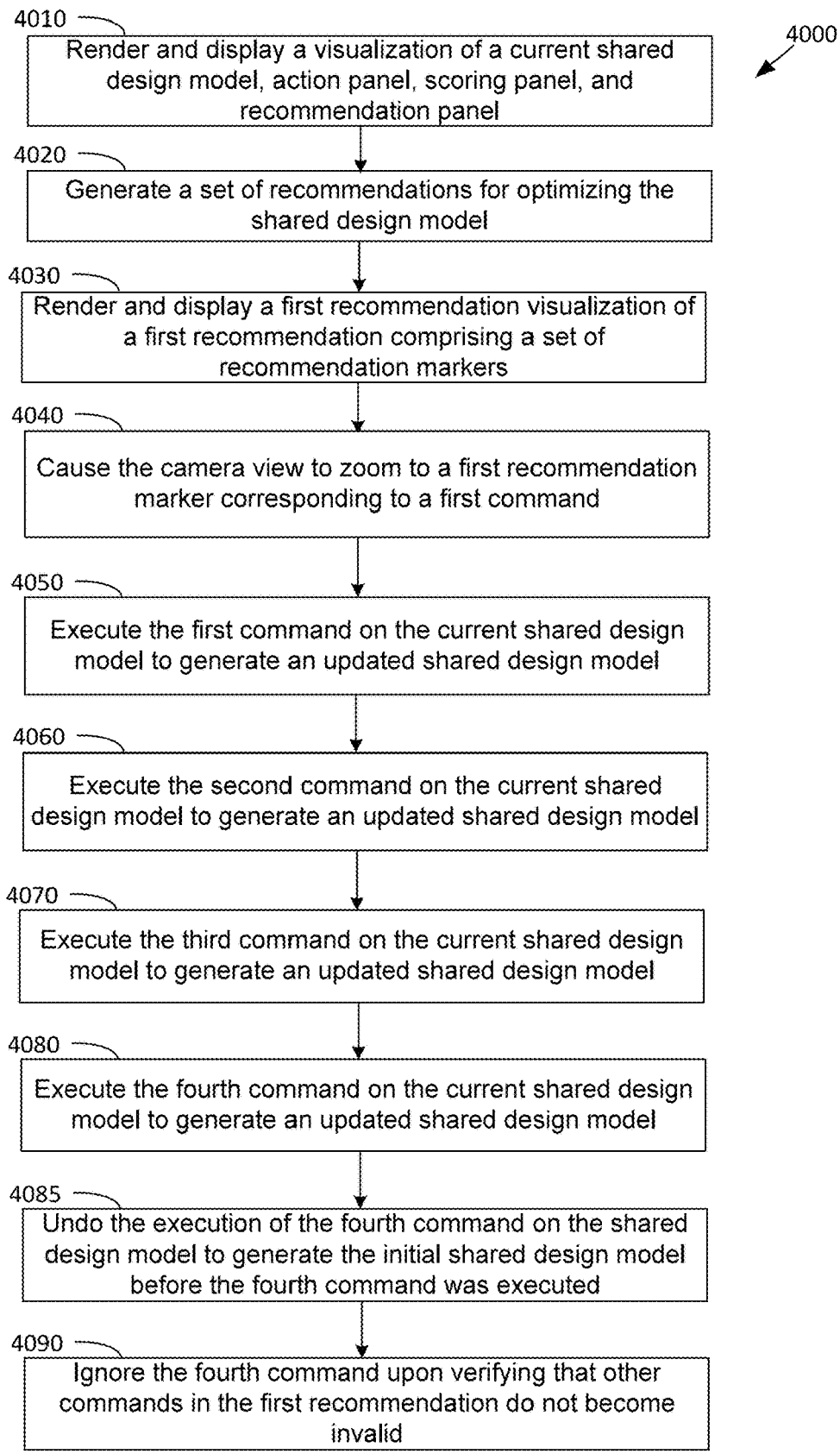
FIG. 40 sets forth a flow diagram of method steps for performing a recommendation visualization technique, according to other various embodiments.

FIG. 40 sets forth a flow diagram of method steps for performing a recommendation visualization technique via command-based actions, according to various embodiments. Although the method steps are described with reference to the systems of FIGS. 1-11, 14-19, 21-23, 25-26, and 28-38, persons skilled in the art will understand that any system configured to implement the method steps, in any order, falls within the scope of the disclosed embodiments. In some embodiments, the steps of the method 4000 are performed using the various command-based actions 3060 shown in FIG. 30. In some embodiments, the steps of the method 4000 are performed by various components of the generative design application 110 (such as the design model editor 114, the evaluation module 112, and the visualization module 116) and the user interface 140.

As shown, a method 4000 begins at step 4010, where the generative design application 110 renders and displays a visualization of a current shared design model 120 (current voxel grid 700) in a user screen of the user interface 140. Referring back to FIG. 30, the user screen displays a visualization of the current shared design model 120, an action panel 3020, a scoring panel 3030, and a recommendation panel 3040. The operations performed in step 4010 are similar to the operations performed in step 3910 of FIG. 39 and are not discussed in detail here. At step 4020, the generative design application 110 generates a set of recommendations 2140 based on the shared design model 120 in response to receiving the "generate recommendations" action from the user. The operations performed in step 4020 are similar to the operations performed in step 3920 of FIG. 39 and are not discussed in detail here.

At step 4030, the generative design application 110 renders and displays a first recommendation visualization 430 of a first recommendation 2140 in the set of recommendations 2140. Referring back to FIG. 31, the first recommendation visualization 430 comprises a set of recommendation markers, wherein each recommendation marker graphically represents a corresponding command specified in the first recommendation 2140. For example, the first recommendation 2140 can comprise four commands, wherein the recommendation visualization 430 comprises four corresponding recommendation markers. Each recommendation marker is placed at a 3D location in the voxel grid 700 as specified in the corresponding command. Referring back to FIG. 33, each recommendation marker displays detailed information for the corresponding command, including a command sequence index number, voxel grid location, an action type (add, remove, enhance), a voxel type (for the add and enhance actions), and one or more design-level performance metrics associated with the corresponding command.

At step 4040, the generative design application 110 causes the camera view of the user interface 140 to zoom to a first recommendation marker corresponding to a first command in the first recommendation 2140 in response to a user selection of the first recommendation marker. For example, the user can use the "previous command" action and "next command" action to toggle through the recommendation markers/commands of the first recommendation 2140 to select a particular recommendation marker/command. Referring back to FIG. 33, the camera view of the user interface 140 zooms to the selected first recommendation marker so that the detailed information for the first command is readable to the user.

At step 4050, the generative design application 110 executes the first command on the current shared design model 120 in response to receiving an "execute command" action from the user. Referring back to FIG. 34, executing the first command on the current shared design model 120 generates an updated shared design model 120. Since the first command is executed, the corresponding first recommendation marker is removed from the recommendation visualization 430. The score panel 3030 displays updated design-level performance metrics associated with the updated shared design model 120. Note that in response to the user selection of the "execute command" action, only the first command in the first recommendation is executed on the shared design model 120, and no other commands in the first recommendation are executed.

At step 4060, the generative design application 110 executes a second command on the current shared design model 120 in response to receiving a selection of the corresponding second recommendation marker and an "execute command" action from the user. Referring back to FIG. 35, executing the second command on the current shared design model 120 generates an updated shared design model 120, and the second recommendation marker is removed from the recommendation visualization 430. The score panel 3030 displays updated design-level performance metrics associated with the updated shared design model 120. Note that in response to the user selection of the second recommendation marker and the "execute command" action, only the second command in the first recommendation is executed on the shared design model 120, and no other commands in the first recommendation are executed.

At step 4070, the generative design application 110 executes a third command on the current shared design model 120 in response to receiving a selection of the corresponding third recommendation marker and an "execute command" action from the user. Referring back to FIG. 36, executing the third command on the current shared design model 120 generates an updated shared design model 120, and the third recommendation marker is removed from the recommendation visualization 430. The score panel 3030 displays updated design-level performance metrics associated with the updated shared design model 120. Note that in response to the user selection of the third recommendation marker and the "execute command" action, only the third command in the first recommendation is executed on the shared design model 120, and no other commands in the first recommendation are executed.

At step 4080, the generative design application 110 executes a fourth command on the current shared design model 120 in response to receiving a selection of the corresponding fourth recommendation marker and an "execute command" action from the user. Executing the fourth command on the current shared design model 120 generates an updated shared design model 120. At step 4085, the generative design application 110 undoes/reverses the execution of the fourth command on the shared design model 120 in response to receiving an "undo command" action from the user. Undoing/reversing the execution of the fourth command returns the state of the updated shared design model 120 back to the initial shared design model 120 just before the fourth command was executed.

At step 4090, the generative design application 110 ignores the fourth command in response to receiving a selection of the corresponding fourth recommendation marker and an "ignore command" action from the user. Ignoring the fourth command includes not executing the fourth command, removing the corresponding fourth recommendation marker from the recommendation visualization 430, and removing the fourth command from the first recommendation 2140. In some embodiments, before the fourth command can be ignored, the generative design application 110 determines whether the fourth command can be ignored without causing any other commands in the first recommendation to become invalid. If the generative design application 110 determines that each of the other commands remain valid, the generative design application 110 can ignore the fourth command. Otherwise, the generative design application 110 executes the fourth command and/or displays an error message via the user interface 140. The method 4000 can be performed for each selected recommendation to provide command-based actions for each recommendation.

In sum, a voxel-based design approach enables the creating and modifying of a design model comprising a 3D grid of discrete voxels. The design system generates and stores a voxel data structure that represents the design model. The voxel data structure comprises a plurality of voxel-level entries, each voxel-level entry corresponding to a particular voxel within the design model/voxel grid based on the location of the voxel in the 3D grid. Each voxel-level entry comprises a plurality of data fields, including a 3D coordinates field, performance properties field, performance metrics field, a visual properties field, size field, and a voxel type field. The voxel data structure further comprises a design-level entry for storing design-level performance metrics for the overall design model.

The design system receives user modifications to the design model, and in response, modifies the voxel data structure to reflect the user modifications to the design model. The design system then renders a visualization of the updated design model based on the updated voxel data structure. In particular, the design system maps visual properties to corresponding graphic elements for each voxel in the updated design model. The design system can receive a user selection of a performance metric, and in response, renders and displays a per-voxel heat map for the design model for the selected performance metric. In particular, the design system maps the value for the selected performance metric to a visual appearance for each voxel in the design model. The design system can generate a plurality of optimized design solutions that each improve at least one design-level performance metric of the design model. An optimized voxel data structure is generated and stored for each optimized design solution. A visualization of each optimized design solution is rendered and displayed based on the corresponding optimized voxel data structure.

At least one technical advantage of the disclosed techniques relative to the prior art is that, with the disclosed techniques, a voxel-based design approach enables the creating and modifying of a design model via a three-dimensional (3D) grid of discrete voxels. Advantageously, modifications to the voxel-based design model comprise the simple adding, removing, and enhancing of discrete voxels in the design model, and does not require expertise in modifying continuous geometries as needed in conventional design systems. Another advantage of the disclosed techniques relative to the prior art is that, with the disclosed techniques, the voxel-based design model and/or voxel-based optimized design solution can be easily rendered in real-time based on mappings between visual properties to corresponding graphic elements for each voxel in the design model and/or voxel-based optimized design solution. The rendering of the voxel-based design model and/or voxel-based optimized design solution does not require the high latency processing-intensive rendering of continuous geometries in conventional design systems. An additional advantage of the disclosed techniques relative to the prior art is that, with the disclosed techniques, heat maps illustrating performance metrics for the voxel-based design model can be easily computed and rendered in real-time based on mappings between performance metrics and corresponding visual appearances for each voxel in the design model. The computing and rendering of the heat maps of the disclosed techniques do not require the high latency processing-intensive computing and rendering of heat maps that rely on simulations of the design model in conventional design systems. These technical advantages provide one or more technological advancements over prior art approaches.

In sum, the design problem builder 2510 receives and analyzes the shared design model 120, the persona 2505, and the design-level performance metrics for the shared design model 120 from the design model evaluator 404. Based on the analysis, the design problem builder 2510 generates the design problem 2515 comprising an optimization problem for the design solver 2520 to solve. After the design problem 2515 is produced, the optimizer 406 invokes the recommendation generator 2550 to generate a set of recommendations 2140. Each recommendation 2140 comprises a set of steps/commands that changes/updates the shared design model 120. The design solver 2520 receives each recommendation 2140 and executes the recommendation 2140 on the shared design model 120 to generate a corresponding optimized design solution 2155 that is represented by an optimized voxel data structure 2150. The design solver 2520 receives the design-level performance metrics for each optimized design solution 2155 from the design model evaluator 404. The design solver 2520 then determines if each optimized design solution 2155 is a valid solution to the design problem 2515 based on a comparison between the design-level performance metrics of the shared design model 120 and the optimized design solution 2155. The shared design model 120 and the valid optimized design solutions 2155 are displayed to the user via the user interface 140 (not shown).

At least one technical advantage of the disclosed techniques relative to the prior art is that a voxel-based optimization technique is performed on a voxel-based design model that significantly reduces input parameters processed by the voxel-based optimization technique relative to conventional optimization techniques. Input parameters of the voxel-based optimization technique can include an action type, voxel location, and a voxel type. Consequently, the voxel-based optimization technique significantly reduces the processing time and resources required for generating a set of optimized design solutions for the design model relative to conventional approaches and can be performed in real-time. Another advantage of the disclosed techniques relative to the prior art is that, with the disclosed techniques, the design-level performance metrics computed for the design model and each optimized design solution are based on simple computations of previously computed voxel-level performance metrics for the design model and the optimized design solution, respectively. As such, these computation techniques require lower processing time and resources relative to conventional techniques that implement simulations on the entirety of a continuous geometry-based design to derive design-level performance metrics for the design. These technical advantages provide one or more technological advancements over prior art approaches.

In sum, the evaluation module 112 generates a set of recommendations 2140, each recommendation 2140 improving one or more design-level performance metrics of the shared design model 120 if applied to the shared design model 120. Each recommendation 2140 comprises a sequence of steps/commands that changes/updates the shared design model 120. The disclosed techniques enable a user to specify the maximum number of steps/commands in each recommendation, which controls the amount of optimization increment of the optimization process on the current design model. The evaluation module 112 includes a recommender 420 that generates recommendation visualizations 430 of the recommendations 2140, each recommendation visualization 430 comprising a set of recommendation markers that visually illustrates the sequence of steps/commands specified in the recommendation 2140. Each recommendation marker in the recommendation visualization 430 graphically represents a particular command in the sequence of steps/commands specified in the recommendation 2140. Each recommendation marker provides detailed information for the corresponding command. In some embodiments, a recommendation visualization 430 representing a recommendation can comprises an interactive visualization. In these embodiments, the recommender 420 configures each recommendation marker to be interactive to enable a user to execute or ignore the corresponding command in the recommendation.

At least one technical advantage of the disclosed techniques relative to the prior art is that, with the disclosed techniques, an optimized design solution for a current design model can be an incremental optimization of the current design model that represents a partially-completed design solution, as opposed to a completed optimization of the current design model that represents a completed design solution. With the disclosed techniques, an incremental optimized design solution is generated by applying a recommendation that specifies a sequence of steps/commands for modifying a current design model. The user is able to specify the maximum number of steps/commands in each recommendation, which controls the level of incremental optimization applied to the current design model. In addition, with the disclosed techniques, a recommendation visualization is generated for each recommendation that graphically illustrates each command in the recommendation and also provides detailed information about each such command. The recommendation visualization also can be configured to be user-interactive, which allows a user to either execute or ignore each command in the recommendation. With these features, the disclosed techniques provide greater user control and user involvement in the overall optimization process relative to conventional optimization techniques that implement an "all or nothing" approach to optimizing design models. These technical advantages provide one or more technological advancements over prior art approaches.

Aspects of the subject matter described herein are set out in the following numbered clauses.

1. In some embodiments, a computer-implemented method for generating visualizations of design models, the method comprising: storing a voxel data structure representing a design model, wherein the design model comprises a three-dimensional (3D) grid of voxels, and the voxel data structure stores a location within the 3D grid and a set of visual properties for one or more of the voxels included in the 3D grid; and generating a visualization of the design model based on the voxel data structure.

2. The computer-implemented method of clause 1, wherein generating the visualization of the design model comprises, for each voxel included in the one or more voxels, mapping the set of visual properties to a corresponding set of graphical elements for rendering the voxel.

3. The computer-implemented method of any of clauses 1-2, wherein: the set of visual properties corresponding to each voxel included in the one or more voxels includes a shape identifier; and generating the visualization of the design model comprises, for each voxel included in the one or more voxels, mapping the shape identifier to a corresponding predefined shape within a set of predefined shapes.

4. The computer-implemented method of any of clauses 1-3, wherein the corresponding predefined shape comprises a 3D shape having continuous geometries.

5. The computer-implemented method of any of clauses 1-4, further comprising: receiving a first input associated with a first voxel that resides at a first location within the 3D grid; updating the voxel data structure based on the first input to generate an updated voxel data structure; and generating a visualization of an updated design model based on the updated voxel data structure.

6. The computer-implemented method of any of clauses 1-5, further comprising: receiving a first input for adding a first voxel at a first location within the 3D grid; updating the voxel data structure based on the first input to generate an updated voxel data structure; and generating a visualization of an updated design model based on the updated voxel data structure.

7. The computer-implemented method of any of clauses 1-6, wherein the voxel data structure further stores a set of performance metrics for the one or more of the voxels, the method further comprising: generating a heat-map visualization of the design model for a first performance metric based on the voxel data structure, wherein generating the heat-map visualization comprises, for each voxel included in the one or more voxels, mapping a value for the first performance metric in the set of performance metrics to a corresponding visual appearance for rendering the voxel.

8. The computer-implemented method of any of clauses 1-7, wherein: the first performance metric is associated with a first color; and mapping the value for the first performance metric to the corresponding visual appearance comprises mapping the value for the first performance metric to a corresponding darkness level of the first color.

9. The computer-implemented method of any of clauses 1-8, wherein the voxel data structure further stores a set of design-level performance metrics of the design model, the method further comprising generating an optimized design solution having at least one design-level performance metric that increases a performance of at least one design-level performance metric in the set of design-level performance metrics of the design model.

10. The computer-implemented method of any of clauses 1-9, wherein the optimized design solution comprises an optimized 3D grid of voxels, the method further comprising: generating a visualization of the optimized design solution by highlighting a set of voxels that are different between the optimized design solution and the design model.

11. In some embodiments, one or more non-transitory computer-readable media storing instructions that, when executed by one or more processors, cause the one or more processors to generate visualizations of design models by performing the steps of: storing a voxel data structure representing a design model, wherein the design model comprises a three-dimensional (3D) grid of voxels, and the voxel data structure stores a location within the 3D grid and a set of visual properties for one or more of the voxels included in the 3D grid; and generating a visualization of the design model based on the voxel data structure.

12. The one or more non-transitory computer-readable media of clause 11, wherein generating the visualization of the design model comprises, for each voxel included in the one or more voxels, mapping the set of visual properties to a corresponding set of graphical elements for rendering the voxel.

13. The one or more non-transitory computer-readable media of any of clauses 11-12, wherein: the set of visual properties corresponding to each voxel included in the one or more voxels includes a shape identifier; and generating the visualization of the design model comprises, for each voxel included in the one or more voxels, mapping the shape identifier to a corresponding predefined shape within a set of predefined shapes.

14. The one or more non-transitory computer-readable media of any of clauses 11-13, further comprising: receiving a first input for adding a first voxel at a first location within the 3D grid; updating the voxel data structure based on the first input to generate an updated voxel data structure; and generating a visualization of an updated design model based on the updated voxel data structure.

15. The one or more non-transitory computer-readable media of any of clauses 11-14, wherein a first set of visual properties for the first voxel includes a color that corresponds to a persona associated with the first input.

16. The one or more non-transitory computer-readable media of any of clauses 11-15, wherein the voxel data structure further stores a set of performance metrics for the one or more of the voxels, further comprising: generating a heat-map visualization of the design model for a first performance metric based on the voxel data structure, wherein generating the heat-map visualization comprises, for each voxel included in the one or more voxels, mapping a value for the first performance metric in the set of performance metrics to a corresponding visual appearance for rendering the voxel.

17. The one or more non-transitory computer-readable media of any of clauses 11-16, wherein the voxel data structure further stores a set of design-level performance metrics of the design model, further comprising generating an optimized design solution having at least one design-level performance metric that increases a performance of at least one design-level performance metric in the set of design-level performance metrics of the design model.

18. The one or more non-transitory computer-readable media of any of clauses 11-17, wherein the optimized design solution comprises an optimized 3D grid of voxels, further comprising: storing an optimized voxel data structure representing the optimized design solution; and generating a visualization of the optimized design solution based on the optimized voxel data structure.

19. The one or more non-transitory computer-readable media of any of clauses 11-18, wherein the optimized design solution comprises an optimized 3D grid of voxels, further comprising: generating a visualization of the optimized design solution by determining a set of different voxels between the optimized design solution and the design model and a set of common voxels between the optimized design solution and the design model, and rendering the set of different voxels with a first visual appearance and the set of common voxels with a second visual appearance that is different than the first visual appearance.

20. In some embodiments, a system for generating visualizations of design models, the system comprising: a memory storing a design application; and a processor coupled to the memory that executes the design application to perform the steps of: storing a voxel data structure representing a design model, wherein the design model comprises a three-dimensional (3D) grid of voxels, and the voxel data structure stores a location within the 3D grid and a set of visual properties for one or more of the voxels included in the 3D grid; and generating a visualization of the design model based on the voxel data structure.

Any and all combinations of any of the claim elements recited in any of the claims and/or any elements described in this application, in any fashion, fall within the contemplated scope of the embodiments and protection.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. Aspects of the present embodiments can be embodied as a system, method, or computer program product. Accordingly, aspects of the present disclosure can take the form of an entirely hardware embodiment, an entirely software embodiment (including firmware, resident software, and micro-code, etc.) or an embodiment combining software and hardware aspects that can all generally be referred to herein as a "module," a "system," or a "computer." In addition, any hardware and/or software technique, process, function, component, engine, module, or system described in the present disclosure can be implemented as a circuit or set of circuits. Furthermore, aspects of the present disclosure can take the form of a computer program product embodied in one or more computer readable media having computer readable program codec embodied thereon.

Any combination of one or more computer readable media can be utilized. Each computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory, a read-only memory, an erasable programmable read-only memory, a Flash memory, an optical fiber, a portable compact disc read-only memory, an optical storage device, a magnetic storage device, or any suitable combination of the foregoing. In the context of this document, a computer readable storage medium can be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions can be provided to a processor of a general-purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can, in fact, be block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure can be devised without departing from the basic scope thereof, and the scope thereof is determined by the claims that follow.

What is claimed is:

1. A computer-implemented method for generating visualizations of design models, the method comprising:
    storing a voxel data structure representing a design model, wherein the design model comprises a three-dimensional (3D) grid of voxels, wherein the voxel data structure stores a location within the 3D grid and a set of visual properties for one or more of the voxels included in the 3D grid, and wherein the set of visual properties includes a shape identifier that identifies a predefined shape within a set of predefined shapes that is assigned to at least one voxel;
    generating an updated voxel data structure based on a user modification to the design model that is associated with a first voxel included within the 3D grid; and
    generating a visualization of the design model based on the updated voxel data structure.

2. The computer-implemented method of claim 1, wherein generating the visualization of the design model comprises, for each voxel included in the one or more voxels, mapping the set of visual properties to a corresponding set of graphical elements for rendering the voxel.

3. The computer-implemented method of claim 1, wherein
generating the visualization of the design model comprises, for each voxel included in the one or more voxels, mapping the shape identifier to the corresponding predefined shape.

4. The computer-implemented method of claim 3, wherein the corresponding predefined shape comprises a 3D shape having continuous geometries.

5. The computer-implemented method of claim 1, further comprising:
receiving a first input associated with a second voxel that resides at a first location within the 3D grid;
updating the voxel data structure based on the first input to generate a second updated voxel data structure; and
generating a visualization of an updated design model based on the second updated voxel data structure.

6. The computer-implemented method of claim 1, further comprising:
receiving a first input that modifies the design model by adding, removing, or modifying a second voxel at a first location within the 3D grid;
updating the voxel data structure based on the first input to generate a second updated voxel data structure; and
generating a visualization of an updated design model based on the second updated voxel data structure.

7. The computer-implemented method of claim 1, wherein the voxel data structure further stores a set of performance metrics for the one or more of the voxels, the method further comprising:
generating a heat-map visualization of the design model for a first performance metric based on the voxel data structure, wherein generating the heat-map visualization comprises, for each voxel included in the one or more voxels, mapping a value for the first performance metric in the set of performance metrics to a corresponding visual appearance for rendering the voxel.

8. The computer-implemented method of claim 7, wherein:
the first performance metric is associated with a first color; and
mapping the value for the first performance metric to the corresponding visual appearance comprises mapping the value for the first performance metric to a corresponding darkness level of the first color.

9. The computer-implemented method of claim 1, wherein the voxel data structure further stores a set of design-level performance metrics of the design model, the method further comprising generating an optimized design solution having at least one design-level performance metric that increases a performance of at least one design-level performance metric in the set of design-level performance metrics of the design model.

10. The computer-implemented method of claim 9, wherein the optimized design solution comprises an optimized 3D grid of voxels, the method further comprising:
generating a visualization of the optimized design solution by highlighting a set of voxels that are different between the optimized design solution and the design model.

11. One or more non-transitory computer-readable media storing instructions that, when executed by one or more processors, cause the one or more processors to generate visualizations of design models by performing the steps of:
storing a voxel data structure representing a design model, wherein the design model comprises a three-dimensional (3D) grid of voxels, wherein the voxel data structure stores a location within the 3D grid and a set of visual properties for one or more of the voxels included in the 3D grid, and wherein the set of visual properties includes a shape identifier that identifies a predefined shape within a set of predefined shapes that is assigned to at least one voxel;
generating an updated voxel data structure based on a user modification to the design model that is associated with a first voxel included within the 3D grid; and
generating a visualization of the design model based on the voxel data structure.

12. The one or more non-transitory computer-readable media of claim 11,
wherein generating the visualization of the design model comprises, for each voxel included in the one or more voxels, mapping the set of visual properties to a corresponding set of graphical elements for rendering the voxel.

13. The one or more non-transitory computer-readable media of claim 11, wherein:
generating the visualization of the design model comprises, for each voxel included in the one or more voxels, mapping the shape identifier to the corresponding predefined shape.

14. The one or more non-transitory computer-readable media of claim 11, further comprising:
receiving a first input that modifies the design model by adding, removing, or modifying a second voxel at a first location within the 3D grid;
updating the voxel data structure based on the first input to generate a second updated voxel data structure; and
generating a visualization of an updated design model based on the second updated voxel data structure.

15. The one or more non-transitory computer-readable media of claim 14,
wherein a first set of visual properties for the first voxel includes a color that corresponds to a persona associated with the first input.

16. The one or more non-transitory computer-readable media of claim 11, wherein the voxel data structure further stores a set of performance metrics for the one or more of the voxels, further comprising:
generating a heat-map visualization of the design model for a first performance metric based on the voxel data structure, wherein generating the heat-map visualization comprises, for each voxel included in the one or more voxels, mapping a value for the first performance metric in the set of performance metrics to a corresponding visual appearance for rendering the voxel.

17. The one or more non-transitory computer-readable media of claim 11, wherein the voxel data structure further stores a set of design-level performance metrics of the design model, further comprising generating an optimized design solution having at least one design-level performance metric that increases a performance of at least one design-level performance metric in the set of design-level performance metrics of the design model.

18. The one or more non-transitory computer-readable media of claim 17, wherein the optimized design solution comprises an optimized 3D grid of voxels, further comprising:
storing an optimized voxel data structure representing the optimized design solution; and
generating a visualization of the optimized design solution based on the optimized voxel data structure.

19. The one or more non-transitory computer-readable media of claim 17, wherein the optimized design solution comprises an optimized 3D grid of voxels, further comprising:

generating a visualization of the optimized design solution by determining a set of different voxels between the optimized design solution and the design model and a set of common voxels between the optimized design solution and the design model, and rendering the set of different voxels with a first visual appearance and the set of common voxels with a second visual appearance that is different than the first visual appearance.

20. A system for generating visualizations of design models, the system comprising:

a memory storing a design application; and a processor coupled to the memory that executes the design application to perform the steps of:

storing a voxel data structure representing a design model, wherein the design model comprises a three-dimensional (3D) grid of voxels, wherein the voxel data structure stores a location within the 3D grid and a set of visual properties for one or more of the voxels included in the 3D grid, and wherein the set of visual properties includes a shape identifier that identifies a predefined shape within a set of predefined shapes that is assigned to at least one voxel;

generating an updated voxel data structure based on a user modification to the design model that is associated with a first voxel included within the 3D grid; and generating a visualization of the design model based on the voxel data structure.

* * * * *